US011664421B2

(12) United States Patent
George et al.

(10) Patent No.: US 11,664,421 B2
(45) Date of Patent: *May 30, 2023

(54) QUANTUM DOT DEVICES

(71) Applicant: Intel Corporation, Santa Clara, CA (US)

(72) Inventors: Hubert C. George, Portland, OR (US); Ravi Pillarisetty, Portland, OR (US); Jeanette M. Roberts, North Plains, OR (US); Nicole K. Thomas, Portland, OR (US); James S. Clarke, Portland, OR (US)

(73) Assignee: Intel Corporation, Santa Clara, CA (US)

(*) Notice: Subject to any disclaimer, the term of this patent is extended or adjusted under 35 U.S.C. 154(b) by 120 days.

This patent is subject to a terminal disclaimer.

(21) Appl. No.: 16/987,874

(22) Filed: Aug. 7, 2020

(65) Prior Publication Data
US 2020/0365688 A1 Nov. 19, 2020

Related U.S. Application Data

(63) Continuation of application No. 16/314,788, filed as application No. PCT/US2016/049371 on Aug. 30, 2016, now Pat. No. 10,770,545.

(51) Int. Cl.
H01L 29/06 (2006.01)
H01L 29/66 (2006.01)
(Continued)

(52) U.S. Cl.
CPC .......... H01L 29/0673 (2013.01); B82Y 10/00 (2013.01); B82Y 40/00 (2013.01);
(Continued)

(58) Field of Classification Search
CPC ............ H01L 29/0673; H01L 29/1054; H01L 29/127; H01L 29/16; H01L 29/165;
(Continued)

(56) References Cited

U.S. PATENT DOCUMENTS 7,830,695 B1 11/2010 Moon
2001/0013628 A1 8/2001 Tyagi et al.
(Continued)

FOREIGN PATENT DOCUMENTS

CN 101405866 A 4/2009
CN 103875073 B 7/2016
(Continued)

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
(Continued)

Primary Examiner — Shahed Ahmed
(74) Attorney, Agent, or Firm — Akona IP PC

(57) ABSTRACT

Disclosed herein are quantum dot devices, as well as related computing devices and methods. For example, in some embodiments, a quantum dot device may include: a quantum well stack; an insulating material disposed above the quantum well stack, wherein the insulating material includes a trench; and a gate metal disposed on the insulating material and extending into the trench.

23 Claims, 34 Drawing Sheets

(51) Int. Cl.

| | |
|---|---|
| *H01L 29/778* | (2006.01) |
| *H01L 29/10* | (2006.01) |
| *H01L 29/423* | (2006.01) |
| *H01L 29/76* | (2006.01) |
| *H01L 29/165* | (2006.01) |
| *H01L 29/12* | (2006.01) |
| *B82Y 10/00* | (2011.01) |
| *B82Y 40/00* | (2011.01) |
| *H01L 29/16* | (2006.01) |
| *G06N 10/00* | (2022.01) |
| *H01L 29/82* | (2006.01) |

(52) U.S. Cl.
CPC ......... *G06N 10/00* (2019.01); *H01L 29/1054* (2013.01); *H01L 29/127* (2013.01); *H01L 29/16* (2013.01); *H01L 29/165* (2013.01); *H01L 29/423* (2013.01); *H01L 29/42376* (2013.01); *H01L 29/66977* (2013.01); *H01L 29/7613* (2013.01); *H01L 29/7782* (2013.01); *H01L 29/778* (2013.01); *H01L 29/82* (2013.01)

(58) Field of Classification Search
CPC ............. H01L 29/423; H01L 29/42376; H01L 29/66977; H01L 29/7613; H01L 29/7782; H01L 29/778; H01L 29/82; H01L 27/18; B82Y 10/00; B82Y 40/00; G06N 10/00
See application file for complete search history.

(56) References Cited

U.S. PATENT DOCUMENTS

| | | |
|---|---|---|
| 2002/0179897 A1 | 12/2002 | Eriksson et al. |
| 2004/0175881 A1 | 9/2004 | Forbes et al. |
| 2007/0194297 A1 | 8/2007 | McCarthy et al. |
| 2008/0254606 A1 | 10/2008 | Baek et al. |
| 2010/0006821 A1 | 1/2010 | Choi et al. |
| 2010/0045365 A1 | 2/2010 | Chatterjee et al. |
| 2011/0147711 A1 | 6/2011 | Pillarisetty et al. |
| 2012/0074386 A1 | 3/2012 | Rachmady et al. |
| 2012/0280210 A1 | 11/2012 | Pillarisetty |
| 2013/0049109 A1 | 2/2013 | Lim et al. |
| 2013/0264617 A1 | 10/2013 | Joshi et al. |
| 2014/0209861 A1 | 7/2014 | Okamoto |
| 2015/0187766 A1 | 7/2015 | Basker et al. |
| 2015/0279981 A1 | 10/2015 | Eriksson et al. |
| 2016/0247888 A1* | 8/2016 | Kerber ................ H01L 29/0847 |
| 2019/0006572 A1 | 1/2019 | Falcon et al. |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0165152 A1 | 5/2019 | Roberts et al. |
| 2019/0206991 A1 | 7/2019 | Pillarisetty et al. |
| 2019/0229188 A1 | 7/2019 | Ciarke et al. |
| 2019/0229189 A1 | 7/2019 | Clarke et al. |
| 2019/0259850 A1 | 8/2019 | Pillarisetty et al. |
| 2019/0267692 A1 | 8/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |

FOREIGN PATENT DOCUMENTS

| | | |
|---|---|---|
| EP | 1262911 A1 | 12/2002 |
| WO | 2010053720 A2 | 5/2010 |
| WO | 2015184484 A1 | 12/2015 |
| WO | 2017155531 A1 | 9/2017 |
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018044268 A1 | 3/2018 |
| WO | WO-2018044267 A1 * | 3/2018 |

OTHER PUBLICATIONS

"A Reconfigurable Gate Architecture for Si/SiGe Quantum Dots," Zajac et al., Department of Physics, Princeton University; Department, of Physics, University of California; Feb. 6, 2015, 5 pages.

"A two-qubit logic gate in silicon," Veldhorst et al., Nature, vol. 526, Oct. 15, 2015, pp. 410-414.

"An addressable quantum dot qubit with fault-tolerant control-fidelity," Veldhorst et al., Nature Nanotechnology vol. 9, Dec. 2014, pp. 981-985.

"Defect reduction of selective Ge epitaxy in trenches on Si(001) substrates using aspect ratio trapping," Park et al., Applied Physics Letter 90, 052113 (2007), pp. 052113-1 through 3.

"Delaying Forever: Uniaxial Strained Silicon Transistors in a 90nm CMOS Technology," Mistry et al., Portland Technology Department, TCAD, Intel Corp., Jul. 2004; 2 pages.

"Detecting bit-flip errors in a logical qubit using stabilizer measurements," Riste et al., Nature Communications, 6:6983, DOI: 10.1038/ncomms7983, published Apr. 29, 2015; pp. 1-6.

"Embracing the quantum limit in silicon computing," Morton et al, Macmillan Publishers, Nov. 17, 2011, vol. 479, Nature, pp. 345-353.

"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.

"Fast sensing of double-dot charge arrangement and spin state with an rf sensor quantum dot," Barthel et al, Materials Department, University of California, Santa Barbara, Jan. 16, 2014, 4 pages.

"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.

"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

"How it's built: Micron/Intel3D NAND Micron Opens the Veil a Little," Moyer, Bryon, retrieved from https://www.eejournal.com/article/20160201-micron/ on Nov. 29, 2017, 9 pages.

"Independent, extensible control of same-frequency superconducting qubits by selective broadcasting," Asaad et al., Netherlands Organisation for Applied Scientific Research, Aug. 28, 2015, 17 pages.

"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.

"Magnetic field tuning of coplanar waveguide resonators," Healey, et al., Applied Physics Letters 93, 043513 (2008), pp. 043513-1 through 3 (4 pages with cover sheet).

"Multilayer microwave integrated quantum circuits for scalable quantum computing," Brecht et al, Department of Applied Physics, Yale University, Sep. 4, 2015, 5 pages.

(56) References Cited

OTHER PUBLICATIONS

"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Platinum single-electron transistors with tunnel barriers made by atomic layer deposition", George et al., Department of Electrical Engineering, University of Notre Dame, Published Nov. 5, 2010, 3 pages.
"Quantum computation with quantum dots," Loss et al, Physical Review A, vol. 57, No. 1, Jan. 1998, pp. 120-126.
"Radio frequency measurements of tunnel couplings and singlet-triplet spin states in Si:P quantum dots," House et al., Nature Communications, 6:884, DOI: 10.1038/ncomms9848, published Nov. 9, 2015; pp. 1-6.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Review : Towards Spintronic Quantum Technologies with Dopants in Silicon," Morley, Gavin, Department of Physics, University of Warwick, Jul. 23, 2014; 13 pages.
"Scalable gate architecture for densely packed semiconductor spin qubits," Zajac et al, Department of Physics, Princeton University; Sandia National Laboratories, Jul. 24, 2016; 8 pages.
"Scalable quantum circuit and control for a superconducting surface code," Versluis et al, Netherlands Organisation for Applied Scientific Research, Dec. 28, 2016, 9 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-charge tunneling in ambipolar silicon quantum dots," Muller, Filipp, Dissertation, University of Twente, Jun. 19, 2015, 148 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Spin Relaxation and Decoherence of Holes in Quantum Dots," Bulaev et al., Phys. Rev. Lett. 95, 076805, Aug. 11, 2005, 1 page.
"Surface loss simulations of superconducting coplanar waveguide resonators," Wenner et al, Applied Physics Letters 99, 113513 (2011), pp. 113513-1 through 3.
"Suspending superconducting qubits by silicon micromachining," Chu et al., Department of Applied Physics, Yale University, Jun. 10, 2016, 10 pages.
"Uitafast high-fidelity initialization of a quantum-dot spin qubit without magnetic fields," Mar et al., Phys. Rev. B 90 241303®, published Dec. 15, 2014, 1 page.
"Ultrafast optical control of individual quantum dot spin qubits," De Greve et al, Reports on Progress in Physics, vol. 76, No. 9, Sep. 4, 2013, 2 pages.
"Undoped accumulation-mode Si/SiGe quantum dots," Borselli et al, HRL Laboratories, LLC., Jul. 15, 2014, 4 pages.
Extended European Search Report in European Patent Application No. 16915356.6 dated Apr. 7, 2020, 10 pages.
International Preliminary Search Report on Patentability in International Patent Application No. PCT/US2016/0493686 dated Mar. 5, 2019, 7 pages.
International Preliminary Search Report on Patentability in International Patent Application No. PCT/US2016/049371 dated March 5, 2019, 7 pages.
International Search Report and Written Opinion issued in PCT/US2016/044268 dated May 29, 2017; 8 pages.
International Search Report and Written Opinion issued in PCT/US2016/049371 dated May 29, 2017; 12 pages.
Non Final Office Action in U.S. Appl. No. 16/314,788 dated Jan. 13, 2020, 12 pages.
Notice of Allowance in U.S. Appl. No. 16/314,788 dated May 14, 2020, 8 pages.
Supplementary Information, retrieved fromwww.nature.com, doi:10.1038/nature 15263, 8 pages.
Chinese First Office Action in Chinese Patent Application No. 2016-80088872.5 dated Nov. 19, 2021, 12 pages, not translated.

\* cited by examiner

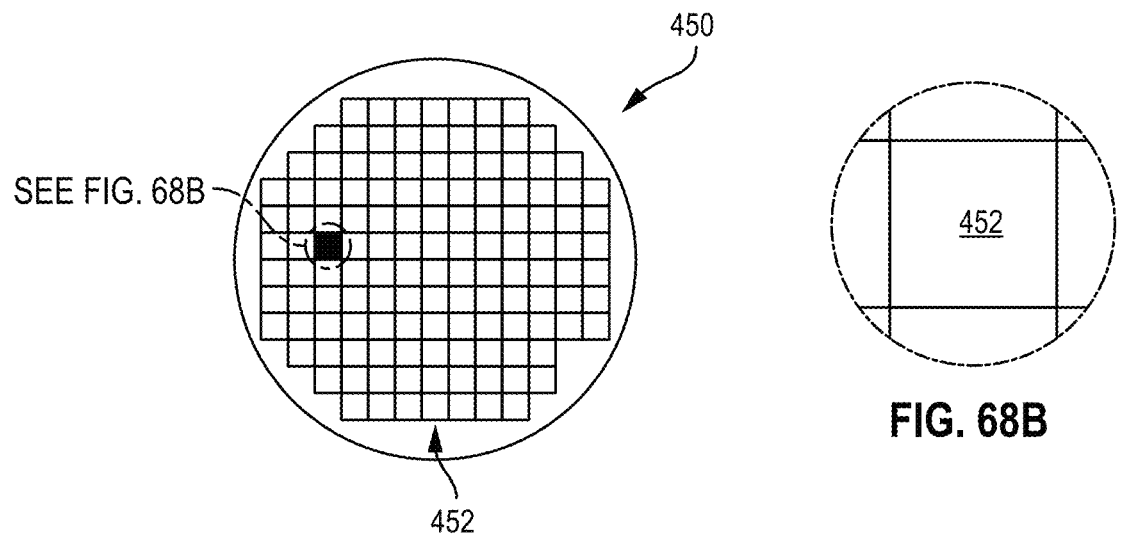
FIG. 68A
FIG. 68B
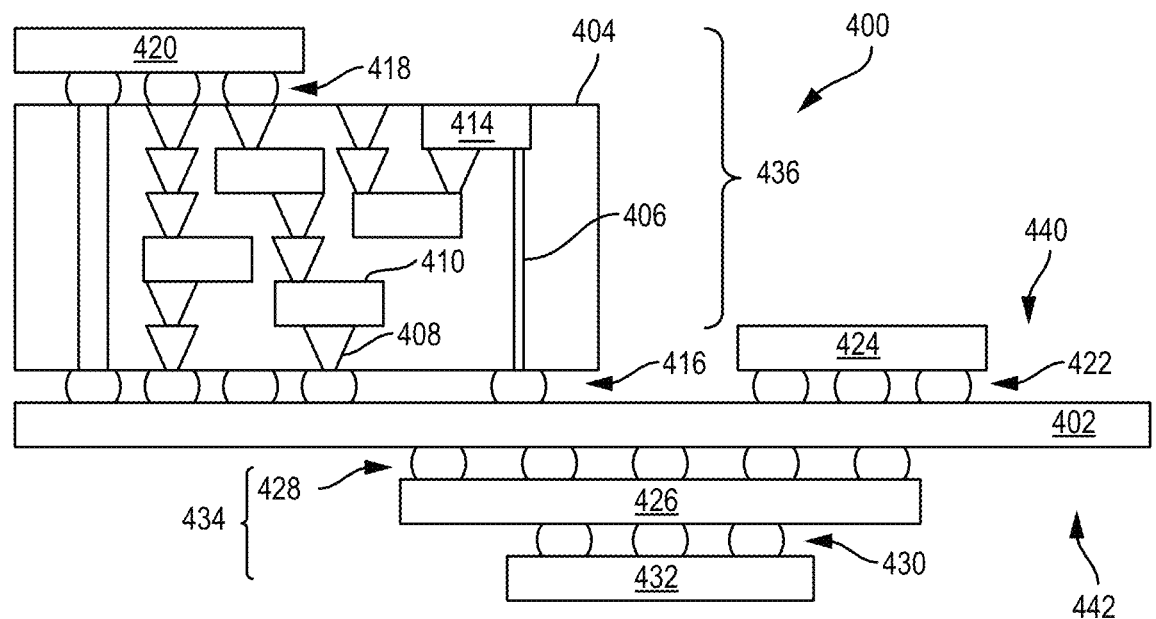
FIG. 69

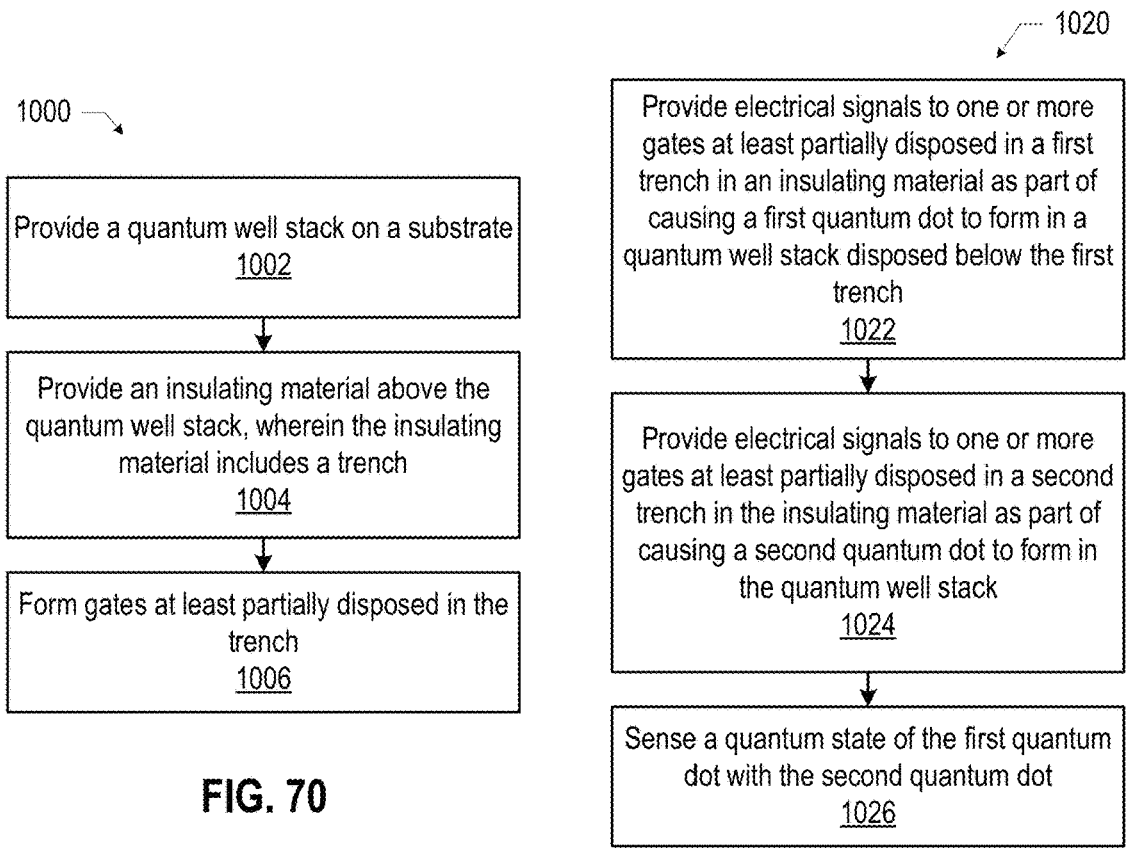
FIG. 70
FIG. 71
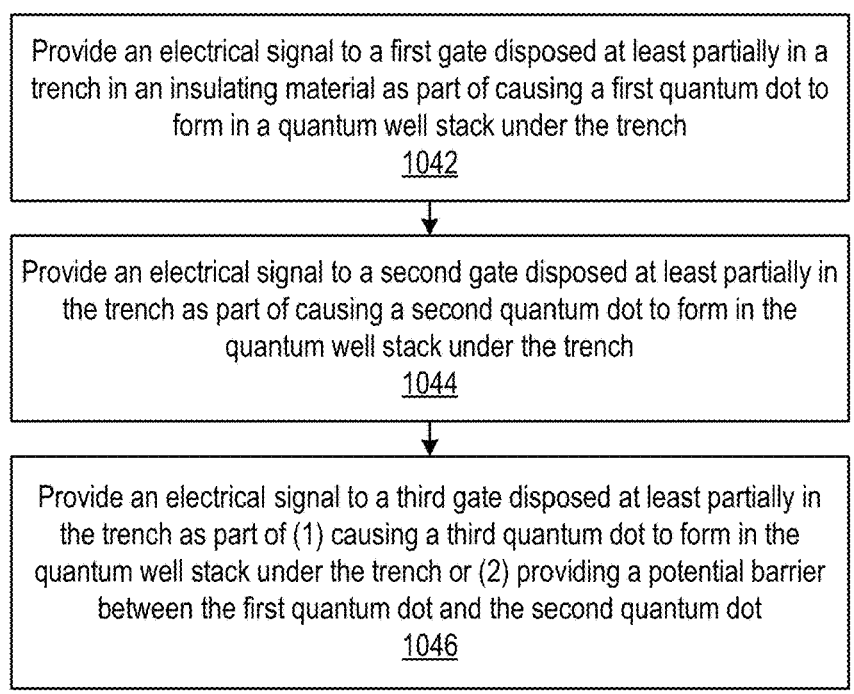
FIG. 72

QUANTUM DOT DEVICES

CROSS-REFERENCES TO RELATED APPLICATIONS

This application is a continuation of U.S. patent application Ser. No. 16/314,788, filed on Jan. 2, 2019 and entitled "QUANTUM DOT DEVICES," which is a national stage application under 35 U.S.C. § 371 of PCT International Application Serial No. PCT/US2016/049371, filed on Aug. 30, 2016 and entitled "QUANTUM DOT DEVICES," both of which are hereby incorporated by reference herein in their entireties.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 68A and 68B are top views of a wafer and dies that may include any of the quantum dot devices disclosed herein.

FIG. 69 is a cross-sectional side view of a device assembly that may include any of the quantum dot devices disclosed herein.

FIG. 70 is a flow diagram of an illustrative method of manufacturing a quantum dot device, in accordance with various embodiments.

FIGS. 71-72 are flow diagrams of illustrative methods of operating a quantum dot device, in accordance with various embodiments.

DETAILED DESCRIPTION

Figure 1:
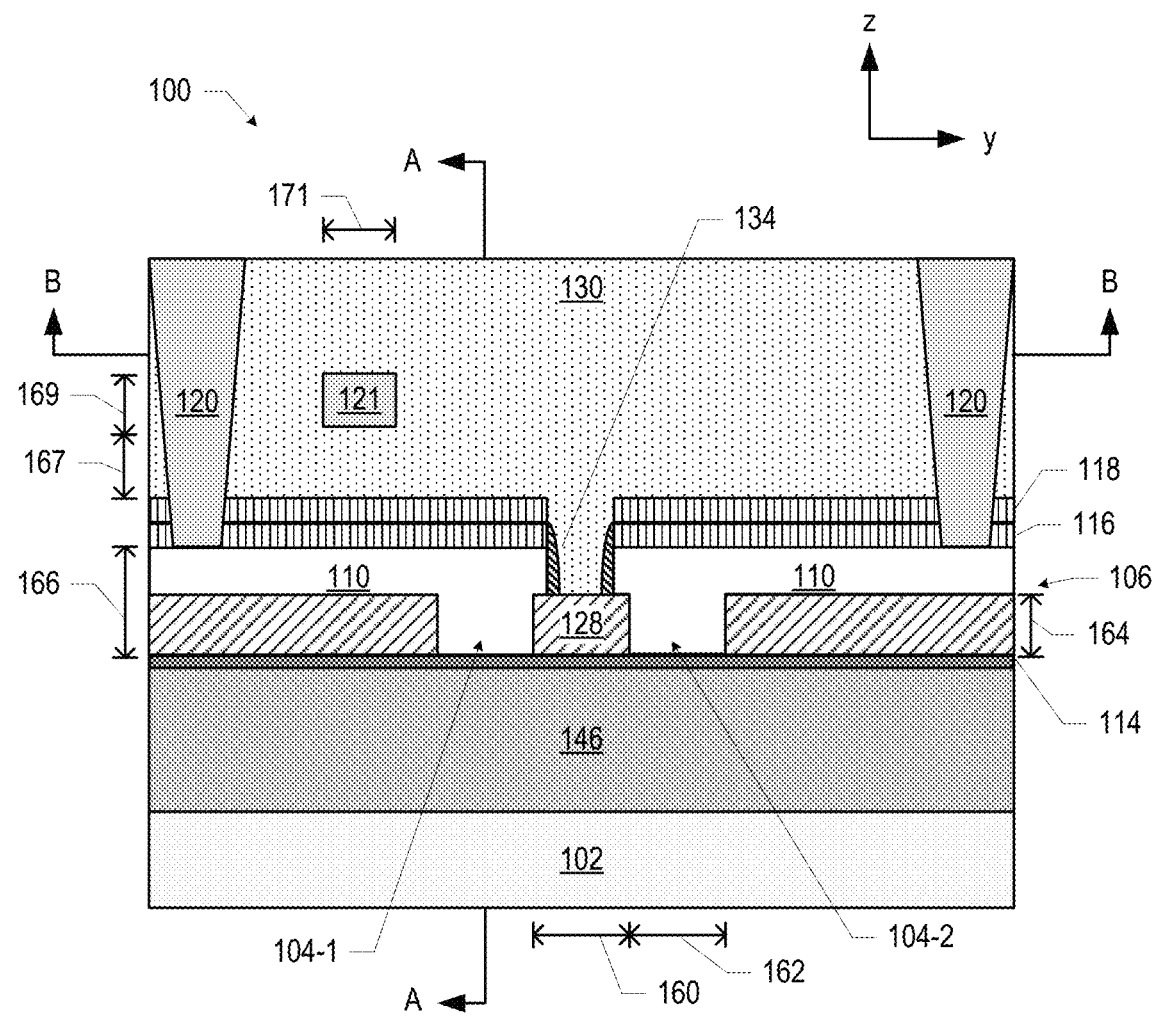
FIGS. 1-4 are cross-sectional views of a quantum dot device, in accordance with various embodiments.

Disclosed herein are quantum dot devices, as well as related computing devices and methods. For example, in some embodiments, a quantum dot device may include: a quantum well stack; an insulating material disposed above the quantum well stack, wherein the insulating material includes a trench; and a gate metal disposed on the insulating material and extending into the trench.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide. As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Figure 2:
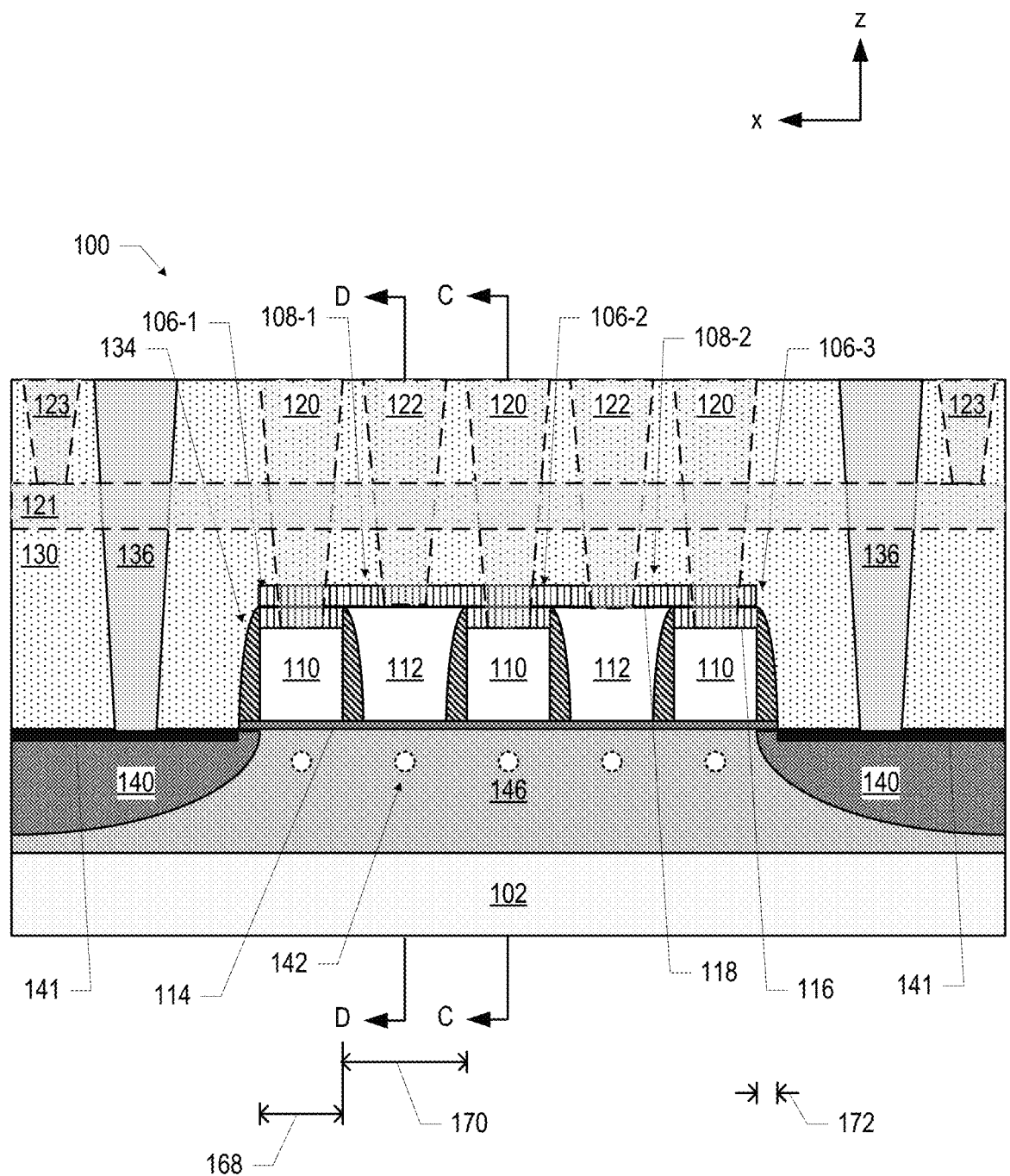
Figure 3:
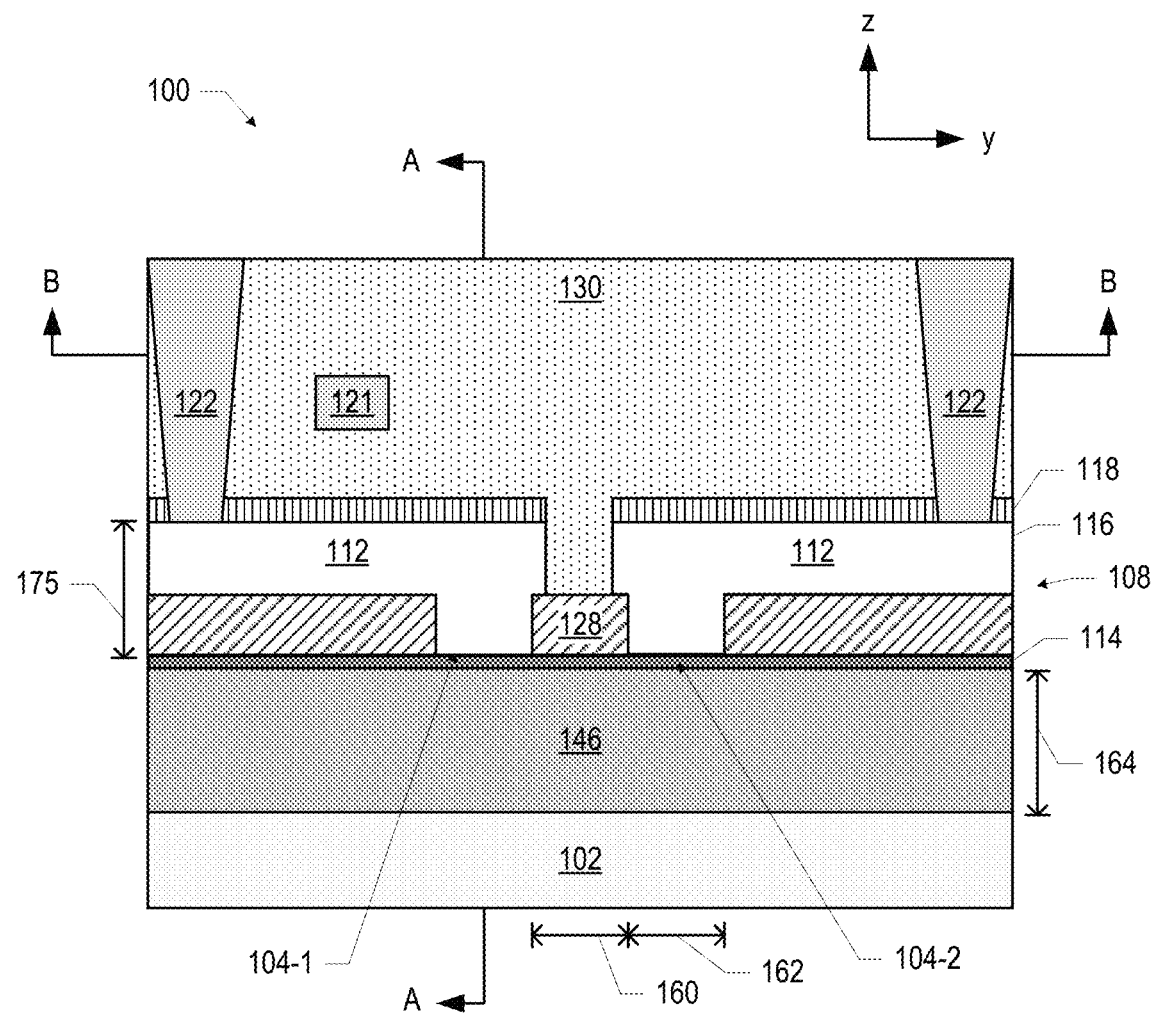
Figure 4:
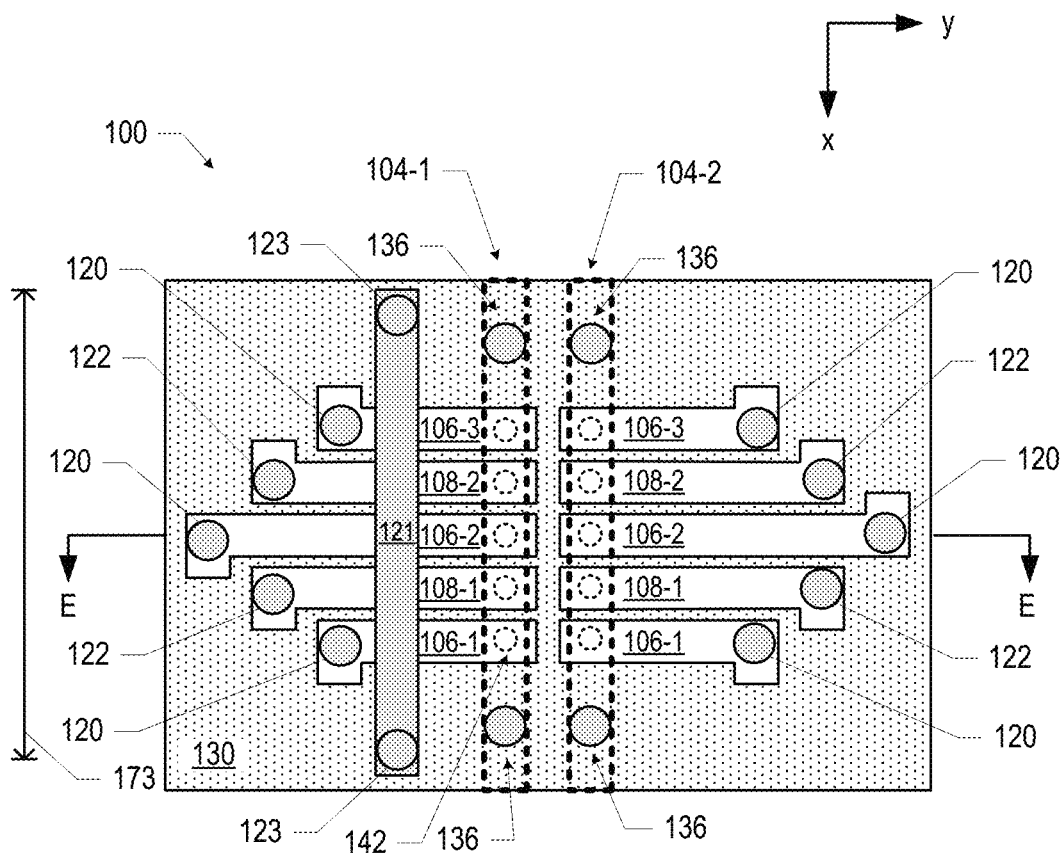

FIGS. 1-4 are cross-sectional views of a quantum dot device 100, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), FIG. 3 illustrates the quantum dot device 100 taken along the section D-D of FIG. 2 (while FIG. 2 illustrates the quantum dot device 100 taken along the section A-A of FIG. 3), and FIG. 4 illustrates the quantum dot device 100 taken along the section B-B of FIG. 1 with a number of components not shown to more readily illustrate how the gates 106/108 and the magnet line 121 may be patterned (while FIG. 1 illustrates a quantum dot device 100 taken along the section E-E of FIG. 4). Although FIG. 1 indicates that the cross section illustrated in FIG. 2 is taken through the trench 104-1, an analogous cross section taken through the trench 104-2 may be identical, and thus the discussion of FIG. 2 refers generally to the "trench 104."

The quantum dot device 100 may include a quantum well stack 146 disposed on a base 102. An insulating material 128 may be disposed above the quantum well stack 146, and multiple trenches 104 in the insulating material 128 may extend toward the quantum well stack 146. In the embodiment illustrated in FIGS. 1-4, a gate dielectric 114 may be disposed between the quantum well stack 146 and the insulating material 128 so as to provide the "bottom" of the trenches 104. A number of examples of quantum well stacks 146 are discussed below with reference to FIGS. 50-52.

Figure 55A:
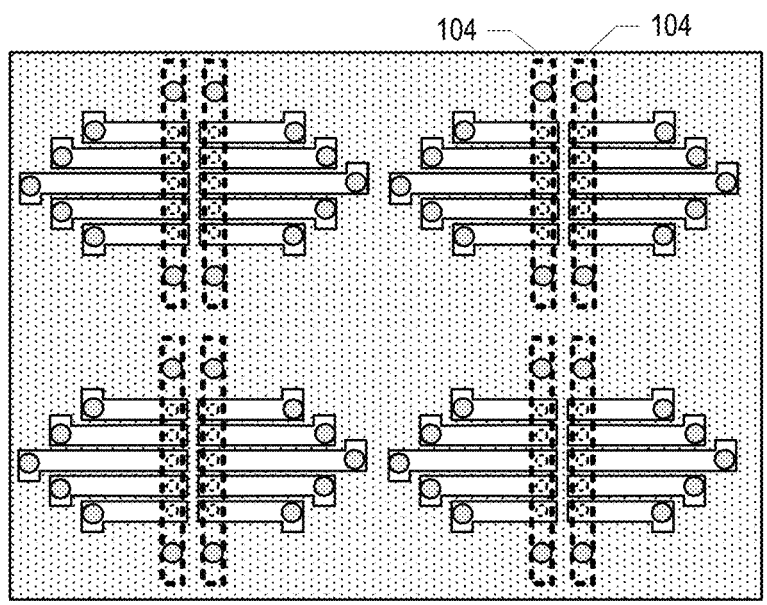
FIG. 55A illustrates an embodiment of a quantum dot device having multiple trenches arranged in a two-dimensional array, in accordance with various embodiments.

Although only two trenches, 104-1 and 104-2, are shown in FIGS. 1-4, this is simply for ease of illustration, and more than two trenches 104 may be included in the quantum dot device 100. In some embodiments, the total number of trenches 104 included in the quantum dot device 100 is an even number, with the trenches 104 organized into pairs including one active trench 104 and one read trench 104, as discussed in detail below. When the quantum dot device 100 includes more than two trenches 104, the trenches 104 may be arranged in pairs in a line (e.g., 2N trenches total may be arranged in a 1×2N line, or a 2×N line) or in pairs in a larger array (e.g., 2N trenches total may be arranged as a 4×N/2 array, a 6×N/3 array, etc.). For example, FIG. 55A illustrates a quantum dot device 100 including an example two-dimensional array of trenches 104. As illustrated in FIGS. 1 and 3, in some embodiments, multiple trenches 104 may be oriented in parallel. The discussion herein will largely focus on a single pair of trenches 104 for ease of illustration, but all the teachings of the present disclosure apply to quantum dot devices 100 with more trenches 104.

The quantum well stack 146 may include a quantum well layer (not shown in FIGS. 1-4, but discussed below with reference to the quantum well layer 152 of FIGS. 50-52). The quantum well layer included in the quantum well stack 146 may be arranged normal to the z-direction, and may provide a layer in which a two-dimensional electron gas (2 DEG) may form to enable the generation of a quantum dot during operation of the quantum dot device 100, as discussed in further detail below. The quantum well layer itself may provide a geometric constraint on the z-location of quantum dots in the quantum well stack 146. To control the x- and y-location of quantum dots in the quantum well stack 146, voltages may be applied to gates disposed at least partially in the trenches 104 above the quantum well stack 146 to adjust the energy profile along the trenches 104 in the x- and y-direction and thereby constrain the x- and y-location of quantum dots within quantum wells (discussed in detail below with reference to the gates 106/108). The dimensions of the trenches 104 may take any suitable values. For example, in some embodiments, the trenches 104 may each have a width 162 between 10 and 30 nanometers. In some embodiments, the trenches 104 may each have a depth 164 between 200 and 400 nanometers (e.g., between 250 and 350 nanometers, or equal to 300 nanometers). The insulating material 128 may be a dielectric material (e.g., an interlayer dielectric), such as silicon oxide. In some embodiments, the insulating material 128 may be a chemical vapor deposition (CVD) or flowable CVD oxide. In some embodiments, the trenches 104 may be spaced apart by a distance 160 between 50 and 500 nanometers.

Multiple gates may be disposed at least partially in each of the trenches 104. In the embodiment illustrated in FIG. 2, three gates 106 and two gates 108 are shown as distributed at least partially in a single trench 104. This particular number of gates is simply illustrative, and any suitable number of gates may be used. Additionally, as discussed below with reference to FIG. 55B, multiple groups of gates (like the gates illustrated in FIG. 2) may be disposed at least partially in the trench 104.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 2, the gate dielectric 114 for all of the gates 106/108 is provided by a common layer of gate dielectric material disposed between the quantum well stack 146 and the insulating material 128. In other embodiments, the gate dielectric 114 for each of the gates 106/108 may be provided by separate portions of gate dielectric 114 (e.g., as discussed below with reference to FIGS. 56-59). In some embodiments, the gate dielectric 114 may be a multilayer gate dielectric (e.g., with multiple materials used to improve the interface between the trench 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the quantum well stack 146. As shown in FIG. 1, in some embodiments, the gate metal 110 of a gate 106 may extend over the insulating material 128 and into a trench 104 in the insulating material 128. Only one portion of the hardmask 116 is labeled in FIG. 2 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 2, and insulating spacers 134 may be disposed on the sides of the gate metal 110 and the hardmask 116 along the longitudinal axis of the trench 104. As illustrated in FIG. 2, the spacers 134 may be thicker closer to the quantum well stack 146 and thinner farther away from the quantum well stack 146. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride. As illustrated in FIG. 2, no spacer material may be disposed between the gate metal 110 and the sidewalls of the trench 104 in the y-direction.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the quantum well stack 146. As shown in FIG. 3, in some embodiments, the gate metal 112 of a gate 108 may extend over the insulating material 128 and into a trench 104 in the insulating material 128. In the embodiment illustrated in FIG. 2, the hardmask 118 may extend over the hardmask 116 (and over the gate metal 110 of the gates 106), while in other embodiments, the hardmask 118 may not extend over the gate metal 110. In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108-1 may extend between the proximate spacers 134 on the sides of the gate 106-1 and the gate 106-2 along the longitudinal axis of the trench 104, as shown in FIG. 2. In some embodiments, the gate metal 112 of the gate 108-1 may extend between the spacers 134 on the sides of the gate 106-1 and the gate 106-2 along the longitudinal axis of the trench 104. Thus, the gate metal 112 of the gate 108-1 may have a shape that is substantially complementary to the shape of the spacers 134, as shown. Similarly, the gate 108-2 may extend between the proximate spacers 134 on the sides of the gate 106-2 and the gate 106-3 along the longitudinal axis of the trench 104. In some embodiments in which the gate dielectric 114 is not a layer shared commonly between the gates 108 and 106, but instead is separately deposited in the trench 104 between the spacers 134 (e.g., as discussed below with reference to FIGS. 56-59), the gate dielectric 114 may extend at least partially up the sides of the spacers 134 (and up the proximate sidewalls of the trench 104), and the gate metal 112 may extend between the portions of gate dielectric 114 on the spacers 134 (and the proximate sidewalls of the trench 104). The gate metal 112, like the gate metal 110, may be any suitable metal, such as titanium nitride. As illustrated in FIG. 3, in some embodiments, no spacer material may be disposed between the gate metal 112 and the sidewalls of the trench 104 in the y-direction; in other embodiments (e.g., as discussed below with reference to FIGS. 48 and 49), spacers 134 may also be disposed between the gate metal 112 and the sidewalls of the trench 104 in the y-direction.

The dimensions of the gates 106/108 may take any suitable values. For example, in some embodiments, the z-height 166 of the gate metal 110 in the trench 104 may be between 225 and 375 nanometers (e.g., approximately 300 nanometers); the z-height 175 of the gate metal 112 may be in the same range. This z-height 166 of the gate metal 110 in the trench 104 may represent the sum of the z-height of the insulating material 128 (e.g., between 200 and 300 nanometers) and the thickness of the gate metal 110 on top of the insulating material 128 (e.g., between 25 and 75 nanometers, or approximately 50 nanometers). In embodiments like the ones illustrated in FIGS. 1-3, the z-height 175 of the gate metal 112 may be greater than the z-height 166 of the gate metal 110. In some embodiments, the length 168 of the gate metal 110 (i.e., in the x-direction) may be between 20 and 40 nanometers (e.g., 30 nanometers). Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 2) may have a greater length 168 than the "inner" gates 106 (e.g., the gate 106-2 in the embodiment illustrated in FIG. 2). Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 100 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIGS. 1 and 3, the gates 106/108 in one trench 104 may extend over the insulating material 128 between that trench 104 and an adjacent trench 104, but may be isolated from their counterpart gates by the intervening insulating material 130 and spacers 134.

As shown in FIG. 2, the gates 106 and 108 may be alternatingly arranged in the x-direction. During operation of the quantum dot device 100, voltages may be applied to the gates 106/108 to adjust the potential energy in the quantum well stack 146 to create quantum wells of varying depths in which quantum dots 142 may form. Only one quantum dot 142 is labeled with a reference numeral in FIGS. 2 and 4 for ease of illustration, but five are indicated as dotted circles below each trench 104. The location of the quantum dots 142 in FIGS. 2 and 4 is not intended to indicate a particular geometric positioning of the quantum dots 142. The spacers 134 (and the insulating material 128) may themselves provide "passive" barriers between quantum dots under the gates 106/108 in the quantum well stack 146, and the voltages applied to different ones of the gates 106/108 may adjust the potential energy under the gates 106/108 in the quantum well stack 146; decreasing the potential energy under a gate 106/108 may enable the formation of a quantum dot under that gate 106/108, while increasing the potential energy under a gate 106/108 may form a quantum barrier under that gate 106/108.

The quantum well stack 146 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 33-34). In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depends on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well stack 146 under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-4, the gates 106 may extend both "vertically" and "horizontally" away from the quantum well stack 146, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may similarly extend away from the quantum well stack 146, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140 and through a quantum well layer of the quantum well stack 146 (discussed in further detail below with reference to FIGS. 50-52). When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

In some embodiments, the quantum dot device 100 may include one or more magnet lines 121. For example, a single magnet line 121 is illustrated in FIGS. 1-4, proximate to the trench 104-1. The magnet line 121 may be formed of a conductive material, and may be used to conduct current pulses that generate magnetic fields to influence the spin states of one or more of the quantum dots 142 that may form in the quantum well stack 146. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIGS. 1-4 is non-coplanar with the trenches 104, and is also non-coplanar with the gates 106/108. In some embodiments, the magnet line 121 may be spaced apart from the gates 106/108 by a distance 167. The distance 167 may take any suitable value (e.g., based on the desired strength of magnetic field interaction with particular quantum dots 142); in some embodiments, the distance 167 may be between 25 nanometers and 1 micron (e.g., between 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between 25 and 100 nanometers. The magnet line 121 may have a width 171 between 25 and 100 nanometers. In some embodiments, the width 171 and thickness 169 of a magnet line 121 may be equal to the width and thickness, respectively, of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 1-4 (and the magnet lines 121 illustrated in FIGS. 45-47 below) are substantially linear, but this need not be the case; the magnet lines 121 disclosed herein may take any suitable shape. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/136/123 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-4 is simply illustrative, and any electrical routing arrangement may be implemented.

As discussed above, the structure of the trench 104-1 may be the same as the structure of the trench 104-2; similarly, the construction of gates 106/108 in and around the trench 104-1 may be the same as the construction of gates 106/108 in and around the trench 104-2. The gates 106/108 associated with the trench 104-1 may be mirrored by corresponding gates 106/108 associated with the parallel trench 104-2, and the insulating material 130 may separate the gates 106/108 associated with the different trenches 104-1 and 104-2. In particular, quantum dots 142 formed in the quantum well stack 146 under the trench 104-1 (under the gates 106/108) may have counterpart quantum dots 142 in the quantum well stack 146 under the trench 104-2 (under the corresponding gates 106/108). In some embodiments, the quantum dots 142 under the trench 104-1 may be used as "active" quantum dots in the sense that these quantum dots 142 act as qubits and are controlled (e.g., by voltages applied to the gates 106/108 associated with the trench 104-1) to perform quantum computations. The quantum dots 142 associated with the trench 104-2 may be used as "read" quantum dots in the sense that these quantum dots 142 may sense the quantum state of the quantum dots 142 under the trench 104-1 by detecting the electric field generated by the charge in the quantum dots 142 under the trench 104-1, and may convert the quantum state of the quantum dots 142 under the trench 104-1 into electrical signals that may be detected by the gates 106/108 associated with the trench 104-2. Each quantum dot 142 under the trench 104-1 may be read by its corresponding quantum dot 142 under the trench 104-2. Thus, the quantum dot device 100 enables both quantum computation and the ability to read the results of a quantum computation.

The quantum dot devices 100 disclosed herein may be manufactured using any suitable techniques. FIGS. 5-44 illustrate various example stages in the manufacture of the quantum dot device 100 of FIGS. 1-4, in accordance with various embodiments. Although the particular manufacturing operations discussed below with reference to FIGS. 5-44 are illustrated as manufacturing a particular embodiment of the quantum dot device 100, these operations may be applied to manufacture many different embodiments of the quantum dot device 100, as discussed herein. Any of the elements discussed below with reference to FIGS. 5-44 may take the form of any of the embodiments of those elements discussed above (or otherwise disclosed herein).

Figure 5:
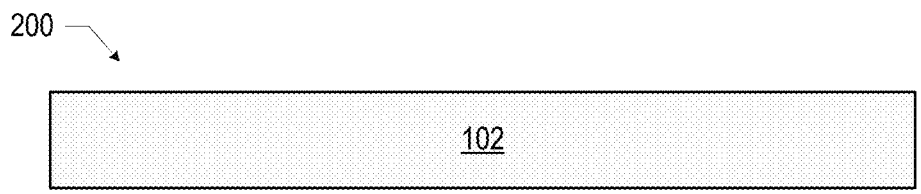
FIGS. 5-44 illustrate various example stages in the manufacture of a quantum dot device, in accordance with various embodiments.

FIG. 5 illustrates a cross-sectional view of an assembly 200 including a base 102. As discussed below, the base 102 may serve as a platform on which to form a quantum well stack 146. In some embodiments, the base 102 may include any suitable semiconductor material or materials. For example, the base 102 may include silicon (e.g., may be formed from a silicon wafer), germanium, or any other suitable material.

Figure 6:
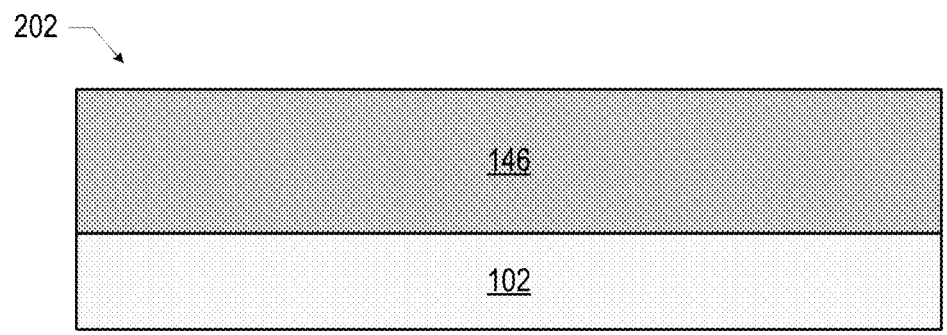

FIG. 6 illustrates a cross-sectional view of an assembly 202 subsequent to forming a quantum well stack 146 on the base 102 of the assembly 200 (FIG. 5). The quantum well stack 146 may include a quantum well layer (not shown) in which a 2 DEG may form during operation of the quantum dot device 100. The one or more layers of the quantum well stack 146 may be formed by epitaxy. Various embodiments of the quantum well stack 146 are discussed below with reference to FIGS. 50-52.

Figure 7:
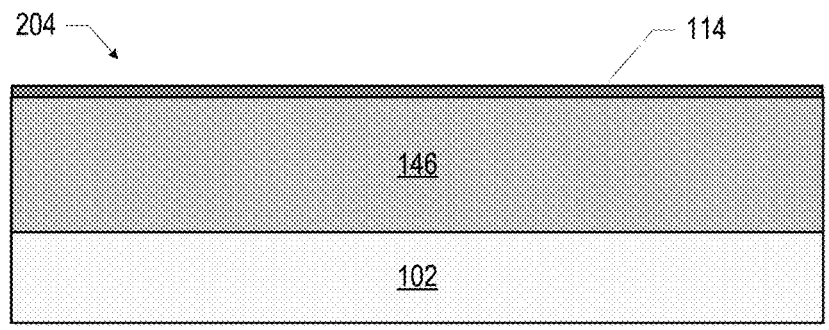

FIG. 7 is a cross-sectional view of an assembly 204 subsequent to providing a layer of gate dielectric 114 on the quantum well stack 146 of the assembly 202 (FIG. 6). In some embodiments, the gate dielectric 114 may be provided by atomic layer deposition (ALD), or any other suitable technique.

Figure 8:
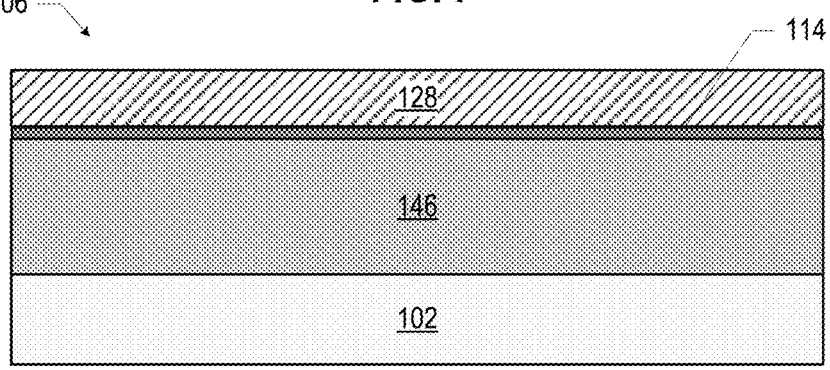

FIG. 8 is a cross-sectional view of an assembly 206 subsequent to providing an insulating material 128 on the assembly 204 (FIG. 7). Any suitable material may be used as the insulating material 128 to electrically insulate the trenches 104 from each other, as discussed above. As noted above, in some embodiments, the insulating material 128 may be a dielectric material, such as silicon oxide. In some embodiments, the gate dielectric 114 may not be provided on the quantum well stack 146 before the deposition of the insulating material 128; instead, the insulating material 128 may be provided directly on the quantum well stack 146, and the gate dielectric 114 may be provided in trenches 104 of the insulating material 128 after the trenches 104 are formed (as discussed below with reference to FIG. 9 and FIGS. 60-65).

Figure 9:
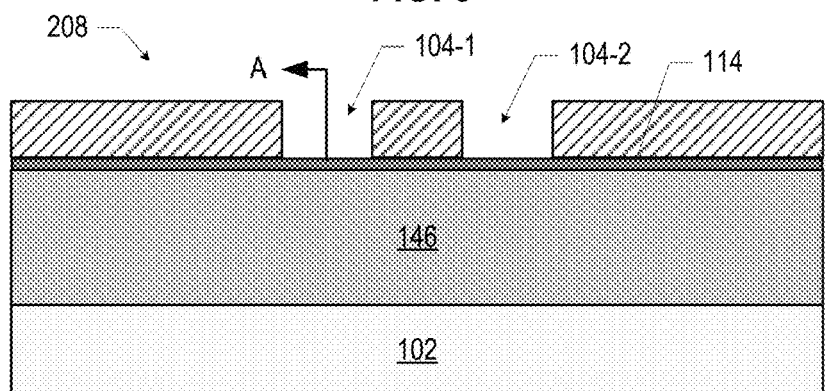
Figure 10:
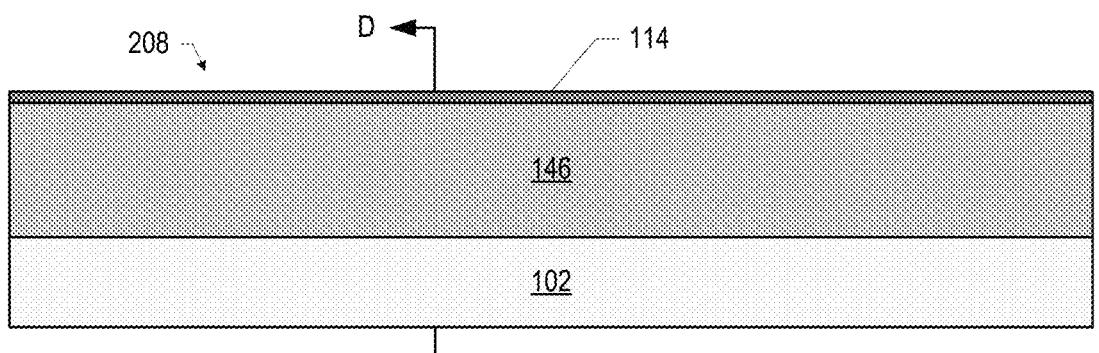

FIG. 9 is a cross-sectional view of an assembly 208 subsequent to forming trenches 104 in the insulating material 128 of the assembly 206 (FIG. 8). The trenches 104 may extend down to the gate dielectric 114, and may be formed in the assembly 206 by patterning and then etching the assembly 206 using any suitable conventional lithographic process known in the art. For example, a hardmask may be provided on the insulating material 128, and a photoresist may be provided on the hardmask; the photoresist may be patterned to identify the areas in which the trenches 104 are to be formed, the hardmask may be etched in accordance with the patterned photoresist, and the insulating material 128 may be etched in accordance with the etched hardmask (after which the remaining hardmask and photoresist may be removed). In some embodiments, a combination of dry and wet etch chemistry may be used to form the trenches 104 in the insulating material 128, and the appropriate chemistry may depend on the materials included in the assembly 208, as known in the art. Although the trenches 104 illustrated in FIG. 9 (and other accompanying drawings) are shown as having substantially parallel sidewalls, in some embodiments, the trenches 104 may be tapered, narrowing towards the quantum well stack 146. FIG. 10 is a view of the assembly 208 taken along the section A-A of FIG. 9, through a trench 104 (while FIG. 9 illustrates the assembly 208 taken along the section D-D of FIG. 10). FIGS. 11-14 maintain the perspective of FIG. 10.

As noted above, in some embodiments, the gate dielectric 114 may be provided in the trenches 104 (instead of before the insulating material 128 is initially deposited, as discussed above with reference to FIG. 7). For example, the gate dielectric 114 may be provided in the trenches 104 in the manner discussed below with reference to FIG. 58 (e.g., using ALD). In such embodiments, the gate dielectric 114 may be disposed at the bottom of the trenches 104, and extend up onto the sidewalls of the trenches 104.

Figure 11:
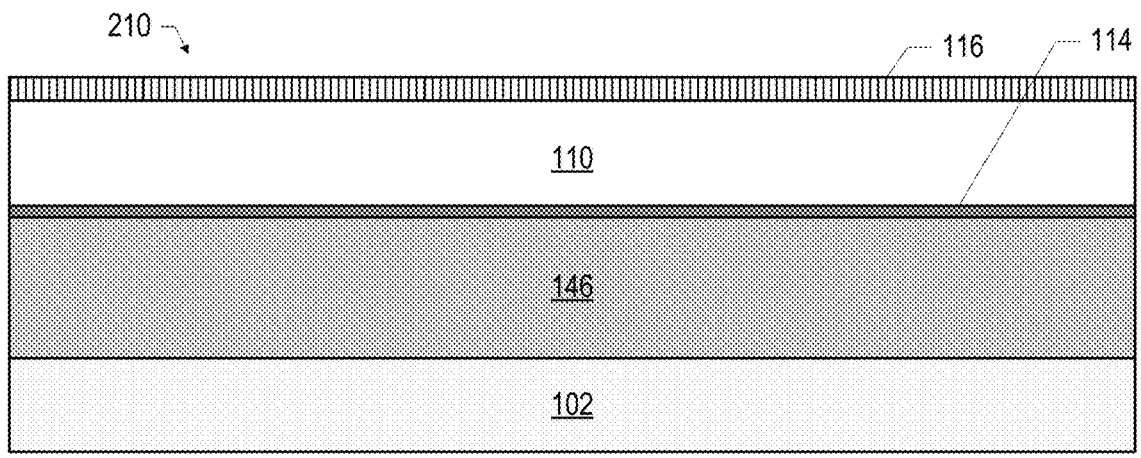

FIG. 11 is a cross-sectional view of an assembly 210 subsequent to providing a gate metal 110 and a hardmask 116 on the assembly 208 (FIGS. 9-10). The hardmask 116 may be formed of an electrically insulating material, such as silicon nitride or carbon-doped nitride. The gate metal 110 of the assembly 210 may fill the trenches 104 and extend over the insulating material 128.

Figure 12:
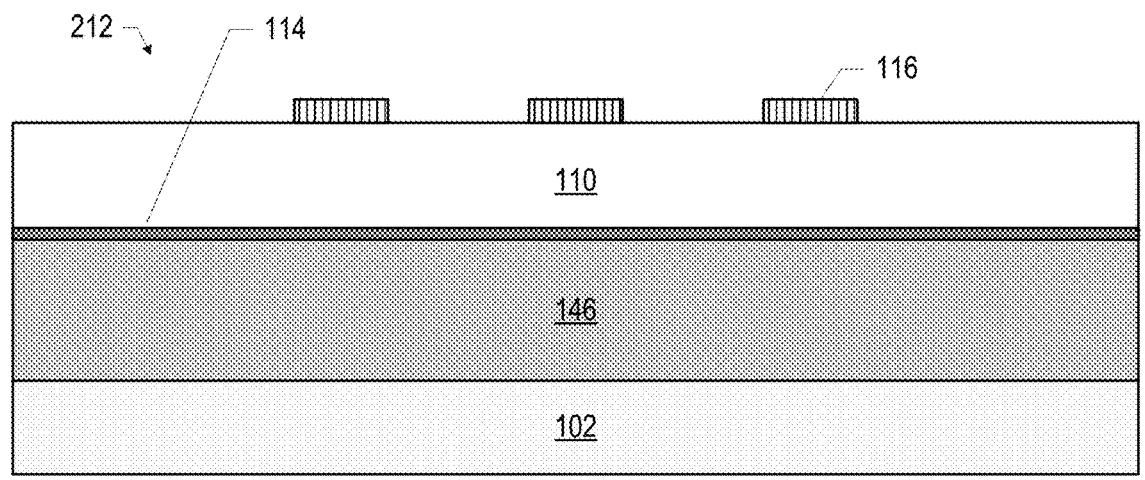

FIG. 12 is a cross-sectional view of an assembly 212 subsequent to patterning the hardmask 116 of the assembly 210 (FIG. 11). The pattern applied to the hardmask 116 may correspond to the locations for the gates 106, as discussed below. The hardmask 116 may be patterned by applying a resist, patterning the resist using lithography, and then etching the hardmask (using dry etching or any appropriate technique).

Figure 13:
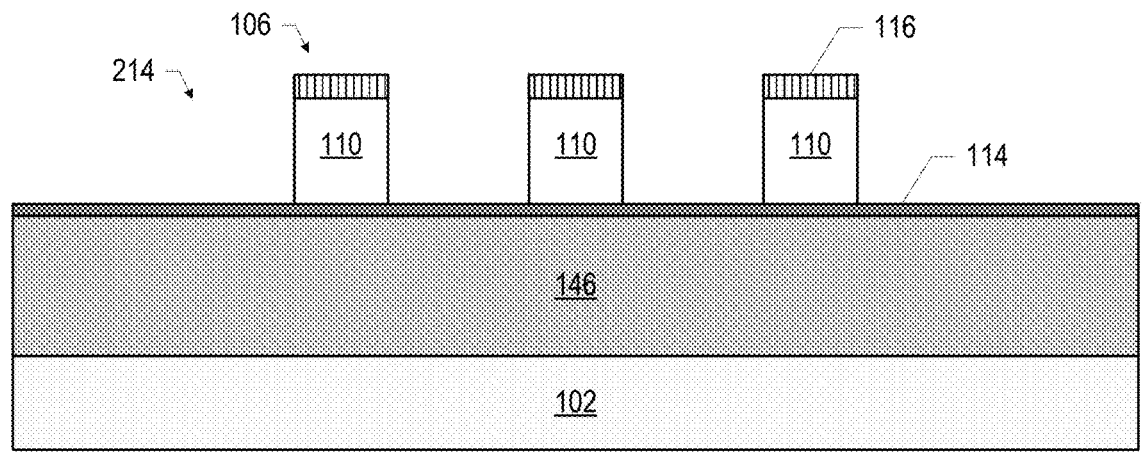

FIG. 13 is a cross-sectional view of an assembly 214 subsequent to etching the assembly 212 (FIG. 12) to remove the gate metal 110 that is not protected by the patterned hardmask 116 to form the gates 106. The etching of the gate metal 110 may form multiple gates 106 associated with a particular trench 104, and also separate portions of gate metal 110 corresponding to gates 106 associated with different trenches 104 (e.g., as illustrated in FIG. 1). In some embodiments, as illustrated in FIG. 13, the gate dielectric 114 may remain on the quantum well stack 146 after the etched gate metal 110 is etched away; in other embodiments, the gate dielectric 114 may also be etched during the etching of the gate metal 110. Examples of such embodiments are discussed below with reference to FIGS. 56-59.

Figure 14:
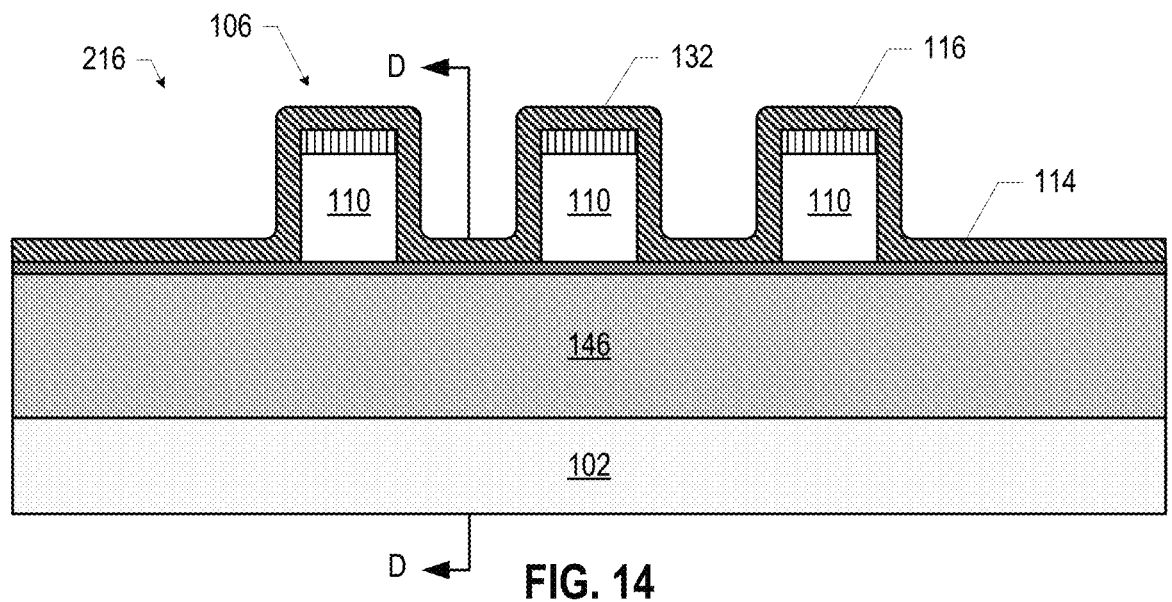
Figure 15:
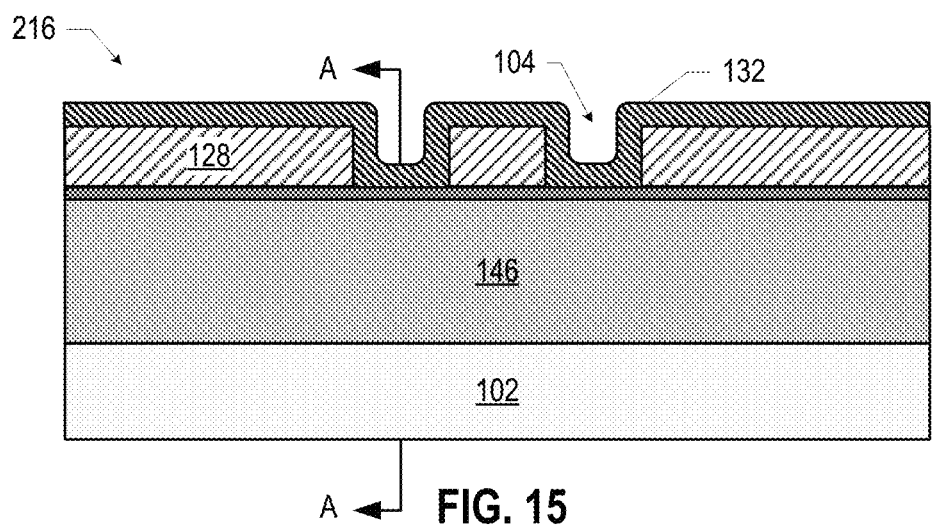

FIG. 14 is a cross-sectional view of an assembly 216 subsequent to providing spacer material 132 on the assembly 214 (FIG. 13). FIG. 15 is a view of the assembly 216 taken along the section D-D of FIG. 14, through the region between adjacent gates 106 (while FIG. 14 illustrates the assembly 216 taken along the section A-A of FIG. 15, along a trench 104). The spacer material 132 may include any of the materials discussed above with reference to the spacers 134, for example, and may be deposited using any suitable technique. For example, the spacer material 132 may be a nitride material (e.g., silicon nitride) deposited by chemical vapor deposition (CVD) or atomic layer deposition (ALD). As illustrated in FIGS. 14 and 15, the spacer material 132 may be conformally deposited on the assembly 214.

Figure 16:
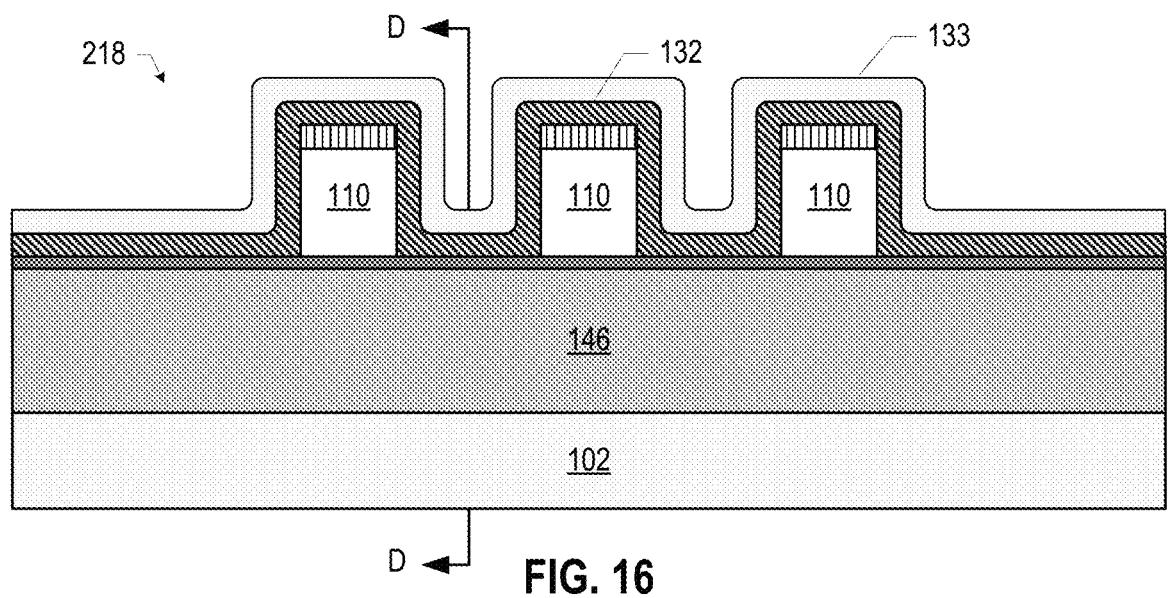
Figure 17:
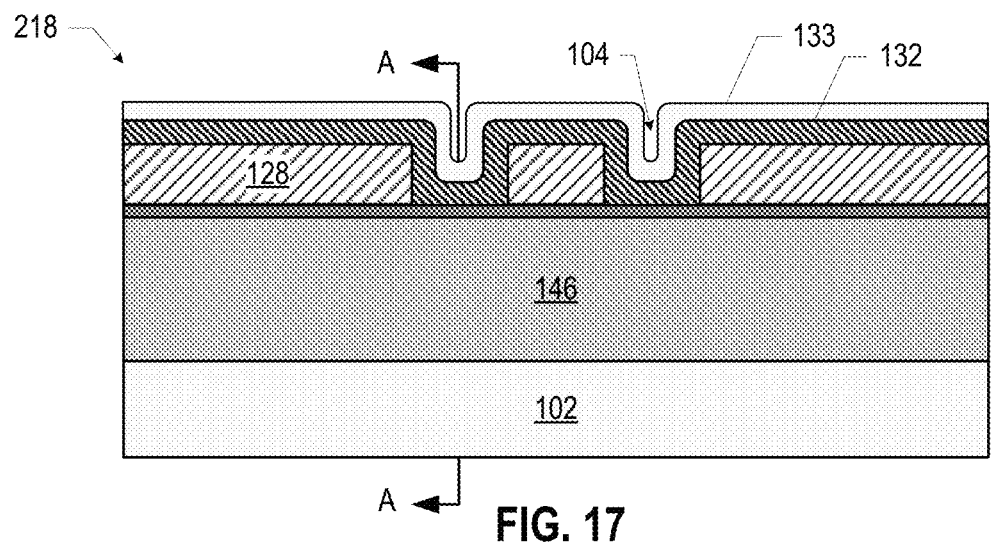

FIG. 16 is a cross-sectional view of an assembly 218 subsequent to providing capping material 133 on the assembly 216 (FIGS. 14 and 15). FIG. 17 is a view of the assembly 218 taken along the section D-D of FIG. 16, through the region between adjacent gates 106 (while FIG. 16 illustrates the assembly 218 taken along the section A-A of FIG. 17, along a trench 104). The capping material 133 may be any suitable material; for example, the capping material 133 may be silicon oxide deposited by CVD or ALD. As illustrated in FIGS. 16 and 17, the capping material 133 may be conformally deposited on the assembly 216.

Figure 18:
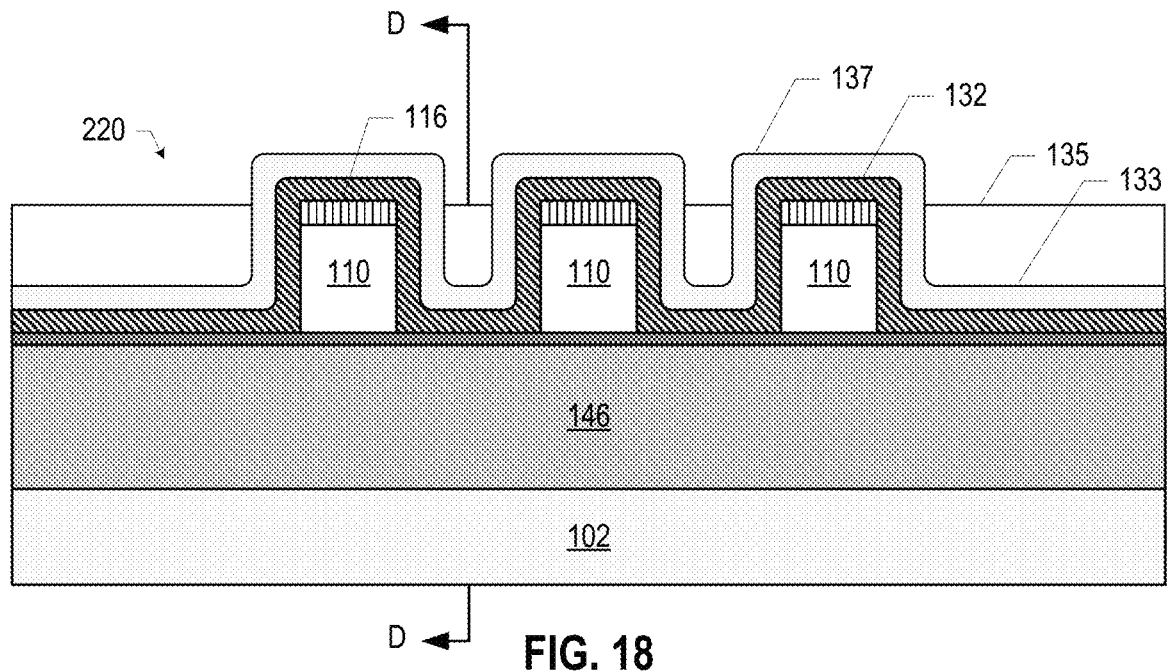
Figure 19:
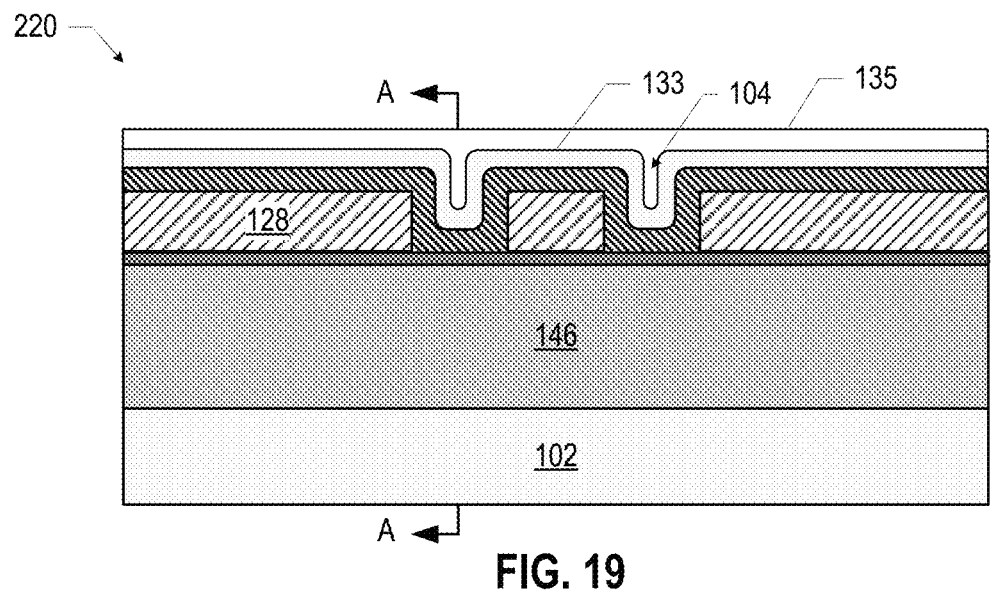

FIG. 18 is a cross-sectional view of an assembly 220 subsequent to providing a sacrificial material 135 on the assembly 218 (FIGS. 16 and 17). FIG. 19 is a view of the assembly 220 taken along the section D-D of FIG. 18, through the region between adjacent gates 106 (while FIG. 18 illustrates the assembly 220 taken along the section A-A of FIG. 19, through a trench 104). The sacrificial material 135 may be deposited on the assembly 218 to completely cover the capping material 133, then the sacrificial material 135 may be recessed to expose portions 137 of the capping material 133. In particular, the portions 137 of capping material 133 disposed near the hardmask 116 on the gate metal 110 may not be covered by the sacrificial material 135. As illustrated in FIG. 19, all of the capping material 133 disposed in the region between adjacent gates 106 may be covered by the sacrificial material 135. The recessing of the sacrificial material 135 may be achieved by any etching technique, such as a dry etch. The sacrificial material 135 may be any suitable material, such as a bottom anti-reflective coating (BARC).

Figure 20:
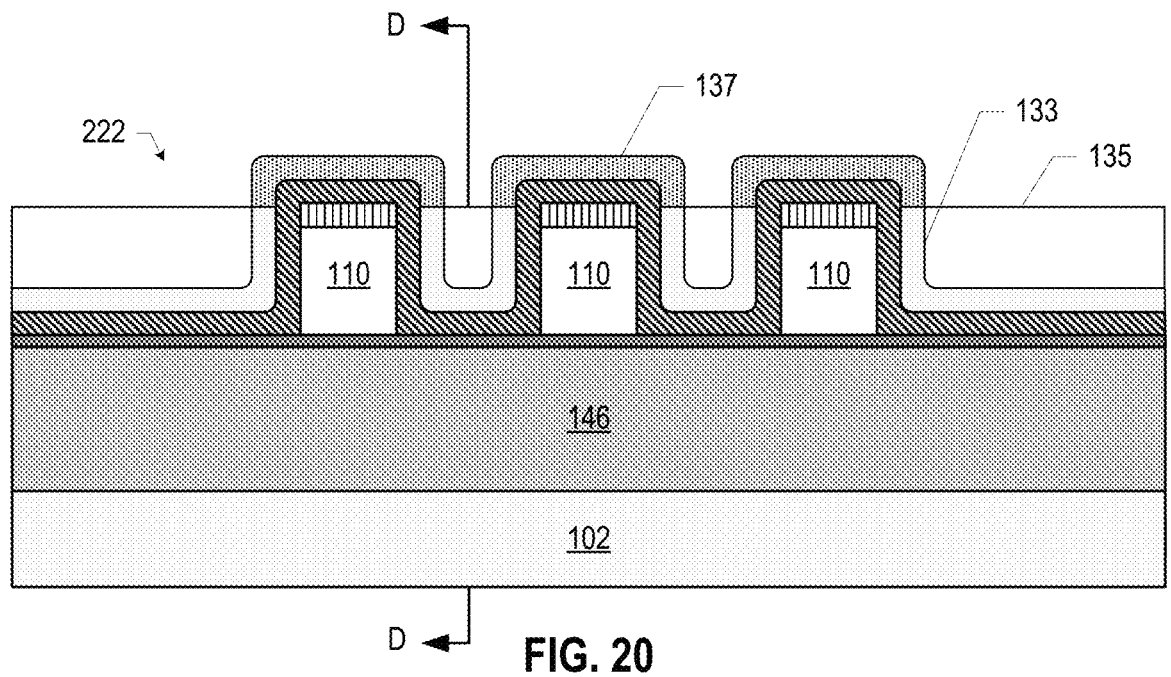
Figure 21:
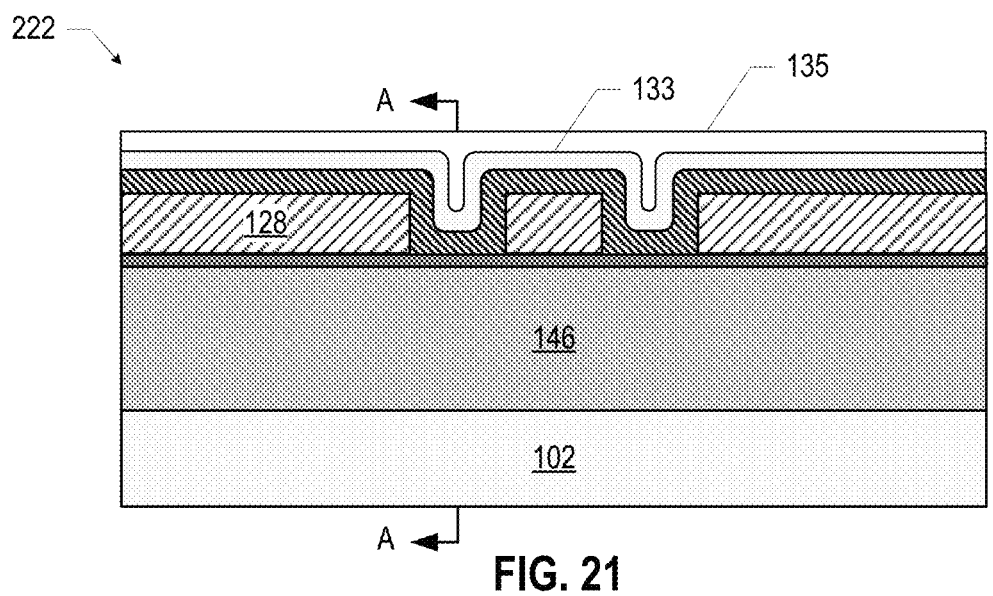

FIG. 20 is a cross-sectional view of an assembly 222 subsequent to treating the exposed portions 137 of the capping material 133 of the assembly 220 (FIGS. 18 and 19) to change the etching characteristics of the exposed portions 137 relative to the rest of the capping material 133. FIG. 21 is a view of the assembly 222 taken along the section D-D of FIG. 20, through the region between adjacent gates 106 (while FIG. 20 illustrates the assembly 222 taken along the section A-A of FIG. 21, through a trench 104). In some embodiments, this treatment may include performing a high-dose ion implant in which the implant dose is high enough to cause a compositional change in the portions 137 and achieve a desired change in etching characteristics.

Figure 22:
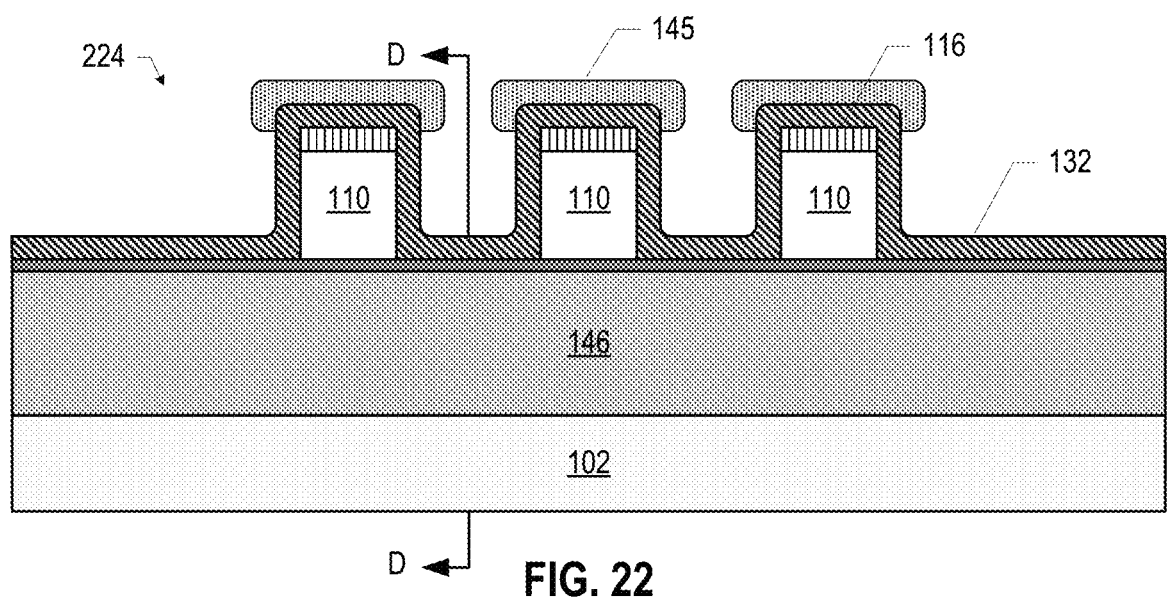
Figure 23:
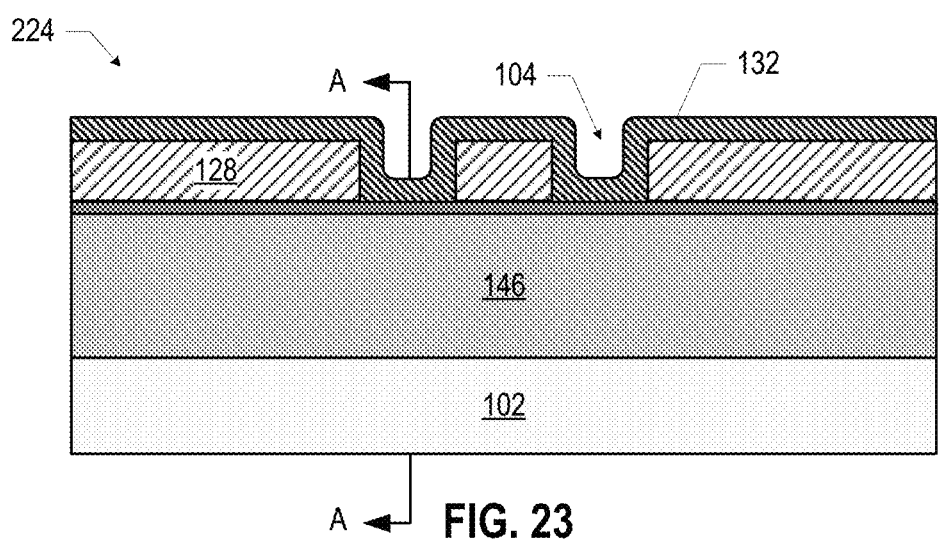

FIG. 22 is a cross-sectional view of an assembly 224 subsequent to removing the sacrificial material 135 and the unexposed capping material 133 of the assembly 222 (FIGS. 20 and 21). FIG. 23 is a view of the assembly 224 taken along the section D-D of FIG. 22, through the region between adjacent gates 106 (while FIG. 22 illustrates the assembly 224 taken along the section A-A of FIG. 23, through a trench 104). The sacrificial material 135 may be removed using any suitable technique (e.g., by ashing, followed by a cleaning step), and the untreated capping material 133 may be removed using any suitable technique (e.g., by etching). In embodiments in which the capping material 133 is treated by ion implantation (e.g., as discussed above with reference to FIGS. 20 and 21), a high temperature anneal may be performed to incorporate the implanted ions in the portions 137 of the capping material 133 before removing the untreated capping material 133. The remaining treated capping material 133 in the assembly 224 may provide capping structures 145 disposed proximate to the "tops" of the gates 106 and extending over the spacer material 132 disposed on the "sides" of the gates 106.

Figure 24:
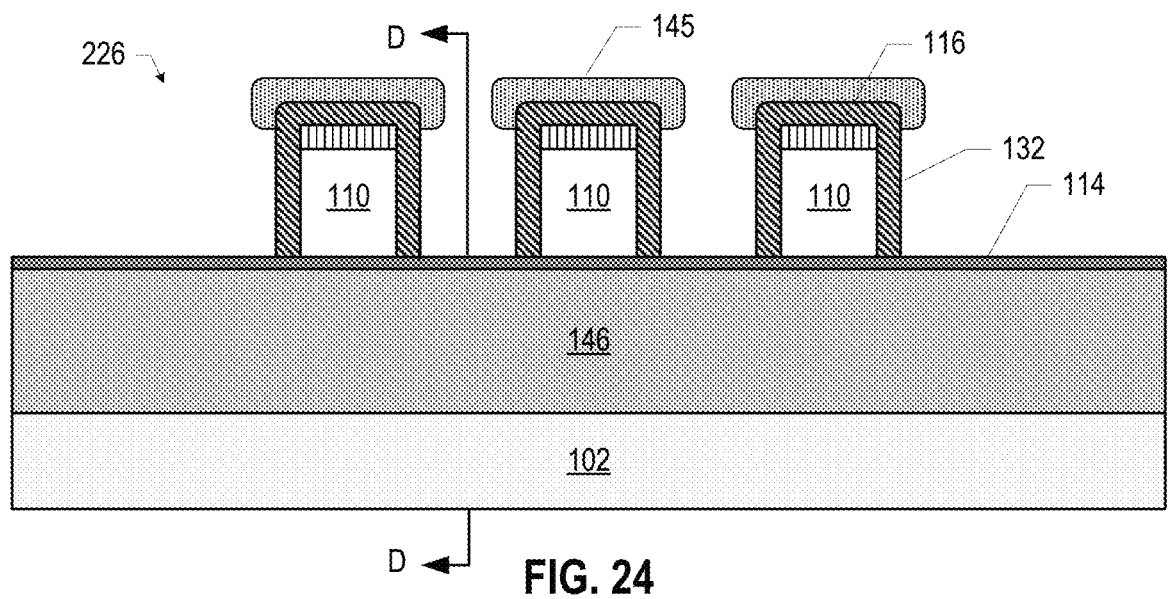
Figure 25:
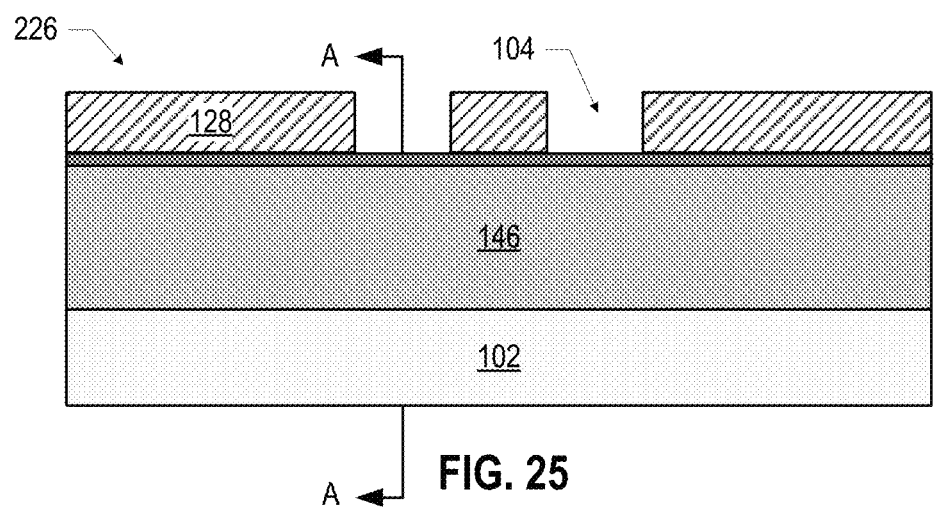

FIG. 24 is a cross-sectional view of an assembly 226 subsequent to directionally etching the spacer material 132 of the assembly 224 (FIGS. 22 and 23) that isn't protected by a capping structure 145, leaving spacer material 132 on the sides and top of the gates 106 (e.g., on the sides and top of the hardmask 116 and the gate metal 110). FIG. 25 is a view of the assembly 226 taken along the section D-D of FIG. 24, through the region between adjacent gates 106 (while FIG. 24 illustrates the assembly 226 taken along the section A-A of FIG. 25, through a trench 104). The etching of the spacer material 132 may be an anisotropic etch, etching the spacer material 132 "downward" to remove the spacer material 132 in some of the area between the gates 106 (as illustrated in FIGS. 24 and 25), while leaving the spacer material 135 on the sides and tops of the gates 106. In some embodiments, the anisotropic etch may be a dry etch. FIGS. 26-35 maintain the cross-sectional perspective of FIG. 24.

Figure 26:
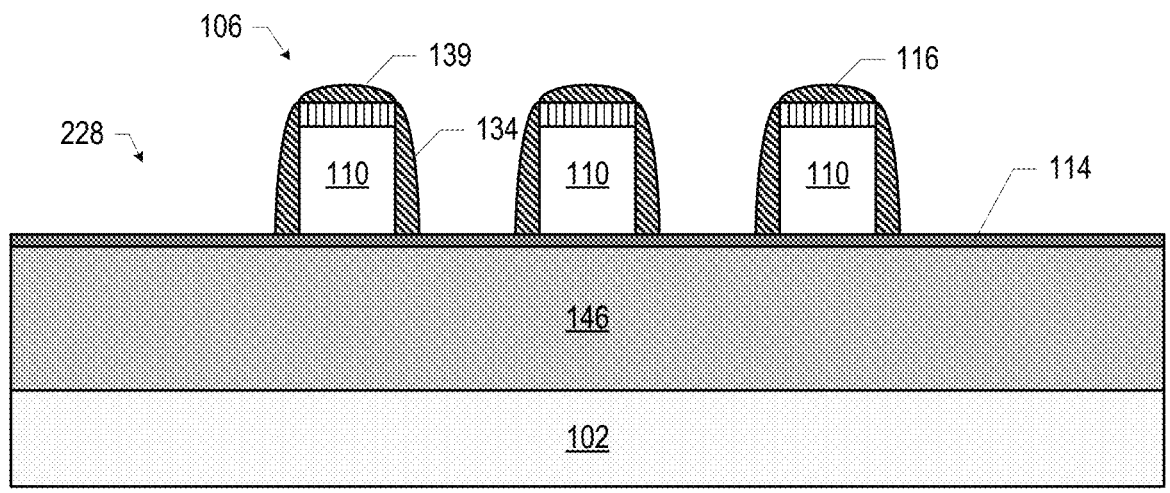

FIG. 26 is a cross-sectional view of an assembly 228 subsequent to removing the capping structures 145 from the assembly 226 (FIGS. 24 and 25). The capping structures 145 may be removed using any suitable technique (e.g., a wet etch). The spacer material 132 that remains in the assembly 228 may include spacers 134 disposed on the sides of the gates 106, and portions 139 disposed on the top of the gates 106.

Figure 27:
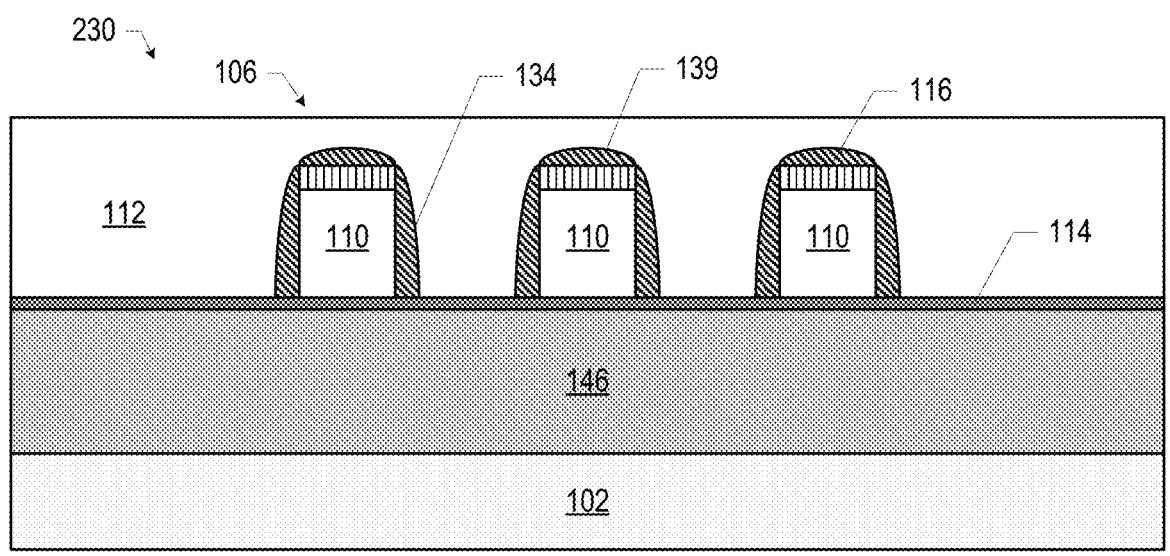

FIG. 27 is a cross-sectional view of an assembly 230 subsequent to providing the gate metal 112 on the assembly 228 (FIG. 26). The gate metal 112 may fill the areas between adjacent ones of the gates 106, and may extend over the tops of the gates 106 and over the spacer material portions 139. The gate metal 112 of the assembly 230 may fill the trenches 104 (between the gates 106) and extend over the insulating material 128.

Figure 28:
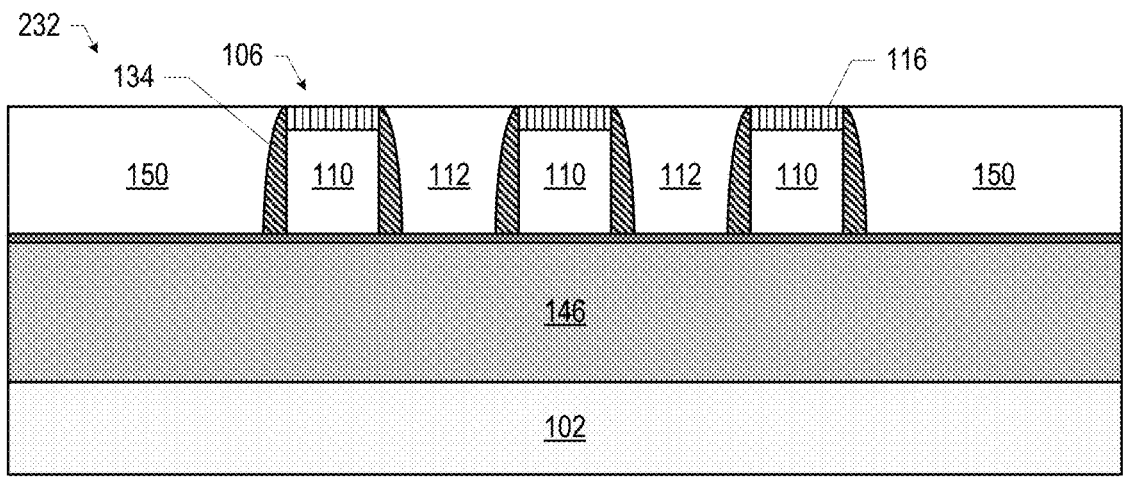

FIG. 28 is a cross-sectional view of an assembly 232 subsequent to planarizing the assembly 230 (FIG. 27) to remove the gate metal 112 above the gates 106, as well as to remove the spacer material portions 139 above the hardmask 116. In some embodiments, the assembly 230 may be planarized using a chemical mechanical polishing (CMP) technique. The planarizing of the assembly 230 may also remove some of the hardmask 116, in some embodiments. Some of the remaining gate metal 112 may fill the areas between adjacent ones of the gates 106, while other portions 150 of the remaining gate metal 112 may be located "outside" of the gates 106.

Figure 29:
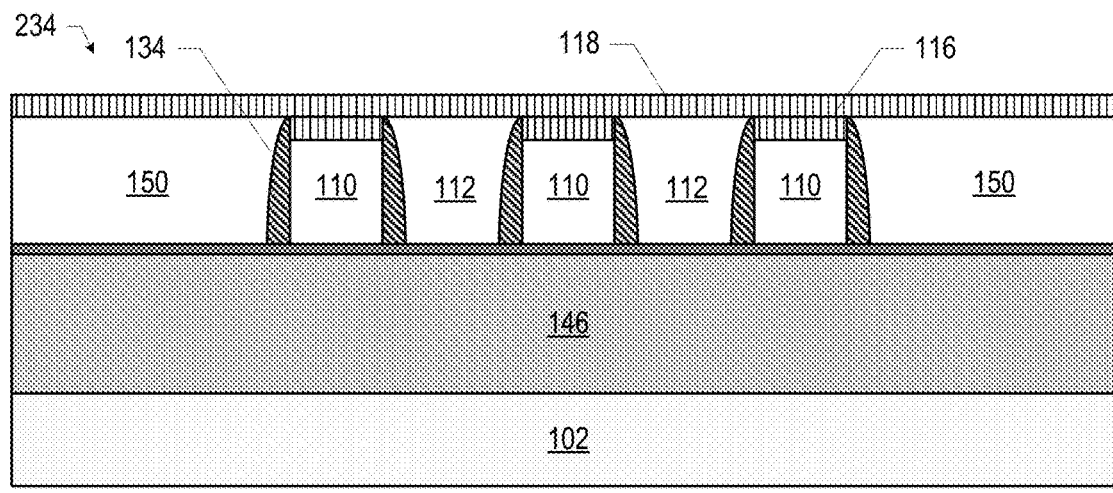

FIG. 29 is a cross-sectional view of an assembly 234 subsequent to providing a hardmask 118 on the planarized surface of the assembly 232 (FIG. 28). The hardmask 118 may be formed of any of the materials discussed above with reference to the hardmask 116, for example.

Figure 30:
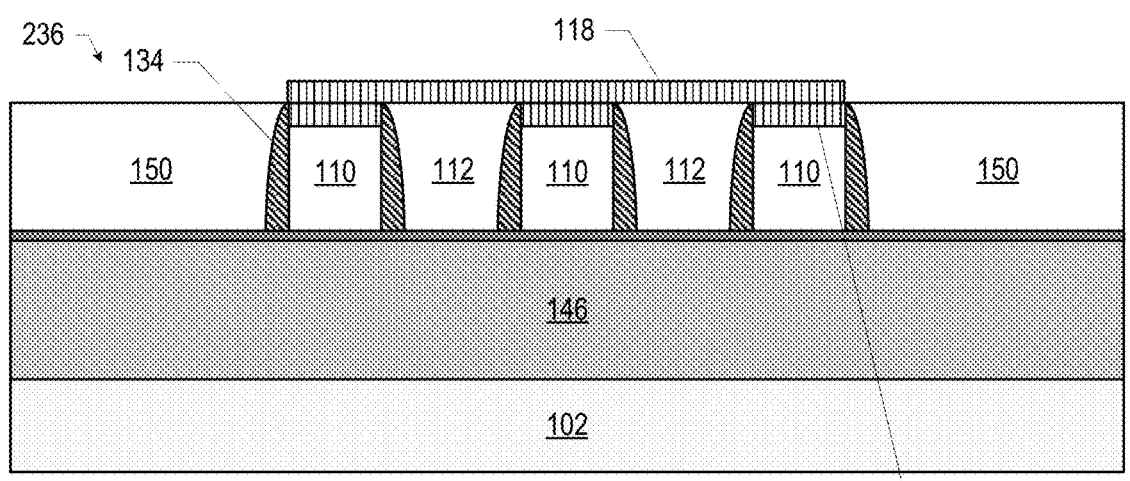

FIG. 30 is a cross-sectional view of an assembly 236 subsequent to patterning the hardmask 118 of the assembly 234 (FIG. 29). The pattern applied to the hardmask 118 may extend over the hardmask 116 (and over the gate metal 110 of the gates 106, as well as over the locations for the gates 108 (as illustrated in FIG. 2). The hardmask 118 may be non-coplanar with the hardmask 116, as illustrated in FIG. 30. The hardmask 118 illustrated in FIG. 30 may thus be a common, continuous portion of hardmask 118 that extends over all of the hardmask 116. The hardmask 118 may be patterned using any of the techniques discussed above with reference to the patterning of the hardmask 116, for example.

Figure 31:
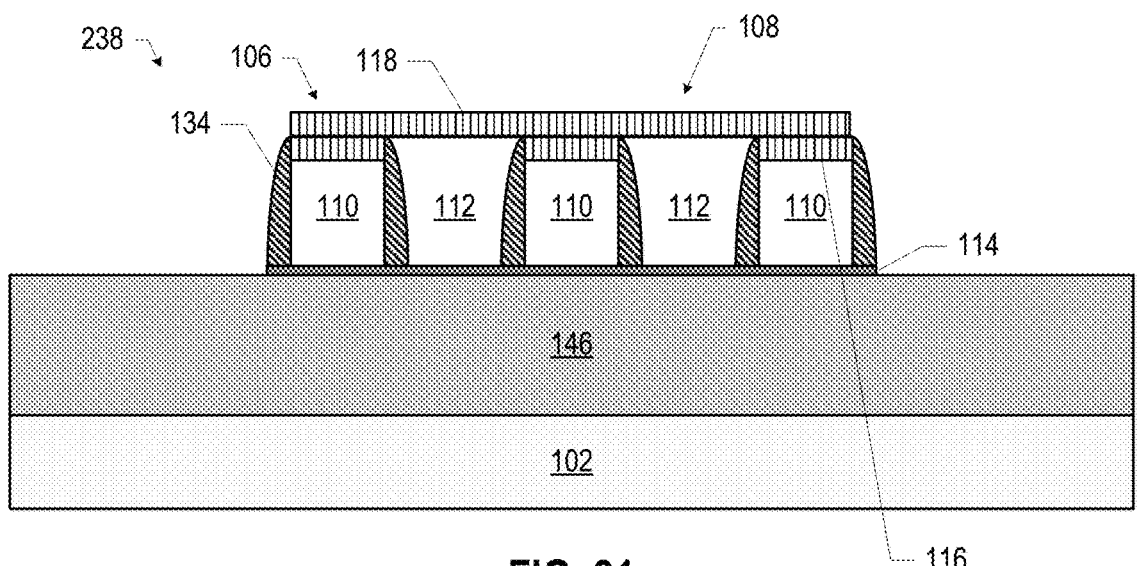

FIG. 31 is a cross-sectional view of an assembly 238 subsequent to etching the assembly 236 (FIG. 30) to remove the portions 150 that are not protected by the patterned hardmask 118 to form the gates 108. Portions of the hardmask 118 may remain on top of the hardmask 116, as shown. The operations performed on the assembly 236 may include removing any gate dielectric 114 that is "exposed" on the quantum well stack 146, as shown. The excess gate dielectric 114 may be removed using any suitable technique, such as chemical etching or silicon bombardment. In some embodiments, the patterned hardmask 118 may extend "laterally" beyond the gates 106 to cover gate metal 112 that it located "outside" the gates 106. In such embodiments, those portions of gate metal 112 may remain in the assembly 238 and may provide the outermost gates (i.e., those gates 108 may bookend the other gates 106/108). The exposed gate metal 112 at the sides of those outer gates 108 may be insulated by additional spacers 134, formed using any of the techniques discussed herein. Such outer gates 108 may be included in any of the embodiments disclosed herein.

Figure 32:
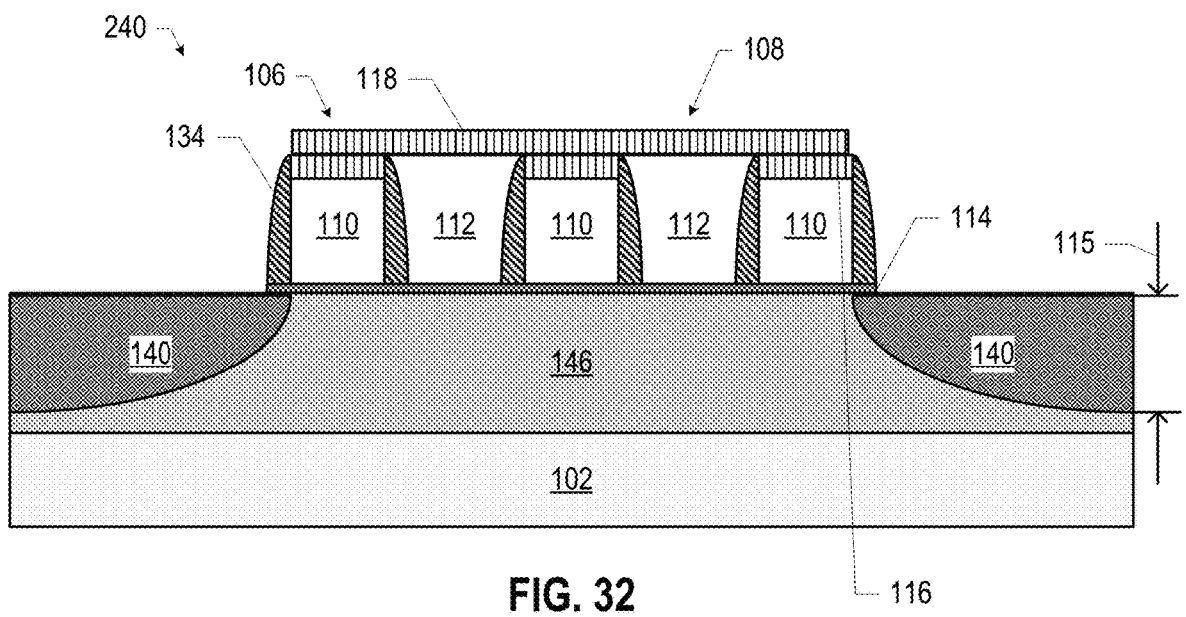

FIG. 32 is a cross-sectional view of an assembly 240 subsequent to doping the quantum well stack 146 of the assembly 238 (FIG. 31) to form doped regions 140 in the portions of the quantum well stack 146 "outside" of the gates 106/108. The type of dopant used to form the doped regions 140 may depend on the type of quantum dot desired, as discussed above. In some embodiments, the doping may be performed by ion implantation. For example, when the quantum dot 142 is to be an electron-type quantum dot 142, the doped regions 140 may be formed by ion implantation of phosphorous, arsenic, or another n-type material. When the quantum dot 142 is to be a hole-type quantum dot 142, the doped regions 140 may be formed by ion implantation of boron or another p-type material. An annealing process that activates the dopants and causes them to diffuse farther into the quantum well stack 146 may follow the ion implantation process. The depth of the doped regions 140 may take any suitable value; for example, in some embodiments, the doped regions 140 may extend into the quantum well stack 146 to a depth 115 between 500 and 1000 Angstroms.

The outer spacers 134 on the outer gates 106 may provide a doping boundary, limiting diffusion of the dopant from the doped regions 140 into the area under the gates 106/108. As shown, the doped regions 140 may extend under the adjacent outer spacers 134. In some embodiments, the doped regions 140 may extend past the outer spacers 134 and under the gate metal 110 of the outer gates 106, may extend only to the boundary between the outer spacers 134 and the adjacent gate metal 110, or may terminate under the outer spacers 134 and not reach the boundary between the outer spacers 134 and the adjacent gate metal 110. Examples of such embodiments are discussed below with reference to FIGS. 53 and 54. The doping concentration of the doped regions 140 may, in some embodiments, be between $10^{17}/cm^3$ and $10^{20}/cm^3$.

Figure 33:
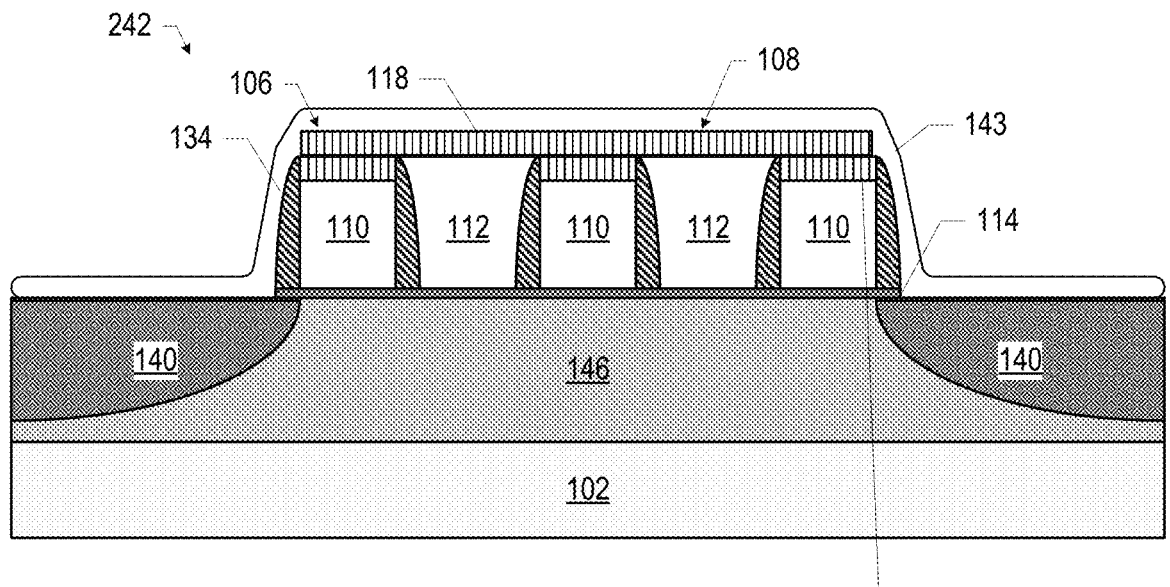

FIG. 33 is a cross-sectional side view of an assembly 242 subsequent to providing a layer of nickel or other material 143 over the assembly 240 (FIG. 32). The nickel or other material 143 may be deposited on the assembly 240 using any suitable technique (e.g., a plating technique, chemical vapor deposition, or atomic layer deposition).

Figure 34:
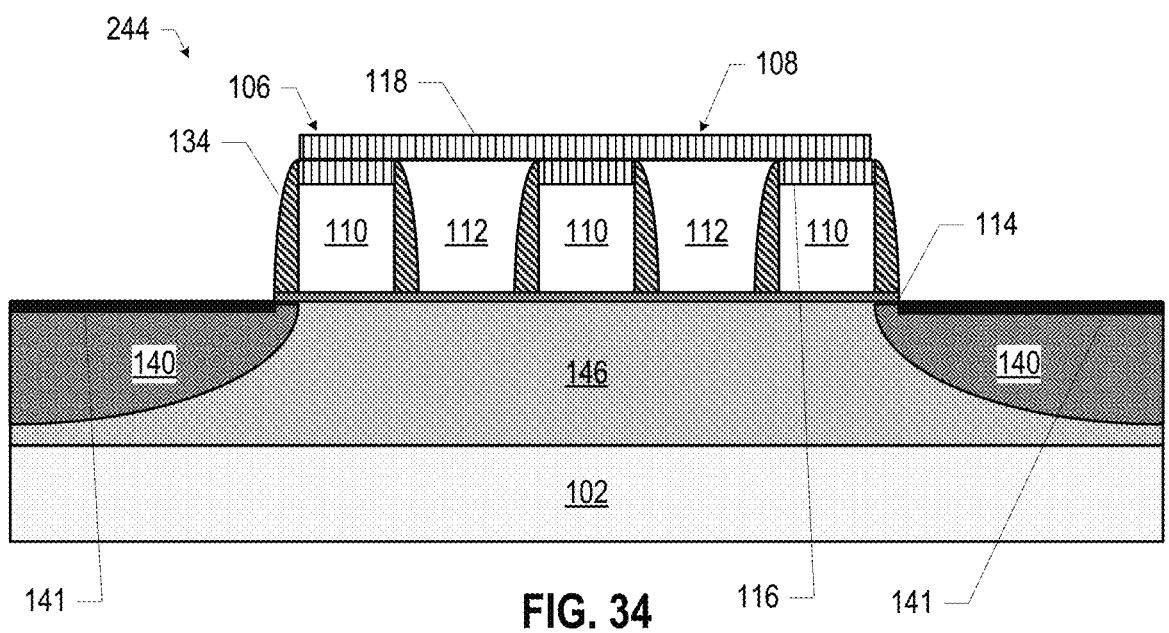

FIG. 34 is a cross-sectional side view of an assembly 244 subsequent to annealing the assembly 242 (FIG. 33) to cause the material 143 to interact with the doped regions 140 to form the interface material 141, then removing the unreacted material 143. When the doped regions 140 include silicon and the material 143 includes nickel, for example, the interface material 141 may be nickel silicide. Materials other than nickel may be deposited in the operations discussed above with reference to FIG. 33 in order to form other interface materials 141, including titanium, aluminum, molybdenum, cobalt, tungsten, or platinum, for example. More generally, the interface material 141 of the assembly 244 may include any of the materials discussed herein with reference to the interface material 141.

Figure 35:
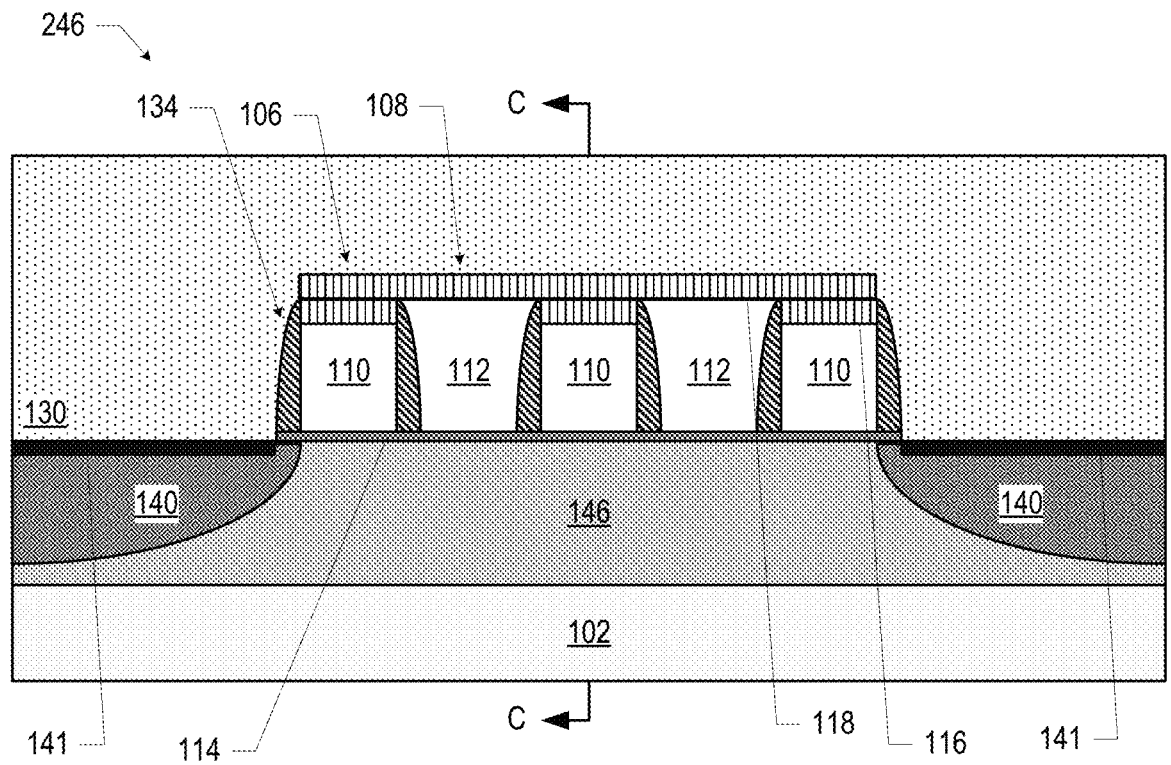
Figure 36:
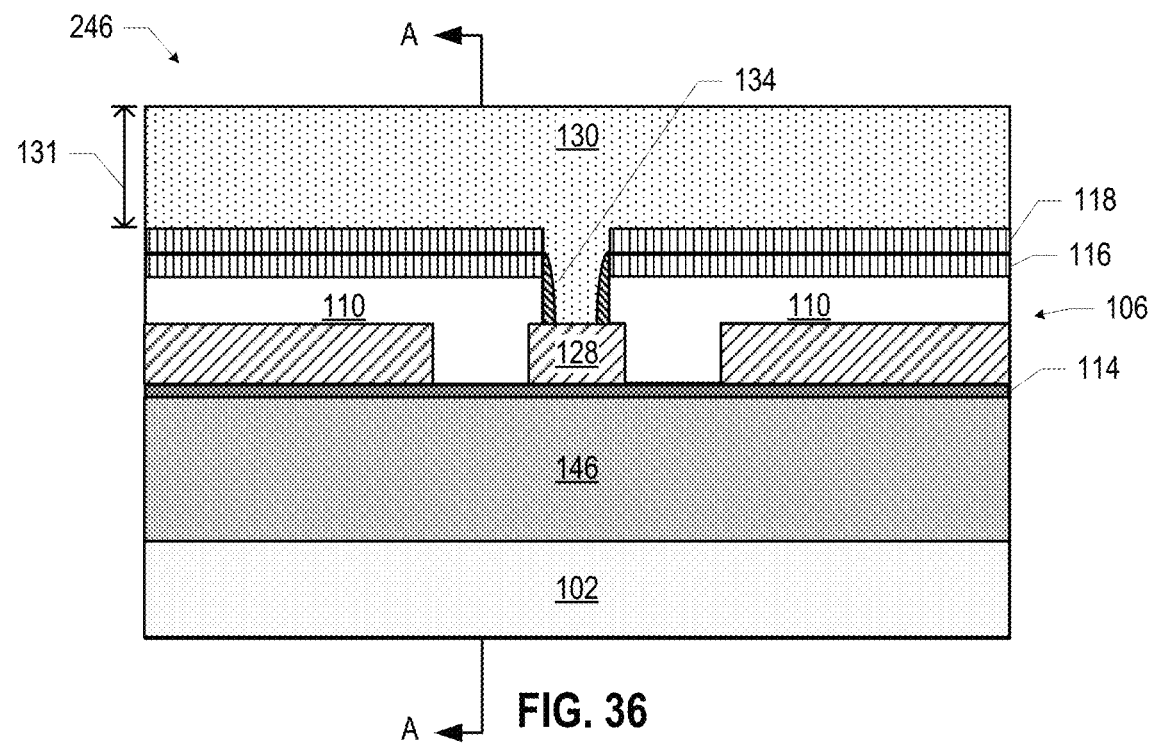

FIG. 35 is a cross-sectional view of an assembly 246 subsequent to providing an insulating material 130 on the assembly 244 (FIG. 34). FIG. 36 is another cross-sectional view of the assembly 246, taken along the section C-C of FIG. 35 (while the cross-sectional view of FIG. 35 is taken along the section A-A of FIG. 36). The insulating material 130 may take any of the forms discussed above. For example, the insulating material 130 may be a dielectric material, such as silicon oxide. The insulating material 130 may be provided on the assembly 244 using any suitable technique, such as spin coating, chemical vapor deposition (CVD), or plasma-enhanced CVD (PECVD). In some embodiments, the insulating material 130 may be polished back after deposition, and before further processing. In some embodiments, the thickness 131 of the insulating material 130 in the assembly 246 (as measured from the hardmask 118, as indicated in FIG. 35) may be between 50 nanometers and 1.2 microns (e.g., between 50 nanometers and 300 nanometers). In some embodiments, a nitride etch stop layer (NESL) may be provided on the assembly 244 (e.g., above the interface material 141) before providing the insulating material 130.

Figure 37:
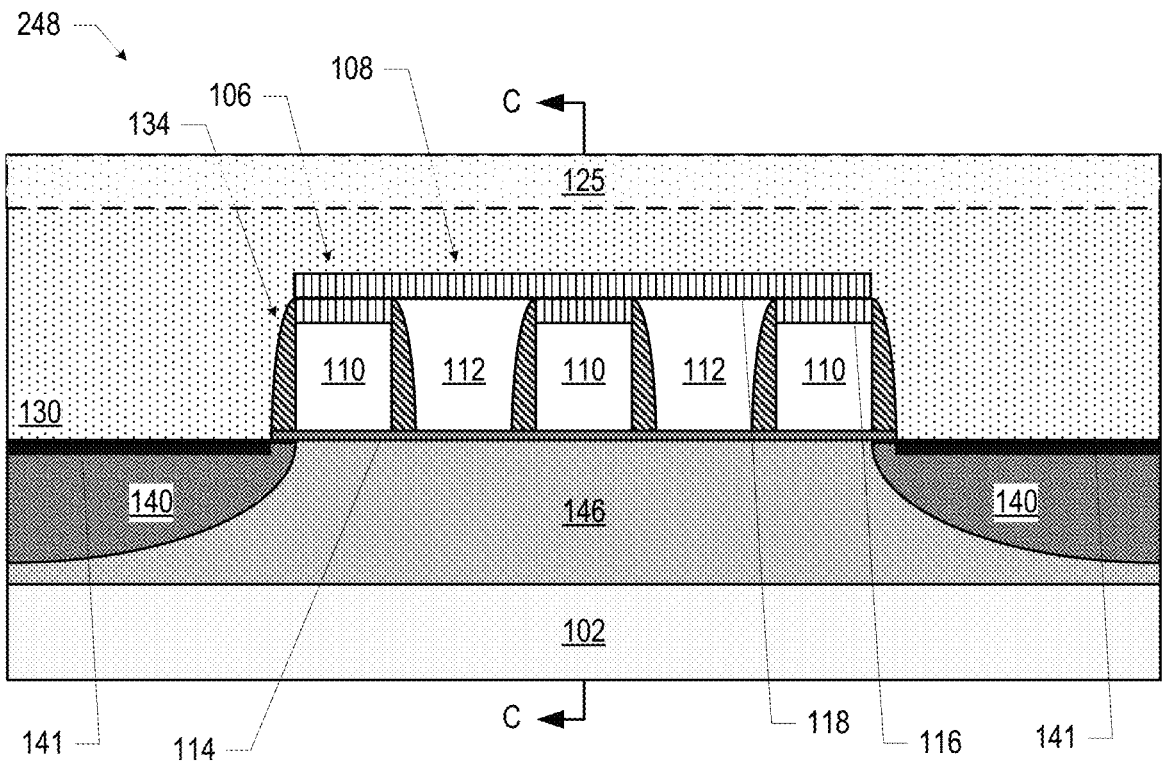
Figure 38:
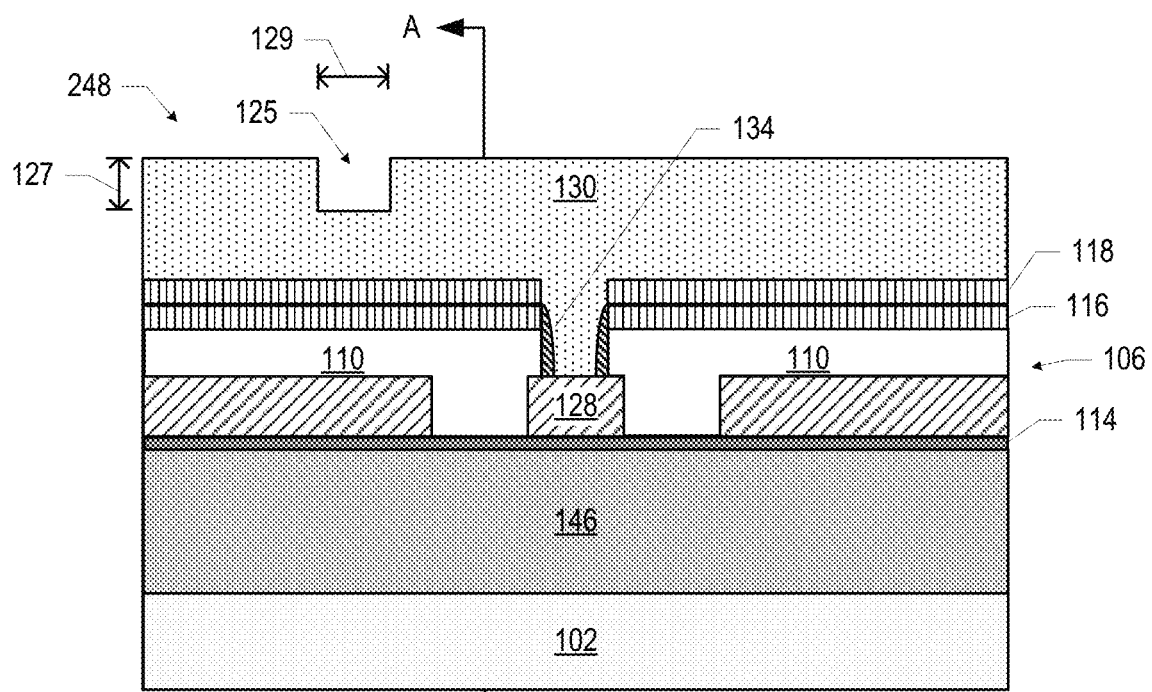

FIG. 37 is a cross-sectional view of an assembly 248 subsequent to forming a trench 125 in the insulating material 130 of the assembly 246 (FIGS. 35 and 36). The trench 125 may be formed using any desired techniques (e.g., resist patterning followed by etching), and may have a depth 127 and a width 129 that may take the form of any of the embodiments of the thickness 169 and the width 171, respectively, discussed above with reference to the magnet line 121. FIG. 38 is another cross-sectional view of the assembly 248, taken along the section C-C of FIG. 37 (while the cross-sectional view of FIG. 37 is taken along the section A-A of FIG. 38). In some embodiments, the assembly 246 may be planarized to remove the hardmasks 116 and 118, then additional insulating material 130 may be provided on the planarized surface before forming the trench 125; in such an embodiment, the hardmasks 116 and 118 would not be present in the quantum dot device 100.

Figure 39:
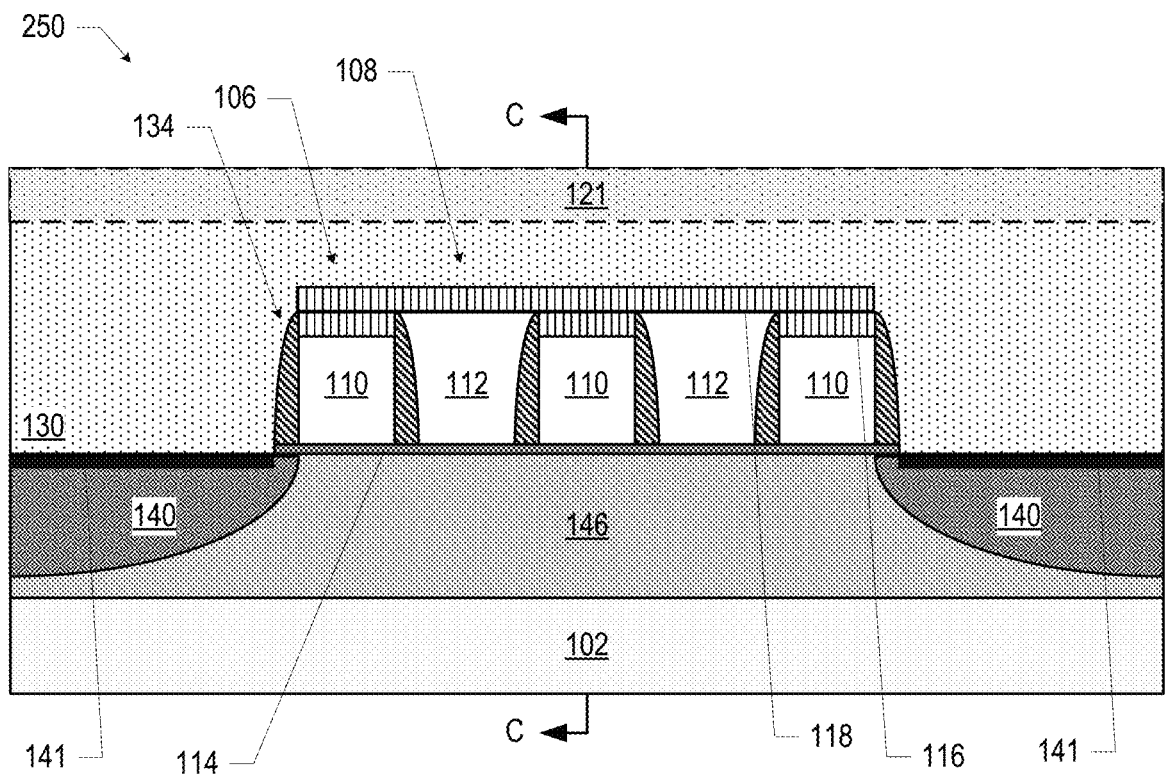
Figure 40:
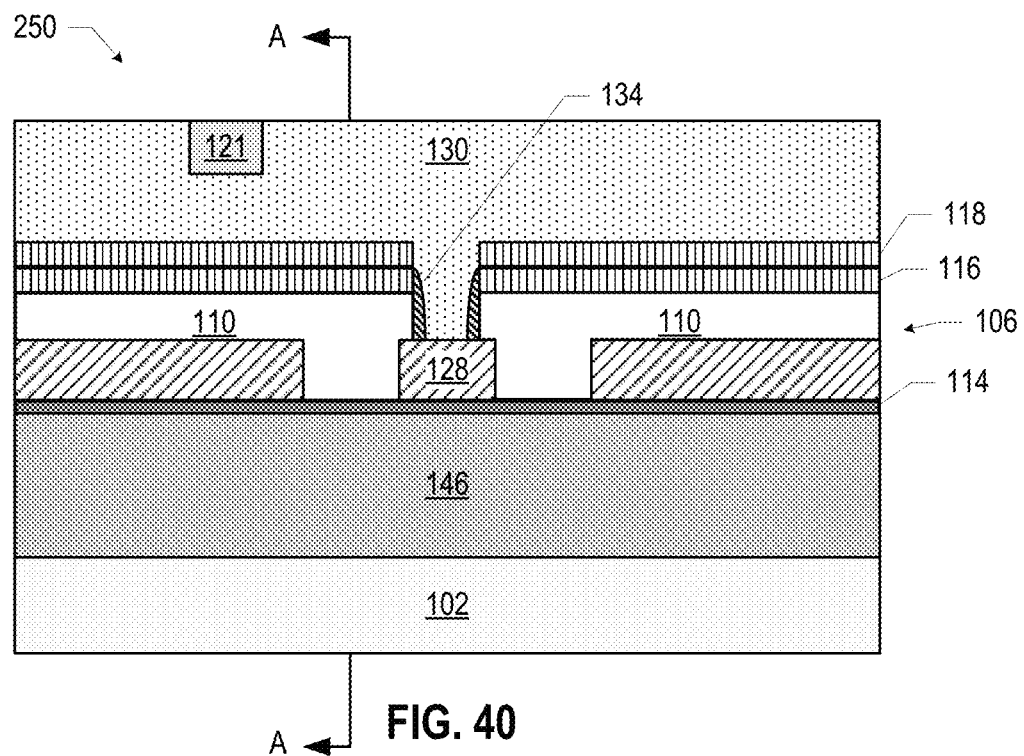

FIG. 39 is a cross-sectional view of an assembly 250 subsequent to filling the trench 125 of the assembly 248 (FIGS. 37 and 38) with a material to form the magnet line 121. The magnet line 121 may be formed using any desired techniques (e.g., plating followed by planarization, or a semi-additive process), and may take the form of any of the embodiments disclosed herein. FIG. 40 is another cross-sectional view of the assembly 250, taken along the section C-C of FIG. 39 (while the cross-sectional view of FIG. 39 is taken along the section A-A of FIG. 40).

Figure 41:
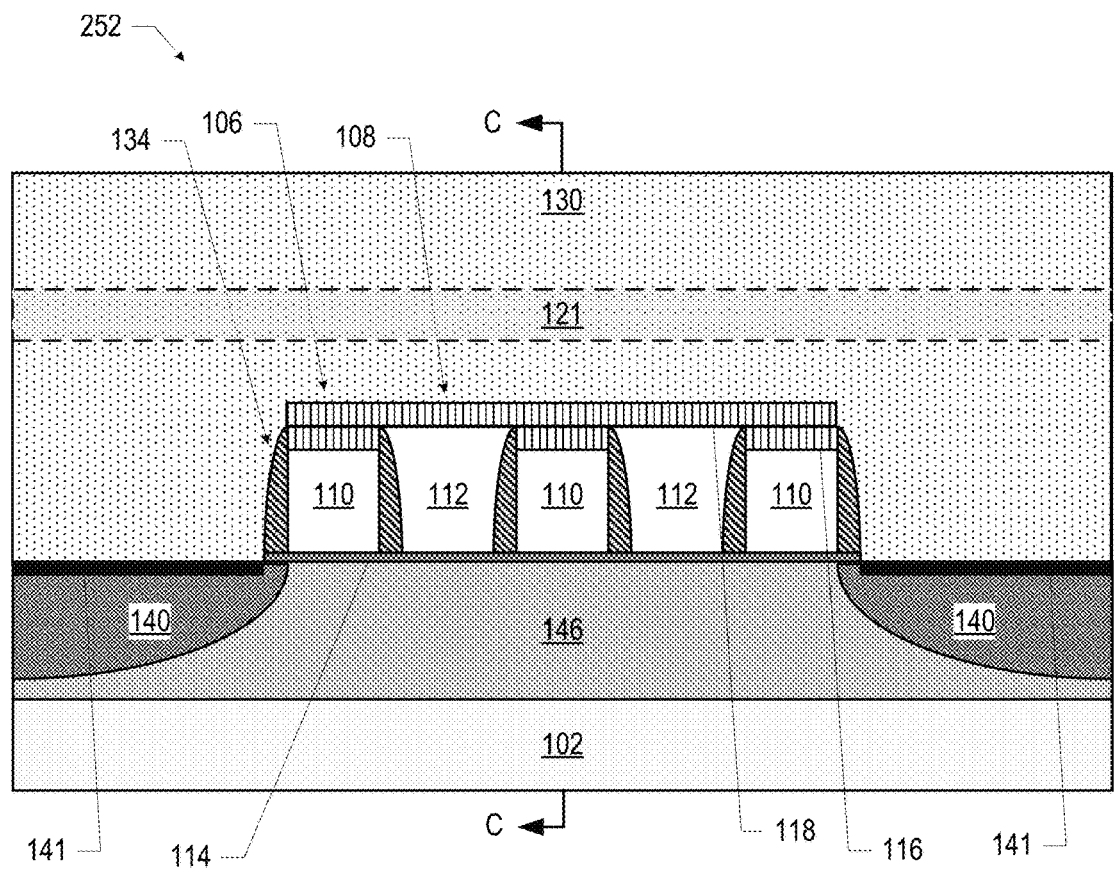
Figure 42:
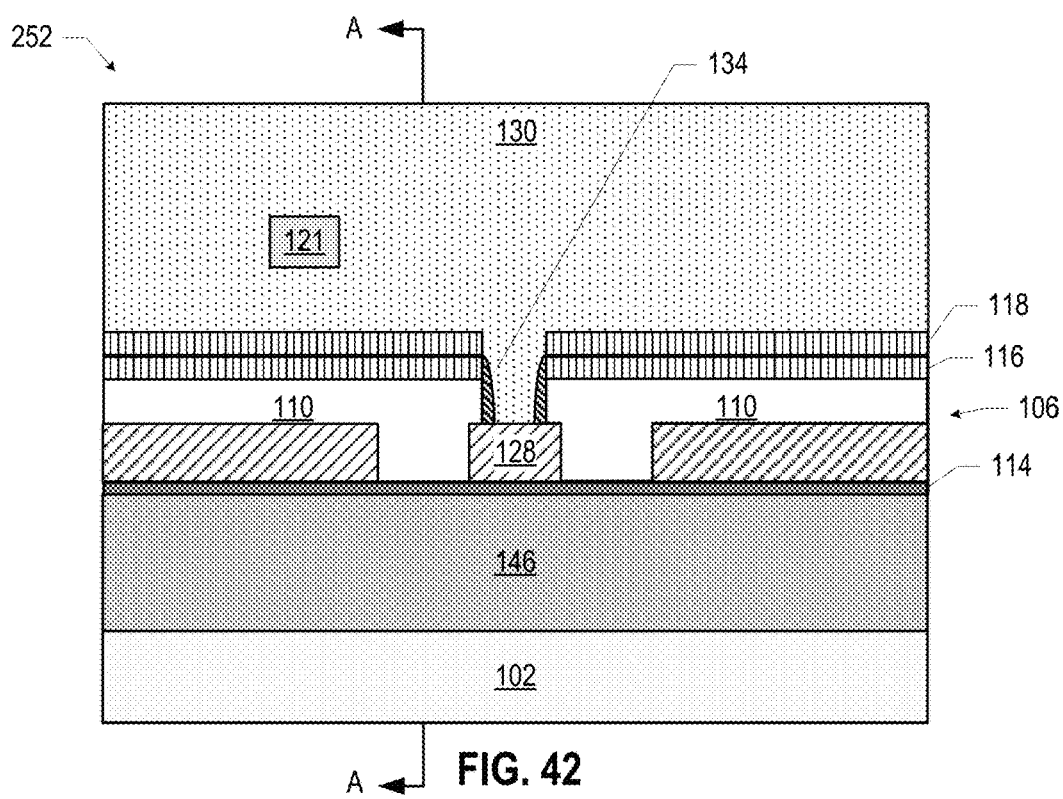

FIG. 41 is a cross-sectional view of an assembly 252 subsequent to providing additional insulating material 130 on the assembly 250 (FIGS. 39 and 40). The insulating material 130 provided on the assembly 250 may take any of the forms of the insulating material 130 discussed above. FIG. 42 is another cross-sectional view of the assembly 252, taken along the section C-C of FIG. 41 (while the cross-sectional view of FIG. 41 is taken along the section A-A of FIG. 42).

Figure 43:
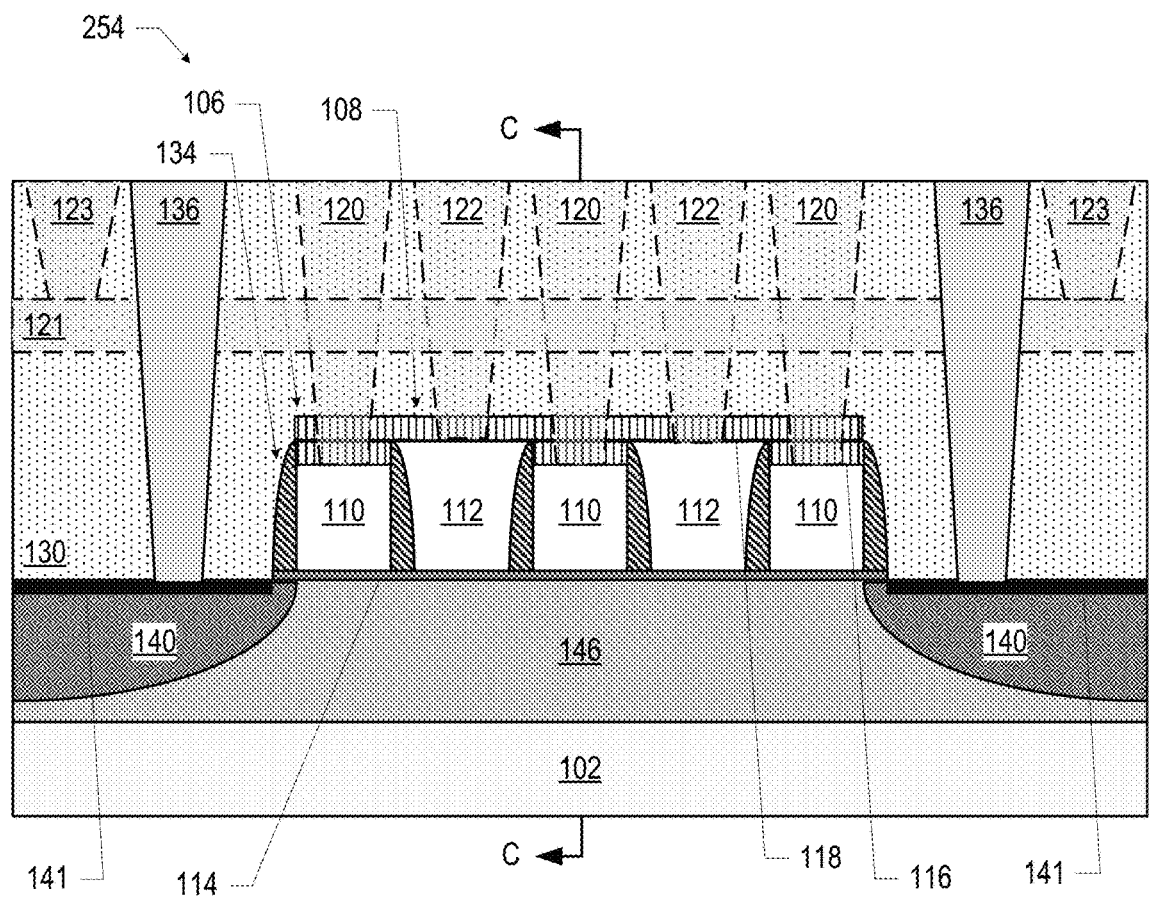
Figure 44:
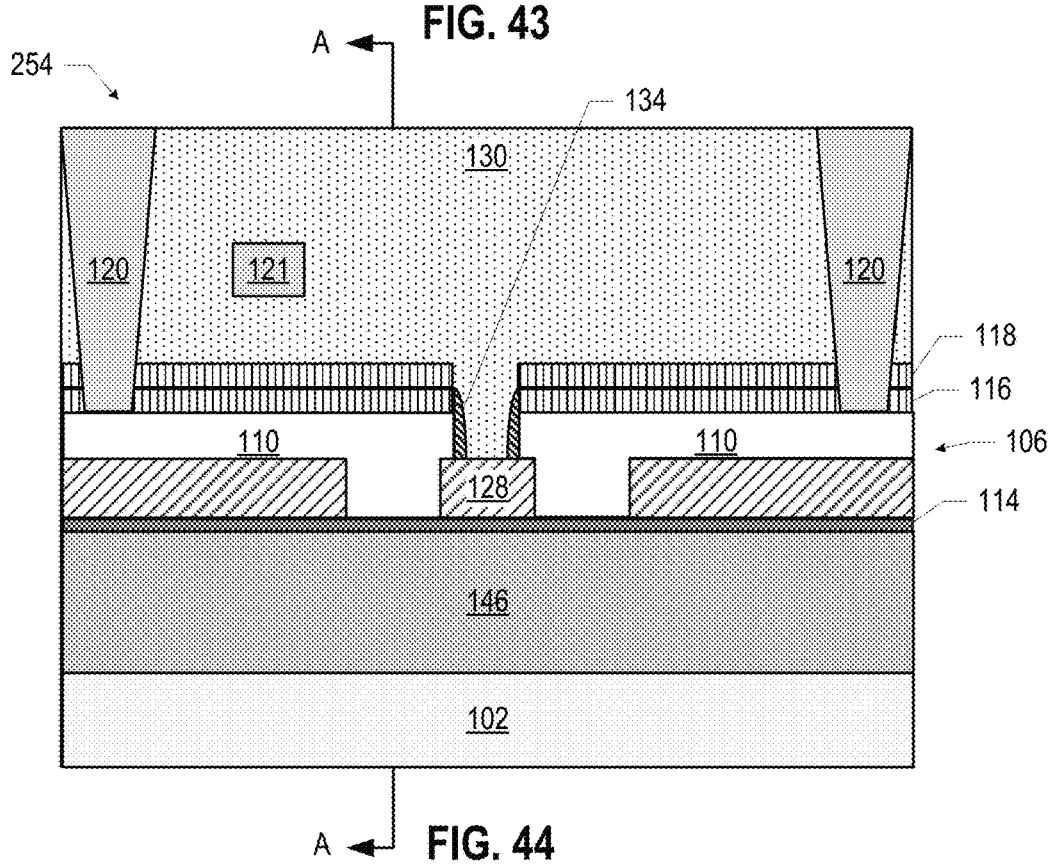

FIG. 43 is a cross-sectional view of an assembly 254 subsequent to forming, in the assembly 252 (FIGS. 41 and 42), conductive vias 120 through the insulating material 130 (and the hardmasks 116 and 118) to contact the gate metal 110 of the gates 106, conductive vias 122 through the insulating material 130 (and the hardmask 118) to contact the gate metal 112 of the gates 108, conductive vias 136 through the insulating material 130 to contact the interface material 141 of the doped regions 140, and conductive vias 123 through the insulating material 130 to contact the magnet line 121. Further conductive vias and/or lines may be formed in the assembly 254 using conventional interconnect techniques, if desired. The resulting assembly 254 may take the form of the quantum dot device 100 discussed above with reference to FIGS. 1-4. FIG. 44 is another cross-sectional view of the assembly 254, taken along the section C-C of FIG. 43 (while the cross-sectional view of FIG. 43 is taken along the section A-A of FIG. 44).

Figure 45:
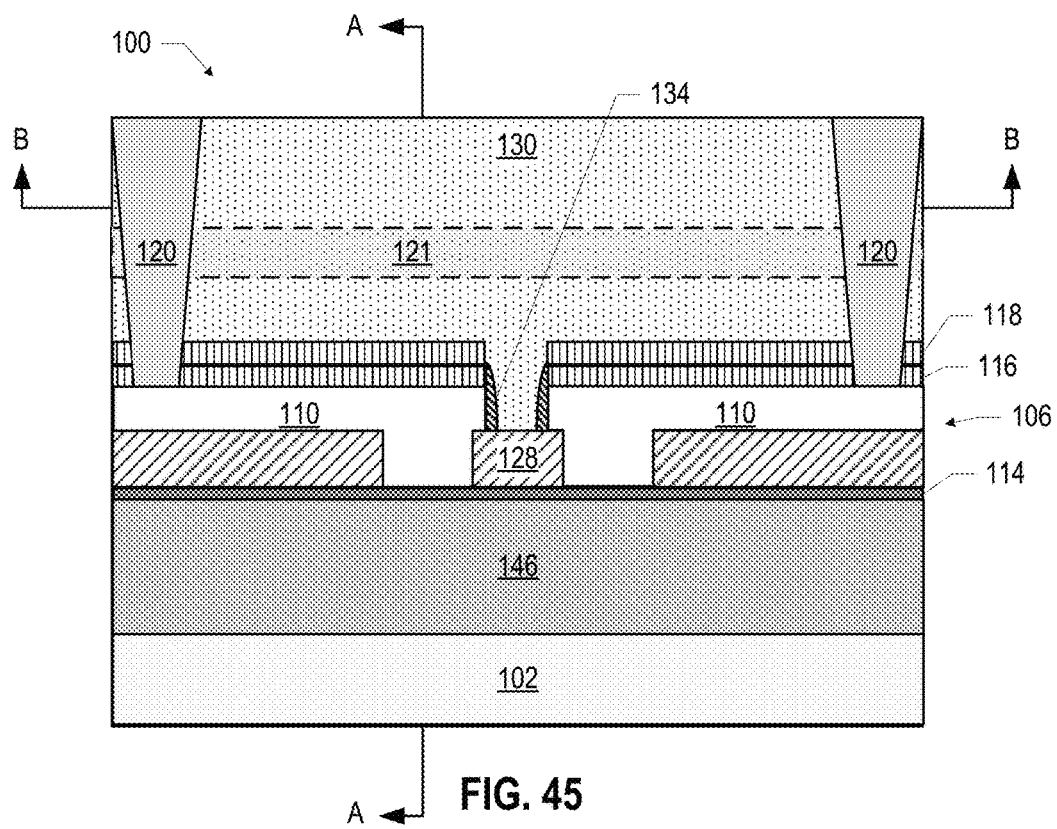
FIGS. 45-47 are cross-sectional views of another quantum dot device, in accordance with various embodiments.
Figure 46:
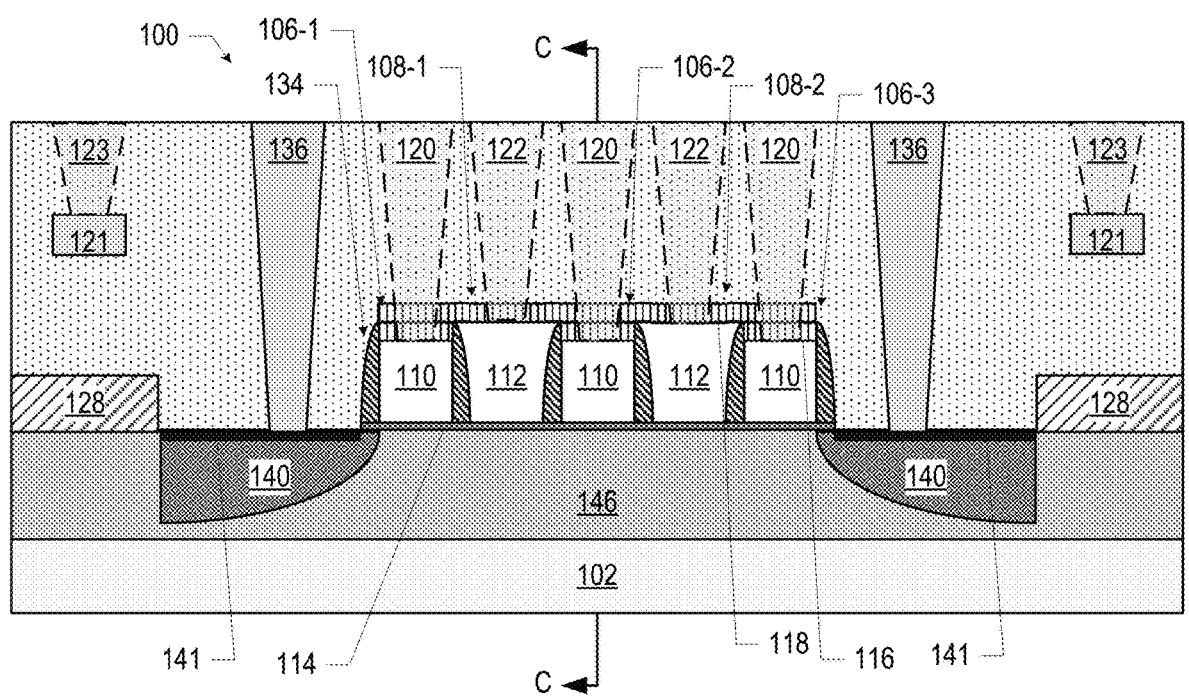
Figure 47:
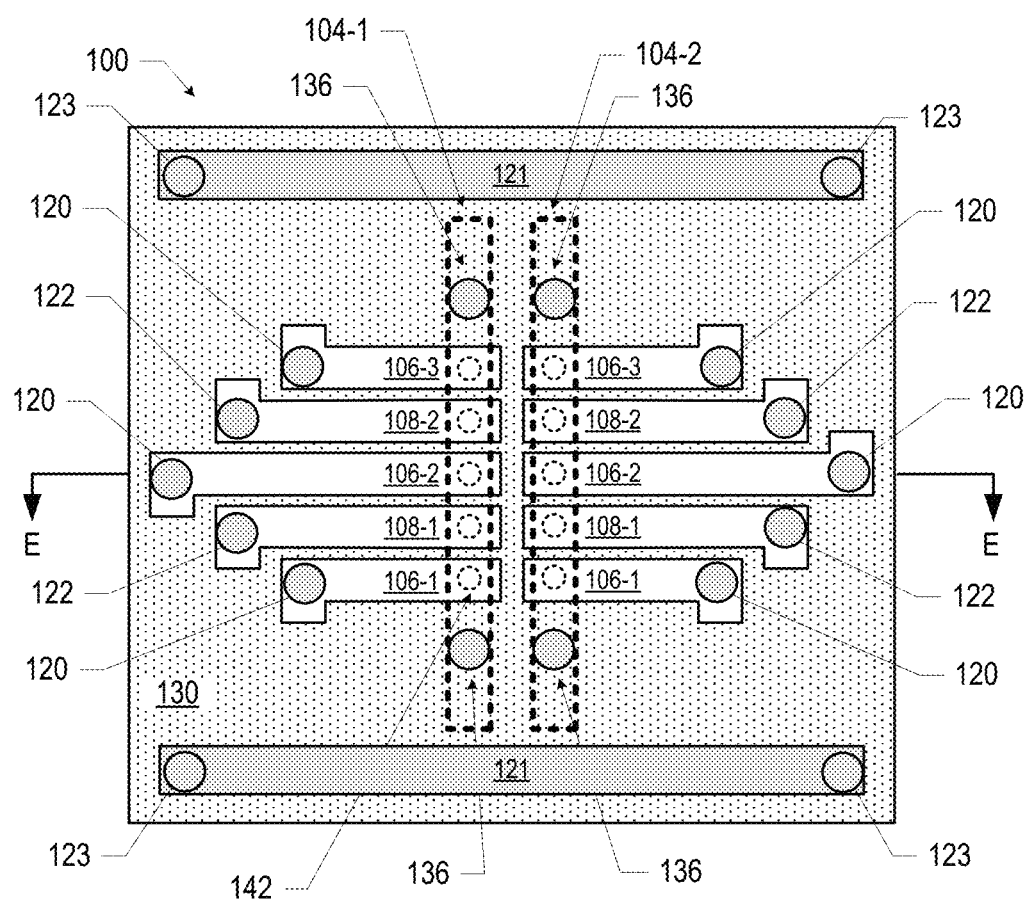

In the embodiment of the quantum dot device 100 illustrated in FIGS. 1-4, the magnet line 121 is oriented parallel to the longitudinal axes of the trenches 104. In other embodiments, the magnet line 121 may not be oriented parallel to the longitudinal axes of the trenches 104. For example, FIGS. 45-47 are various cross-sectional views of an embodiment of a quantum dot device 100 having multiple magnet lines 121, each proximate to the trenches 104 and oriented perpendicular to the longitudinal axes of the trenches 104. Other than orientation, the magnet lines 121 of the embodiment of FIGS. 45-47 may take the form of any of the embodiments of the magnet line 121 discussed above. The other elements of the quantum dot devices 100 of FIGS. 45-47 may take the form of any of those elements discussed herein. The manufacturing operations discussed above with reference to FIGS. 5-44 may be used to manufacture the quantum dot device 100 of FIGS. 45-47.

Although a single magnet line 121 is illustrated in FIGS. 1-4, multiple magnet lines 121 may be included in that embodiment of the quantum dot device 100 (e.g., multiple magnet lines 121 parallel to the longitudinal axes of the trenches 104). For example, the quantum dot device 100 of FIGS. 1-4 may include a second magnet line 121 proximate to the trench 104-2 in a symmetric manner to the magnet line 121 illustrated proximate to the trench 104-1. In some embodiments, multiple magnet lines 121 may be included in a quantum dot device 100, and these magnet lines 121 may or may not be parallel to one another. For example, in some embodiments, a quantum dot device 100 may include two (or more) magnet lines 121 that are oriented perpendicular to each other.

Figure 48:
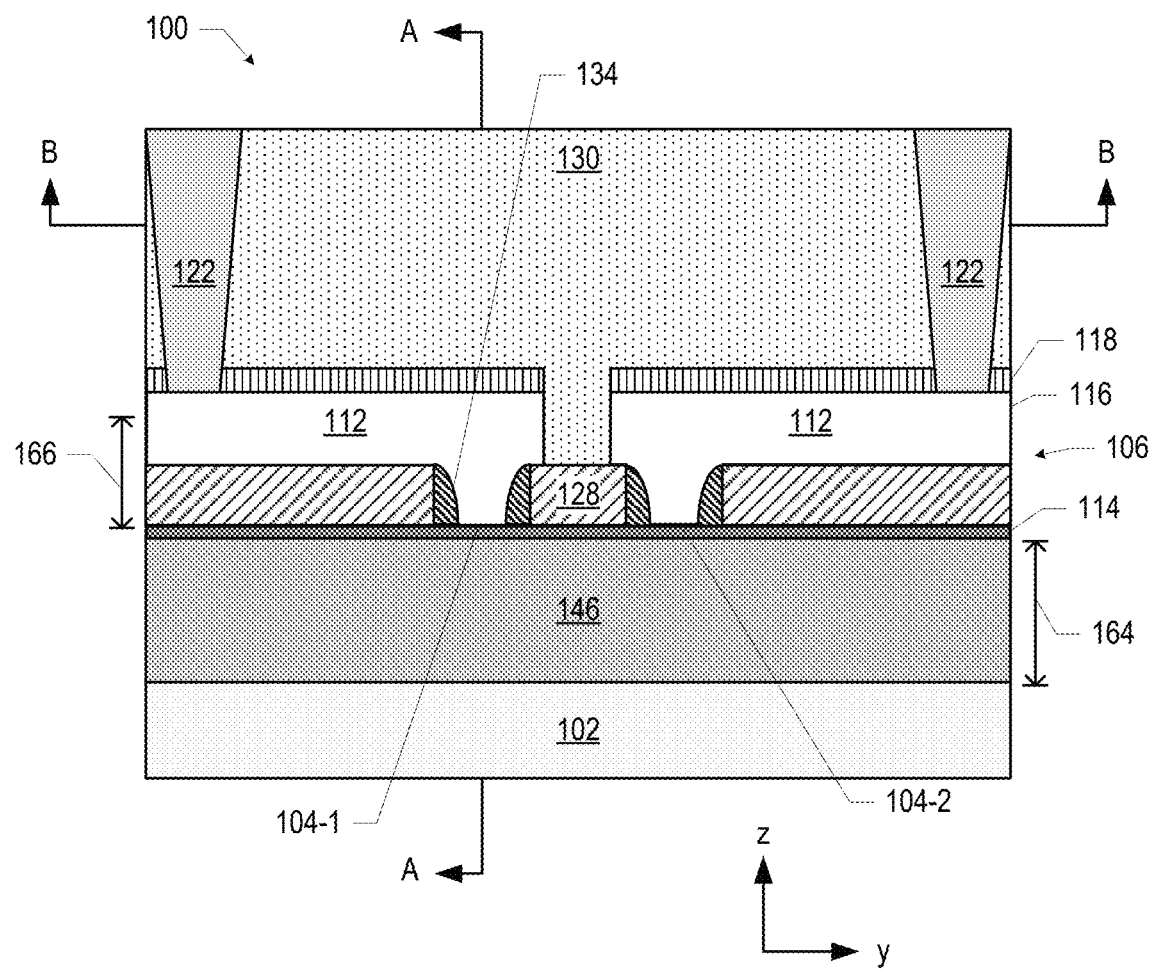
FIG. 48 is a cross-sectional view of an example quantum dot device, in accordance with various embodiments.
Figure 49:
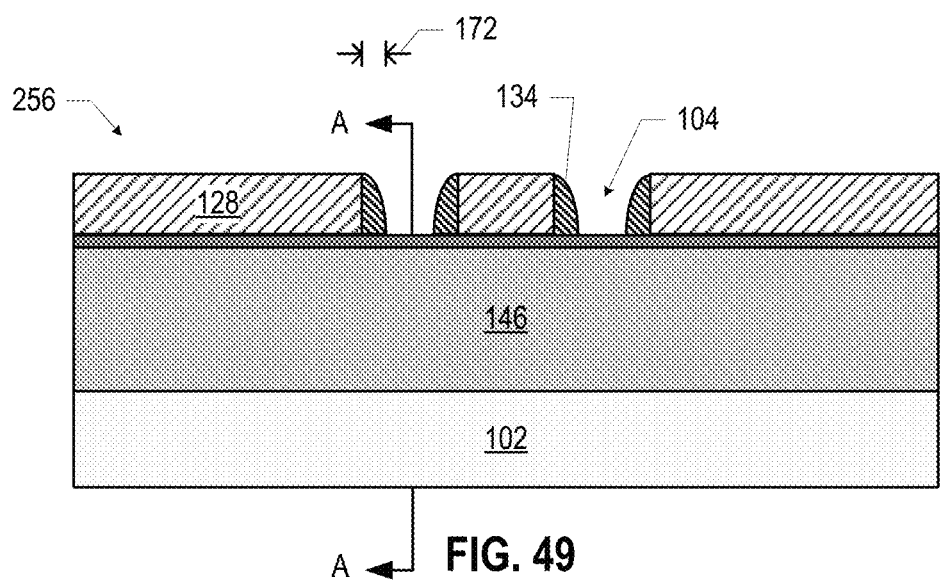
FIG. 49 is a cross-sectional view of an alternative example stage in the manufacture of the quantum dot device of FIG. 48, in accordance with various embodiments.

As discussed above, in the embodiment illustrated in FIG. 3 (and FIGS. 5-44), there may not be any substantial spacer material between the gate metal 112 and the proximate sidewalls of the trench 104 in the y-direction. In other embodiments, spacers 134 may also be disposed between the gate metal 112 and the sidewalls of the trench 104 in the y-direction. A cross-sectional view of such an embodiment is shown in FIG. 48 (analogous to the cross-sectional view of FIG. 3). To manufacture such a quantum dot device 100, the operations discussed above with reference to FIGS. 16-25 may not be performed; instead, the spacer material 132 of the assembly 216 of FIGS. 14 and 15 may be anisotropically etched (as discussed with reference to FIGS. 24 and 25) to form the spacers 134 on the sides of the gates 106 and on the sidewalls of the trench 104. FIG. 49 is a cross-sectional view of an assembly 256 that may be formed by such a process (taking the place of the assembly 226 of FIG. 25); the view along the section A-A of the assembly 256 may be similar to FIG. 26, but may not include the spacer material portions 139. The assembly 256 may be further processed as discussed above with reference to FIGS. 27-44 (or other embodiments discussed herein) to form a quantum dot device 100.

As discussed above, the quantum well stack 146 may include a quantum well layer in which a 2 DEG may form during operation of the quantum dot device 100. The quantum well stack 146 may take any of a number of forms, several of which are illustrated in FIGS. 50-52. The various layers in the quantum well stacks 146 discussed below may be grown on the base 102 (e.g., using epitaxial processes).

Figure 50:
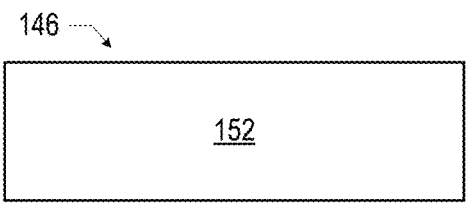
FIGS. 50-52 are cross-sectional views of various examples of quantum well stacks that may be used in a quantum dot device, in accordance with various embodiments.

FIG. 50 is a cross-sectional view of a quantum well stack 146 including only a quantum well layer 152. The quantum well layer 152 may be disposed on the base 102 (e.g., as discussed above with reference to FIG. 6), and may be formed of a material such that, during operation of the quantum dot device 100, a 2 DEG may form in the quantum well layer 152 proximate to the upper surface of the quantum well layer 152. The gate dielectric 114 of the gates 106/108 may be disposed on the upper surface of the quantum well layer 152 (e.g., as discussed above with reference to FIG. 7). In some embodiments, the quantum well layer 152 of FIG. 50 may be formed of intrinsic silicon, and the gate dielectric 114 may be formed of silicon oxide; in such an arrangement, during use of the quantum dot device 100, a 2 DEG may form in the intrinsic silicon at the interface between the intrinsic silicon and the silicon oxide. Embodiments in which the quantum well layer 152 of FIG. 50 is formed of intrinsic silicon may be particularly advantageous for electron-type quantum dot devices 100. In some embodiments, the quantum well layer 152 of FIG. 50 may be formed of intrinsic germanium, and the gate dielectric 114 may be formed of germanium oxide; in such an arrangement, during use of the quantum dot device 100, a 2 DEG may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 50 may take any suitable values. For example, in some embodiments, the thickness of the quantum well layer 152 (e.g., intrinsic silicon or germanium) may be between 0.8 and 1.2 microns.

Figure 51:
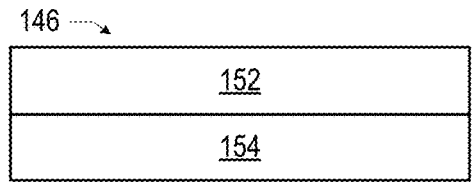

FIG. 51 is a cross-sectional view of a quantum well stack 146 including a quantum well layer 152 and a barrier layer 154. The quantum well stack 146 may be disposed on the base 102 (e.g., as discussed above with reference to FIG. 6) such that the barrier layer 154 is disposed between the quantum well layer 152 and the base 102. The barrier layer 154 may provide a potential barrier between the quantum well layer 152 and the base 102. As discussed above with reference to FIG. 50, the quantum well layer 152 of FIG. 51 may be formed of a material such that, during operation of the quantum dot device 100, a 2 DEG may form in the quantum well layer 152 proximate to the upper surface of the quantum well layer 152. For example, in some embodiments in which the base 102 is formed of silicon, the quantum well layer 152 of FIG. 51 may be formed of silicon, and the barrier layer 154 may be formed of silicon germanium. The germanium content of this silicon germanium may be 20-80% (e.g., 30%). In some embodiments in which the quantum well layer 152 is formed of germanium, the barrier layer 154 may be formed of silicon germanium (with a germanium content of 20-80% (e.g., 70%)). The thicknesses (i.e., z-heights) of the layers in the quantum well stack 146 of FIG. 51 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon or germanium) may be between 5 and 30 nanometers.

Figure 52:
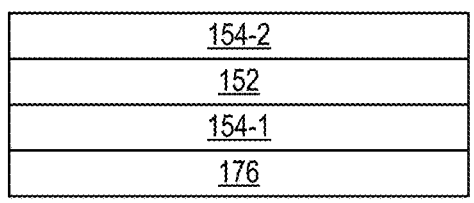

FIG. 52 is a cross-sectional view of a quantum well stack 146 including a quantum well layer 152 and a barrier layer 154-1, as well as a buffer layer 176 and an additional barrier layer 154-2. The quantum well stack 146 may be disposed on the base 102 (e.g., as discussed above with reference to FIG. 6) such that the buffer layer 176 is disposed between the barrier layer 154-1 and the base 102. The buffer layer 176 may be formed of the same material as the barrier layer 154, and may be present to trap defects that form in this material as it is grown on the base 102. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., 30%) at the barrier layer 154-1. The thicknesses (i.e., z-heights) of the layers in the quantum well stack 146 of FIG. 52 may take any suitable values. For example, in some embodiments, the thickness of the buffer layer 176 (e.g., silicon germanium) may be between 0.3 and 4 microns (e.g., 0.3-2 microns, or 0.5 microns). In some embodiments, the thickness of the barrier layer 154-1 (e.g., silicon germanium) may be between 0 and 400 nanometers. In some embodiments, the thickness of the quantum well layer 152 (e.g., silicon or germanium) may be between 5 and 30 nanometers (e.g., 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between 25 and 75 nanometers (e.g., 32 nanometers).

As discussed above with reference to FIG. 51, the quantum well layer 152 of FIG. 52 may be formed of a material such that, during operation of the quantum dot device 100, a 2 DEG may form in the quantum well layer 152 proximate to the upper surface of the quantum well layer 152. For example, in some embodiments in which the base 102 is formed of silicon, the quantum well layer 152 of FIG. 52 may be formed of silicon, and the barrier layer 154-1 and the buffer layer 176 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., 30%) at the barrier layer 154-1. In other embodiments, the buffer layer 176 may have a germanium content equal to the germanium content of the barrier layer 154-1 but may be thicker than the barrier layer 154-1 so as to absorb the defects that arise during growth.

In some embodiments, the quantum well layer 152 of FIG. 52 may be formed of germanium, and the buffer layer 176 and the barrier layer 154-1 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the base 102 to a nonzero percent (e.g., 70%) at the barrier layer 154-1. The barrier layer 154-1 may in turn have a germanium content equal to the nonzero percent. In other embodiments, the buffer layer 176 may have a germanium content equal to the germanium content of the barrier layer 154-1 but may be thicker than the barrier layer 154-1 so as to absorb the defects that arise during growth. In some embodiments of the quantum well stack 146 of FIG. 52, the buffer layer 176 and/or the barrier layer 154-2 may be omitted.

Figure 53:
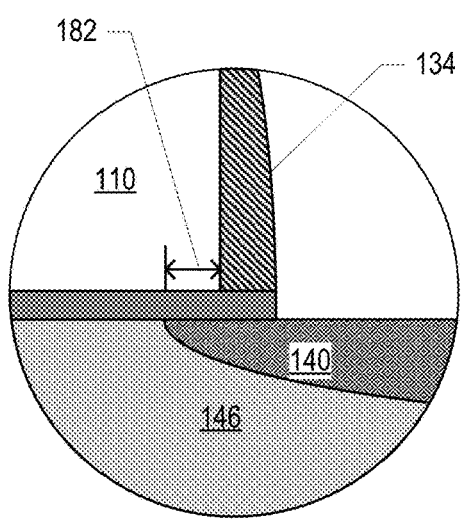
FIGS. 53-54 illustrate detail views of various embodiments of a doped region in a quantum dot device, in accordance with various embodiments.
Figure 54:
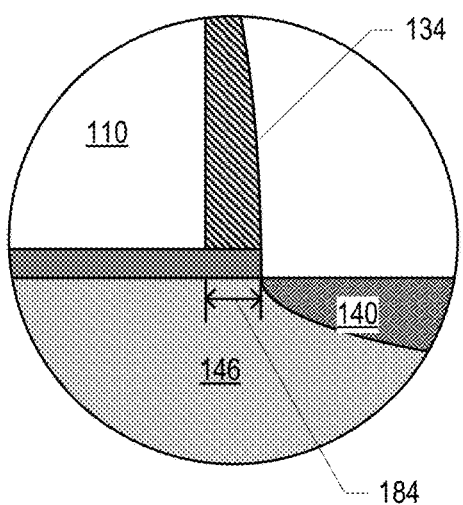

As discussed above with reference to FIGS. 2 and 32, the outer spacers 134 on the outer gates 106 may provide a doping boundary, limiting diffusion of the dopant from the doped regions 140 into the area under the gates 106/108. In some embodiments, the doped regions 140 may extend past the outer spacers 134 and under the outer gates 106. For example, as illustrated in FIG. 53, the doped region 140 may extend past the outer spacers 134 and under the outer gates 106 by a distance 182 between 0 and 10 nanometers. In some embodiments, the doped regions 140 may not extend past the outer spacers 134 toward the outer gates 106, but may instead "terminate" under the outer spacers 134. For example, as illustrated in FIG. 54, the doped regions 140 may be spaced away from the interface between the outer spacers 134 and the outer gates 106 by a distance 184 between 0 and 10 nanometers. The interface material 141 is omitted from FIGS. 53 and 54 for ease of illustration.

As noted above, a quantum dot device 100 may include multiple trenches 104 arranged in an array of any desired size. For example, FIG. 55A is a top cross-sectional view, like the view of FIG. 4, of a quantum dot device 100 having multiple trenches 104 arranged in a two-dimensional array. In the particular example illustrated in FIG. 55A, the trenches 104 may be arranged in pairs, each pair including an "active" trench 104 and a "read" trench 104, as discussed above. The particular number and arrangement of trenches 104 in FIG. 55A is simply illustrative, and any desired arrangement may be used.

Figure 55B:
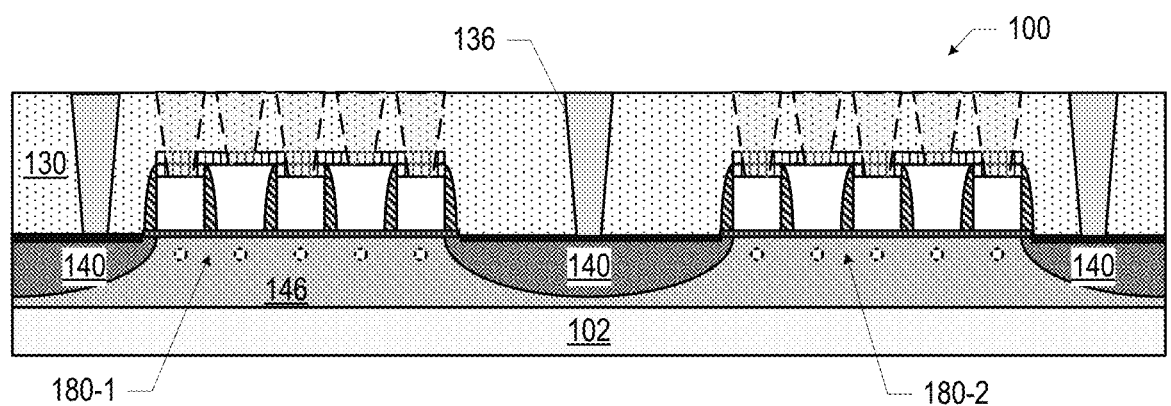
FIG. 55B illustrates an embodiment of a quantum dot device having multiple groups of gates in a single trench on a quantum well stack, in accordance with various embodiments.

As noted above, a single trench 104 may include multiple groups of gates 106/108, spaced apart along the trench by a doped region 140. FIG. 55B is a cross-sectional view of an example of such a quantum dot device 100 having multiple groups of gates 180 at least partially disposed in a single trench 104 above a quantum well stack 146, in accordance with various embodiments. Each of the groups 180 may include gates 106/108 (not labeled in FIG. 55B for ease of illustration) that may take the form of any of the embodiments of the gates 106/108 discussed herein. A doped region 140 (and its interface material 141) may be disposed between two adjacent groups 180 (labeled in FIG. 55B as groups 180-1 and 180-2), and may provide a common reservoir for both groups 180. In some embodiments, this "common" doped region 140 may be electrically contacted by a single conductive via 136. The particular number of gates 106/108 illustrated in FIG. 55B, and the particular number of groups 180, is simply illustrative, and a trench 104 may include any suitable number of gates 106/108 arranged in any suitable number of groups 180. The quantum dot device 100 of FIG. 55B may also include one or more magnet lines 121, arranged as desired.

As discussed above with reference to FIGS. 1-4, in some embodiments in which the gate dielectric 114 is not a layer shared commonly between the gates 108 and 106, but instead is separately deposited on the trench 104 between the spacers 134, the gate dielectric 114 may extend at least partially up the sides of the spacers 134, and the gate metal 112 may extend between the portions of gate dielectric 114 on the spacers 134. FIGS. 56-69 illustrate various alternative stages in the manufacture of such an embodiment of a quantum dot device 100, in accordance with various embodiments. In particular, the operations illustrated in FIGS. 56-69 (as discussed below) may take the place of the operations illustrated in FIGS. 13-27.

Figure 56:
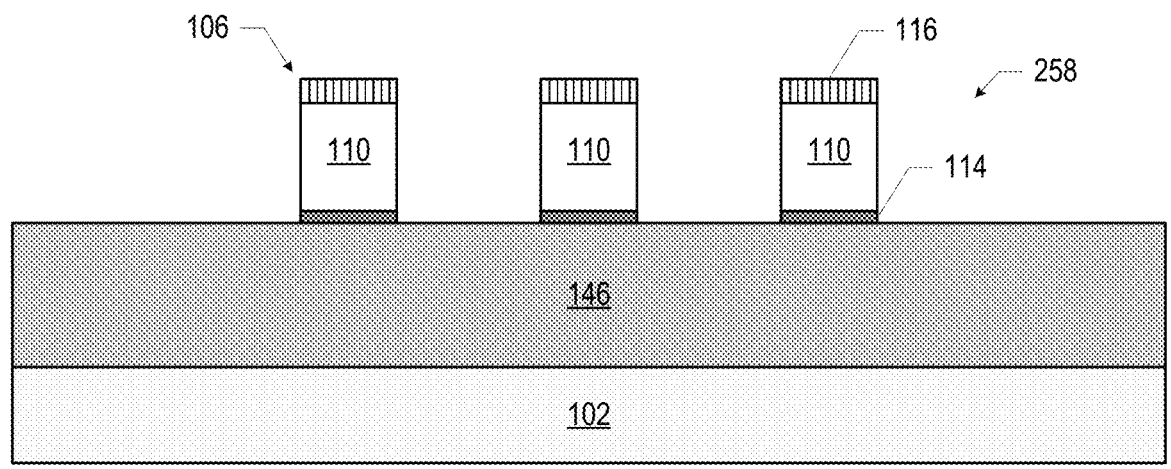
FIGS. 56-59 illustrate various alternative stages in the manufacture of a quantum dot device, in accordance with various embodiments.

FIG. 56 is a cross-sectional view of an assembly 258 subsequent to etching the assembly 212 (FIG. 12) to remove the gate metal 110, and the gate dielectric 114 that is not protected by the patterned hardmask 116, to form the gates 106.

Figure 57:
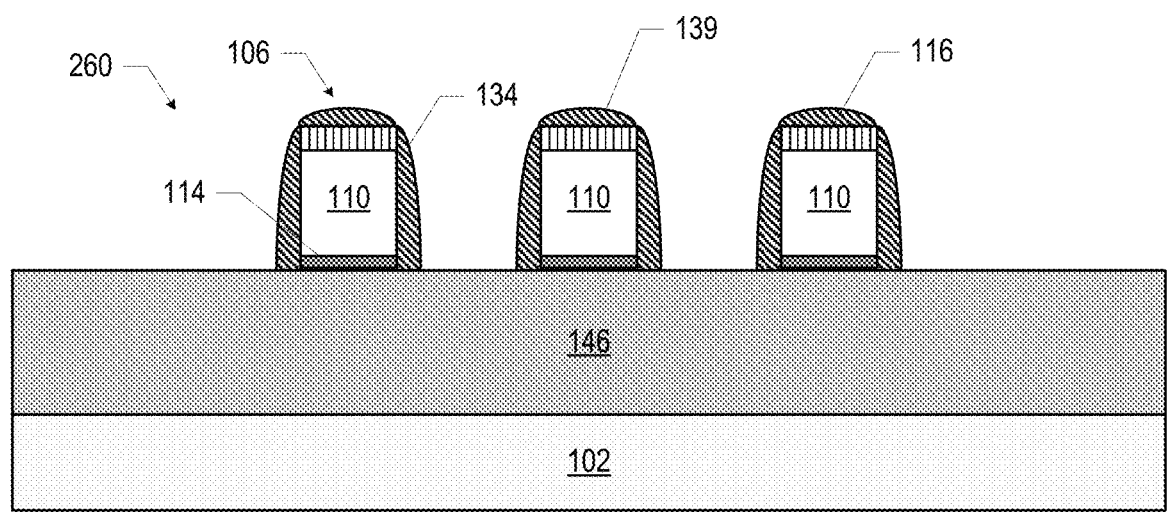

FIG. 57 is a cross-sectional view of an assembly 260 subsequent to providing spacers 134 on the sides of the gates 106 (e.g., on the sides of the hardmask 116, the gate metal 110, and the gate dielectric 114) and spacer material portions 139 above the gates 106 (e.g., on the hardmask 116) of the assembly 258 (FIG. 56). The provision of the spacer material portions 139/spacers 134 may take any of the forms discussed above with reference to FIG. 14-26 or 48, for example.

Figure 58:
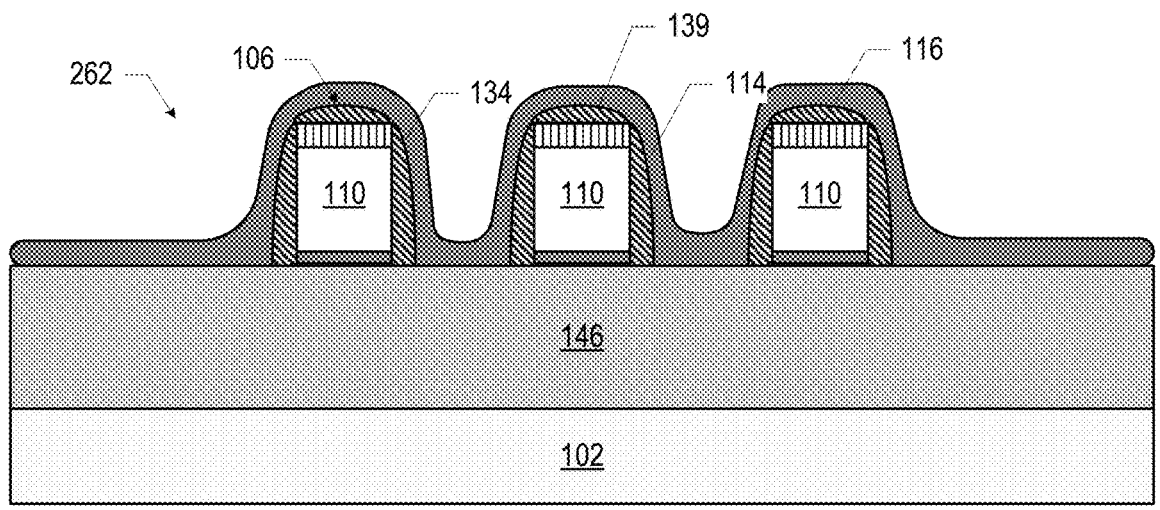

FIG. 58 is a cross-sectional view of an assembly 262 subsequent to providing a gate dielectric 114 in the trench 104 between the gates 106 of the assembly 260 (FIG. 57). In some embodiments, the gate dielectric 114 provided between the gates 106 of the assembly 260 may be formed by atomic layer deposition (ALD) and, as illustrated in FIG. 58, may cover the exposed quantum well stack 146 between the gates 106, and may extend onto the adjacent spacers 134.

Figure 59:
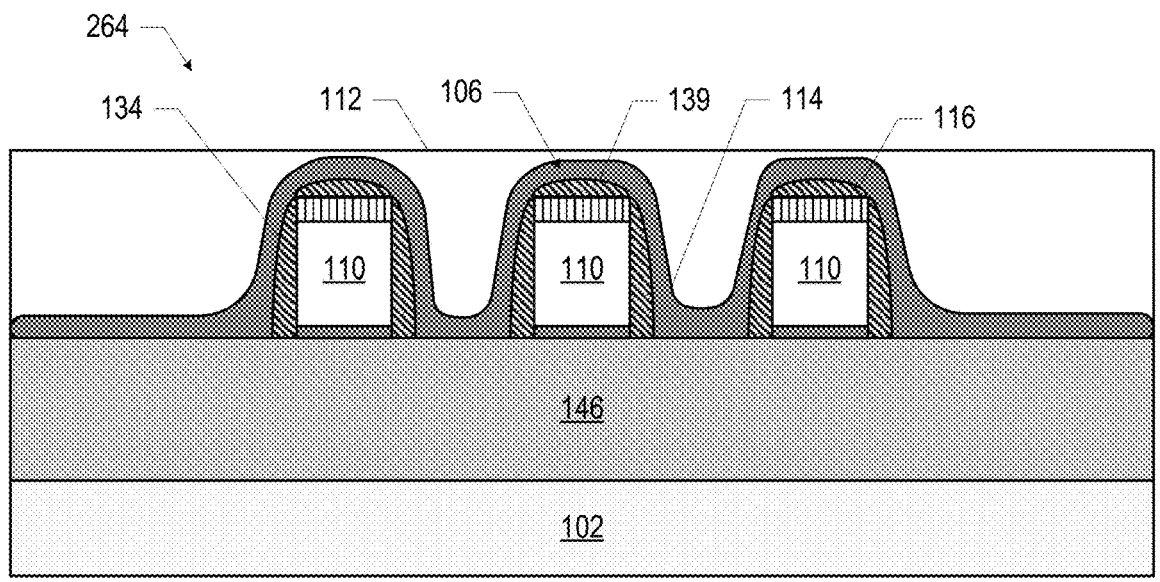

FIG. 59 is a cross-sectional view of an assembly 264 subsequent to providing the gate metal 112 on the assembly 262 (FIG. 58). The gate metal 112 may fill the areas in the trench 104 between adjacent ones of the gates 106, and may extend over the tops of the gates 106, as shown. The provision of the gate metal 112 may take any of the forms discussed above with reference to FIG. 27, for example. The assembly 264 may be further processed as discussed above with reference to FIGS. 28-44.

In some embodiments, techniques for depositing the gate dielectric 114 and the gate metal 112 for the gates 108 like those illustrated in FIGS. 58-59 may be used to form the gates 108 using alternative manufacturing steps to those illustrated in FIGS. 27-34. For example, the insulating material 130 may be deposited on the assembly 228 (FIG. 26), the insulating material 130 may be "opened" to expose the areas in which the gates 108 are to be disposed, a layer of gate dielectric 114 and gate metal 112 may be deposited on this structure to fill the openings (e.g., as discussed with reference to FIGS. 58-59), the resulting structure may be polished back to remove the excess gate dielectric 114 and gate metal 112 (e.g., as discussed above with reference to FIG. 28), the insulating material 130 at the sides of the outermost gates 106 may be opened to expose the quantum well stack 147, the exposed quantum well stack 147 may be doped and provided with an interface material 141 (e.g., as discussed above with reference to FIGS. 32-34), and the openings may be filled back in with insulating material 130 to form an assembly like the assembly 246 of FIGS. 35 and 36. Further processing may be performed as described herein.

In some embodiments, the trenches 104 may not be formed by removing portions of the insulating material 128 to expose underlying components, but instead may be formed by an additive technique. FIGS. 60-65 illustrate various alternative stages in the manufacture of a quantum dot device 100 that may be used to form an insulating material 128 having trenches 104, in accordance with various embodiments. In particular, the operations discussed below with reference to FIGS. 60-65 may take the place of the operations discussed above with reference to FIGS. 8 and 9.

Figure 60:
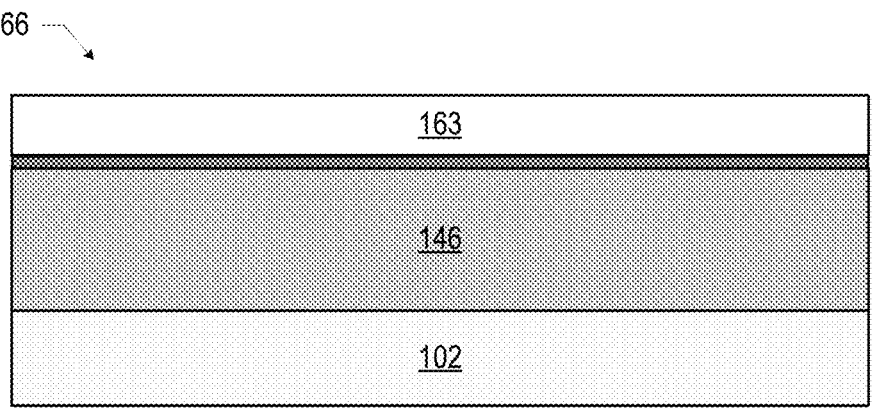
FIGS. 60-65 illustrate various alternative stages in the manufacture of a quantum dot device, in accordance with various embodiments.

FIG. 60 is a cross-sectional view of an assembly 266 subsequent to depositing a dummy material 163 on the gate dielectric 114 of the assembly 204 (FIG. 7). The dummy material 163 may include any suitable material, such as polysilicon, silicon nitride (or other nitrides), or an appropriate oxide, and may be deposited using any suitable technique. In some embodiments, the dummy material 163 may include a top hardmask. The thickness of the dummy material 163 may be selected to be equal to the desired thickness of the insulating material 128 (e.g., equal to the depth 164 of the trenches 104 illustrated in FIG. 1).

Figure 61:
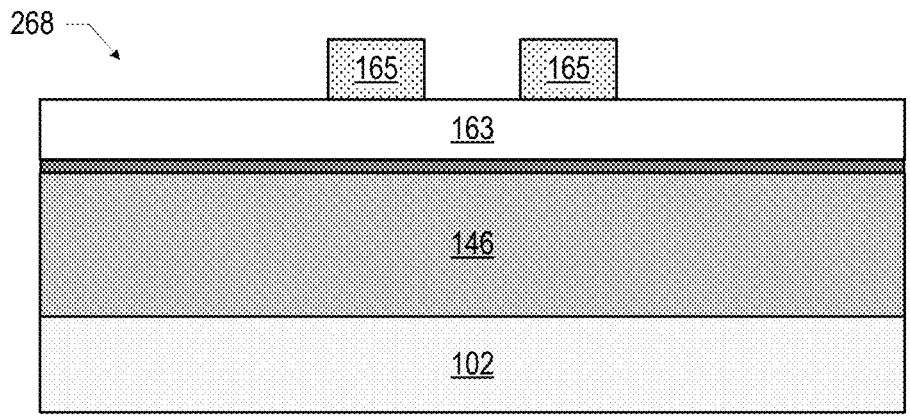

FIG. 61 is a cross-sectional view of an assembly 268 subsequent to forming a patterned mask material 165 on the dummy material 163 of the assembly 266 (FIG. 60). In some embodiments, the patterned mask material 165 may be a lithographically patterned photoresist. The pattern of the patterned mask material 165 may correspond to the desired locations of the trenches 104, as discussed below.

Figure 62:
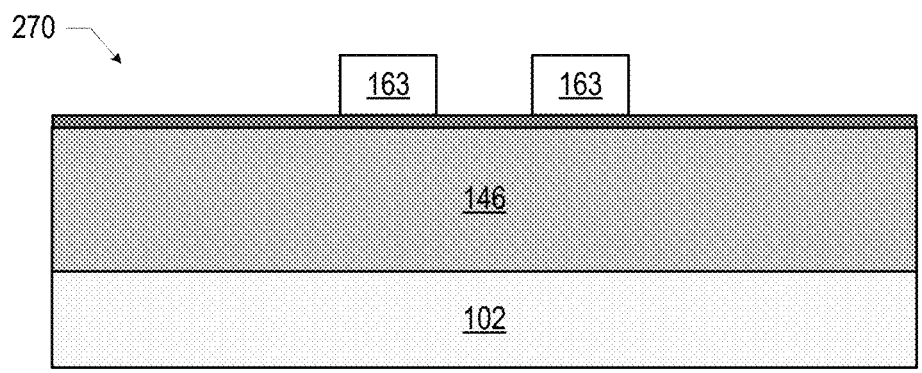

FIG. 62 is a cross-sectional view of an assembly 270 subsequent to patterning the dummy material 163 in accordance with the patterned mask material 165 of the assembly 268 (FIG. 61) and removing the patterned mask material 165. The patterning of the dummy material 163 may use any suitable etch technique, and the remaining dummy material 163 may provide the "negative" of the trenches 104, as discussed below.

Figure 63:
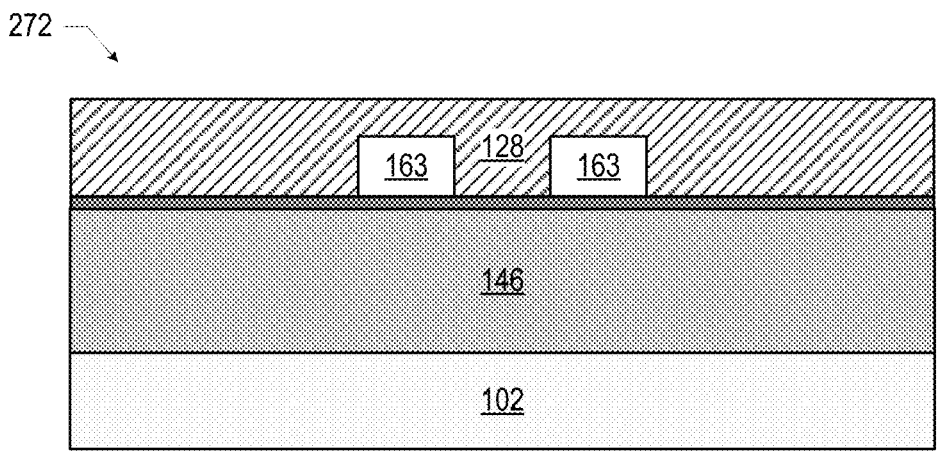

FIG. 63 is a cross-sectional view of an assembly 272 subsequent to providing the insulating material 128 on the assembly 270 (FIG. 62). The insulating material 128 may be provided using any suitable technique (e.g., any suitable deposition technique) and may cover the dummy material 163.

Figure 64:
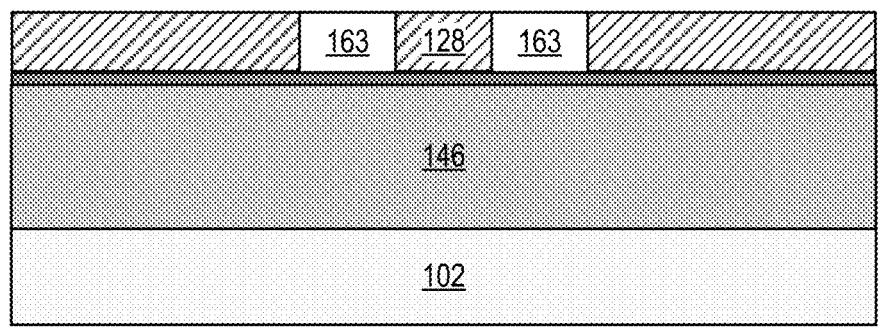

FIG. 64 is a cross-sectional view of an assembly 274 subsequent to polishing back the insulating material 128 of the assembly 272 (FIG. 63) to expose the dummy material 163. The insulating material 128 may be polished using a CMP technique, for example.

Figure 65:
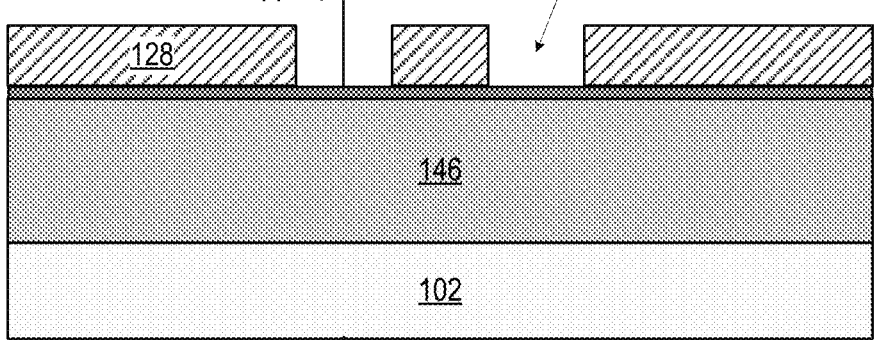

FIG. 65 is a cross-sectional view of an assembly 276 subsequent to removing the dummy material 163 from the assembly 274 (FIG. 64), leaving trenches 104 in the insulating material 128. The assembly 276 may have substantially the same structure as the assembly 208 of FIG. 9, and may be further processed as discussed above with reference to FIGS. 10-44, for example.

Figure 66:
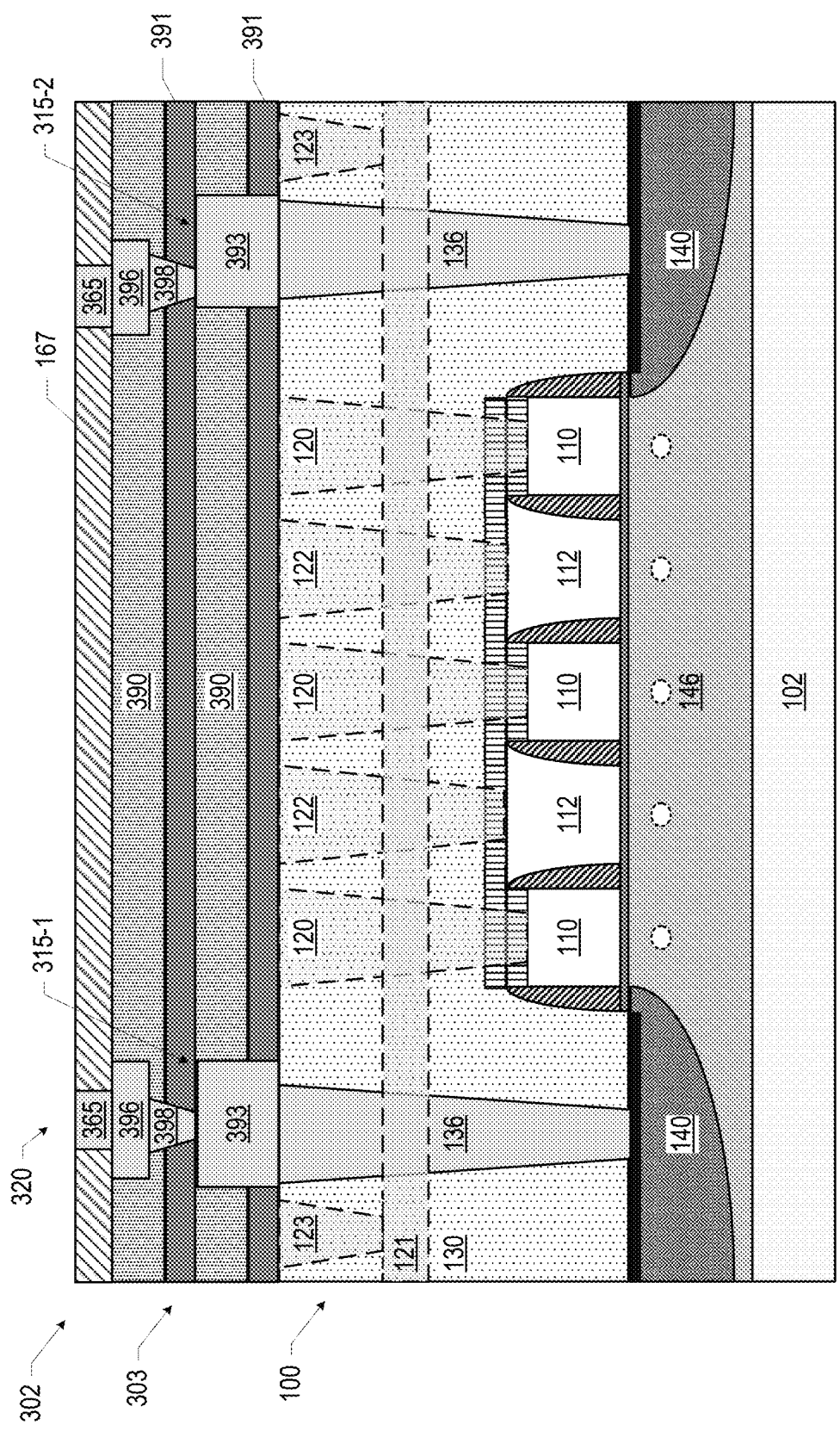
FIG. 66 is a cross-sectional view of a quantum dot device with multiple interconnect layers, in accordance with various embodiments.
Figure 67:
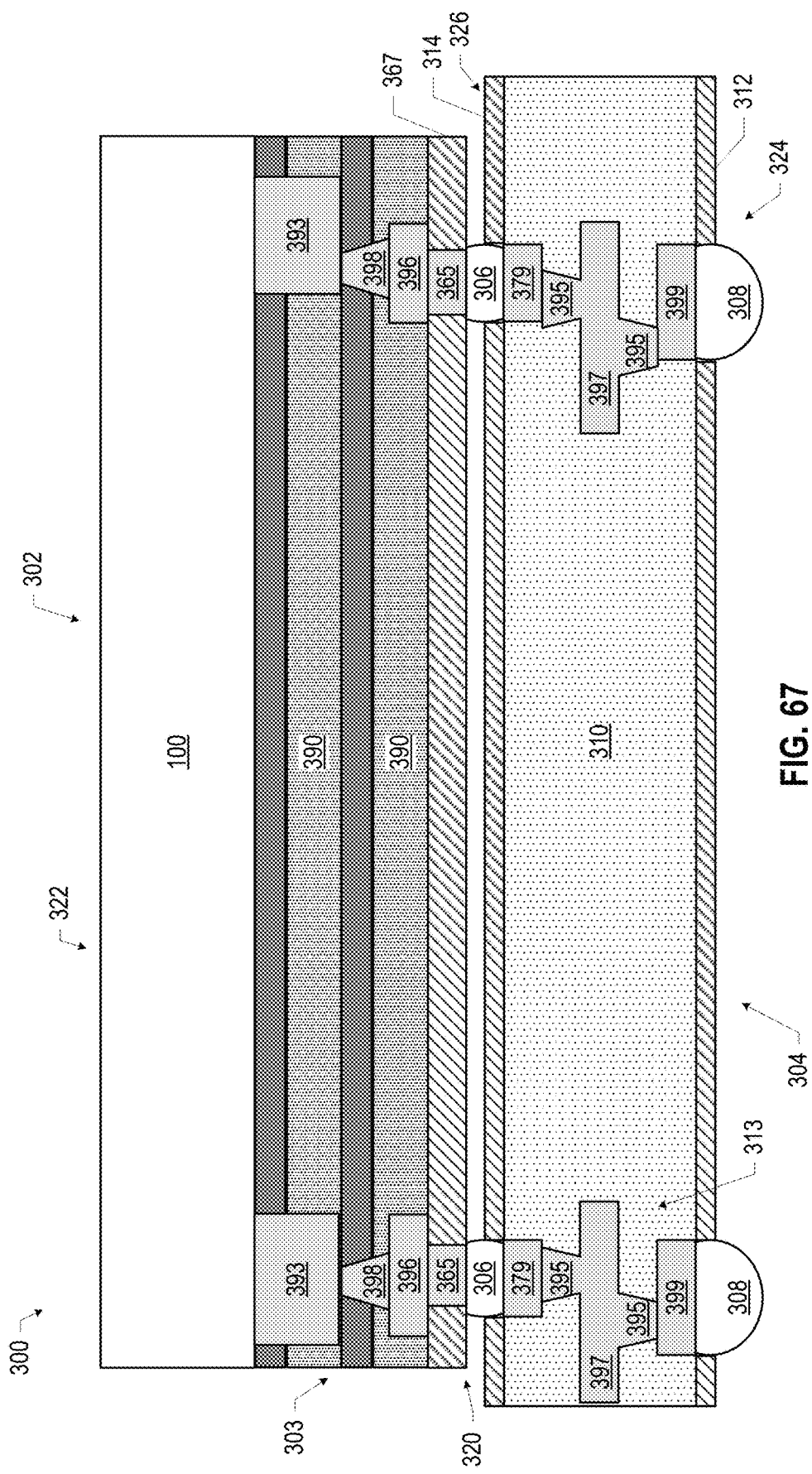
FIG. 67 is a cross-sectional view of a quantum dot device package, in accordance with various embodiments.

In some embodiments, the quantum dot device 100 may be included in a die and coupled to a package substrate to form a quantum dot device package. For example, FIG. 66 is a side cross-sectional view of a die 302 including the quantum dot device 100 of FIG. 2 and conductive pathway layers 303 disposed thereon, while FIG. 67 is a side cross-sectional view of a quantum dot device package 300 in which the die 302 is coupled to a package substrate 304. Details of the quantum dot device 100 are omitted from FIG. 67 for economy of illustration. As noted above, the particular quantum dot device 100 illustrated in FIG. 67 may take the form of the quantum dot device 100 illustrated in FIG. 2, but any of the quantum dot devices 100 disclosed herein may be included in a die (e.g., the die 302) and coupled to a package substrate (e.g., the package substrate 304). In particular, any number of trenches 104, gates 106/108, doped regions 140, magnet lines 121, and other components discussed herein with reference to various embodiments of the quantum dot device 100 may be included in the die 302.

The die 302 may include a first face 320 and an opposing second face 322. The base 102 may be proximate to the second face 322, and conductive pathways 315 from various components of the quantum dot device 100 may extend to conductive contacts 365 disposed at the first face 320. The conductive pathways 315 may include conductive vias, conductive lines, and/or any combination of conductive vias and lines. For example, FIG. 66 illustrates an embodiment in which a conductive pathway 315-1 (extending between a doped region 140 and associated conductive contact 365) includes a conductive via 136, a conductive line 393, a conductive via 398, and a conductive line 396. In the embodiment of FIG. 66, another conductive pathway 315-2 (extending between another doped region 140 and associated conductive contact 365) include a conductive via 136, a conductive line 393, a conductive via 398, and a conductive line 396. More or fewer structures may be included in the conductive pathways 315, and analogous conductive pathways 315 may be provided between ones of the conductive contacts 365 and the gates 106/108, magnet lines 121, or other components of the quantum dot device 100. In some embodiments, conductive lines of the die 302 (and the package substrate 304, discussed below) may extend into and out of the plane of the drawing, providing conductive pathways to route electrical signals to and/or from various elements in the die 302.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material.

The gates 106/108, the doped regions 140, and the quantum well stack 146 (as well as the proximate conductive vias/lines) may be referred to as part of the "device layer" of the quantum dot device 100. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer.

A solder resist material 367 may be disposed around the conductive contacts 365, and in some embodiments may extend onto the conductive contacts 365. The solder resist material 367 may be a polyimide or similar material, or may be any appropriate type of packaging solder resist material. In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the quantum dot device 100, and may be formed of any suitable conductive material (e.g., a superconducting material). For example, solder bonds may be formed on the one or more conductive contacts 365 to mechanically and/or electrically couple the die 302 with another component (e.g., a circuit board), as discussed below. The conductive contacts 365 illustrated in FIG. 66 take the form of bond pads, but other first level interconnect structures may be used (e.g., posts) to route electrical signals to/from the die 302, as discussed below.

The combination of the conductive pathways and the proximate insulating material (e.g., the insulating material 130, the oxide material 390, and the nitride material 391) in the die 302 may provide an interlayer dielectric (ILD) stack of the die 302. As noted above, interconnect structures may be arranged within the quantum dot device 100 to route electrical signals according to a wide variety of designs (in particular, the arrangement is not limited to the particular configuration of interconnect structures depicted in FIG. 66 or any of the other accompanying figures, and may include more or fewer interconnect structures). During operation of the quantum dot device 100, electrical signals (such as power and/or input/output (I/O) signals) may be routed to and/or from the gates 106/108 and/or the doped regions 140 (and/or other components) of the quantum dot device 100 through the interconnects provided by conductive vias and/or lines, and through the conductive pathways of the package substrate 304 (discussed below).

Example superconducting materials that may be used for the structures in the conductive pathways 313 (discussed below) and 315, and/or conductive contacts of the die 302 and/or the package substrate 304, may include aluminum, niobium, tin, titanium, osmium, zinc, molybdenum, tantalum, vanadium, or composites of such materials (e.g., niobium-titanium, niobium-aluminum, or niobium-tin). In some embodiments, the conductive contacts 365, 379, and/or 399 may include aluminum, and the first level interconnects 306 and/or the second level interconnects 308 may include an indium-based solder.

In the quantum dot device package 300 (FIG. 67), first level interconnects 306 may be disposed between the first face 320 of the die 302 and the second face 326 of a package substrate 304. Having first level interconnects 306 disposed between the first face 320 of the die 302 and the second face 326 of the package substrate 304 (e.g., using solder bumps as part of flip chip packaging techniques) may enable the quantum dot device package 300 to achieve a smaller footprint and higher die-to-package-substrate connection density than could be achieved using conventional wirebond techniques (in which conductive contacts between the die 302 and the package substrate 304 are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" surface area of the first face 320). Additionally, in some applications, wirebond interconnects may generate unacceptable amounts of heat that may damage or otherwise interfere with the performance of the quantum dot device 100. Using solder bumps as the first level interconnects 306 may enable the quantum dot device package 300 to have much lower parasitic inductance relative to using wirebonds to couple the die 302 and the package substrate 304, which may result in an improvement in signal integrity for high-speed signals communicated between the die 302 and the package substrate 304.

The package substrate 304 may include a first face 324 and an opposing second face 326. Conductive contacts 399 may be disposed at the first face 324, and conductive contacts 379 may be disposed at the second face 326. Solder resist material 314 may be disposed around the conductive contacts 379, and solder resist material 312 may be disposed around the conductive contacts 399; the solder resist materials 314 and 312 may take any of the forms discussed above with reference to the solder resist material 367. In some embodiments, the solder resist material 312 and/or the solder resist material 314 may be omitted. Conductive pathways 313 may extend through insulating material 310 between the first face 324 and the second face 326 of the package substrate 304, electrically coupling various ones of the conductive contacts 399 to various ones of the conductive contacts 379, in any desired manner. The insulating material 310 may be a dielectric material (e.g., an ILD), and may take the form of any of the embodiments of the insulating material 130 disclosed herein, for example. The conductive pathways 313 may include one or more conductive vias 395 and/or one or more conductive lines 397, for example.

In some embodiments, the quantum dot device package 300 may be a cored package, one in which the package substrate 304 is built on a carrier material (not shown) that remains in the package substrate 304. In such embodiments, the carrier material may be a dielectric material that is part of the insulating material 310; laser vias or other through-holes may be made through the carrier material to allow conductive pathways 313 to extend between the first face 324 and the second face 326.

In some embodiments, the package substrate 304 may be or may otherwise include a silicon interposer, and the conductive pathways 313 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302.

Limiting differential expansion and contraction may help preserve the mechanical and electrical integrity of the quantum dot device package 300 as the quantum dot device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers).

The conductive contacts 365 of the die 302 may be electrically coupled to the conductive contacts 379 of the package substrate 304 via the first level interconnects 306. In some embodiments, the first level interconnects 306 may include solder bumps or balls (as illustrated in FIG. 67); for example, the first level interconnects 306 may be flip chip (or controlled collapse chip connection, "C4") bumps disposed initially on the die 302 or on the package substrate 304. Second level interconnects 308 (e.g., solder balls or other types of interconnects) may couple the conductive contacts 399 on the first face 324 of the package substrate 304 to another component, such as a circuit board (not shown). Examples of arrangements of electronics packages that may include an embodiment of the quantum dot device package 300 are discussed below with reference to FIG. 69. The die 302 may be brought in contact with the package substrate 304 using a pick-and-place apparatus, for example, and a reflow or thermal compression bonding operation may be used to couple the die 302 to the package substrate 304 via the first level interconnects 306.

The conductive contacts 365, 379, and/or 399 may include multiple layers of material that may be selected to serve different purposes. In some embodiments, the conductive contacts 365, 379, and/or 399 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 365, 379, and/or 399 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum.

In some embodiments, the structures and materials in the quantum dot device 100 may be damaged if the quantum dot device 100 is exposed to the high temperatures that are common in conventional integrated circuit processing (e.g., greater than 100 degrees Celsius, or greater than 200 degrees Celsius). In particular, in embodiments in which the first level interconnects 306 include solder, the solder may be a low-temperature solder (e.g., a solder having a melting point below 100 degrees Celsius) so that it can be melted to couple the conductive contacts 365 and the conductive contacts 379 without having to expose the die 302 to higher temperatures and risk damaging the quantum dot device 100. Examples of solders that may be suitable include indium-based solders (e.g., solders including indium alloys). When low-temperature solders are used, however, these solders may not be fully solid during handling of the quantum dot device package 300 (e.g., at room temperature or temperatures between room temperature and 100 degrees Celsius), and thus the solder of the first level interconnects 306 alone may not reliably mechanically couple the die 302 and the package substrate 304 (and thus may not reliably electrically couple the die 302 and the package substrate 304). In some such embodiments, the quantum dot device package 300 may further include a mechanical stabilizer to maintain mechanical coupling between the die 302 and the package substrate 304, even when solder of the first level interconnects 306 is not solid. Examples of mechanical stabilizers may include an underfill material disposed between the die 302 and the package substrate 304, a corner glue disposed between the die 302 and the package substrate 304, an overmold material disposed around the die 302 on the package substrate 304, and/or a mechanical frame to secure the die 302 and the package substrate 304.

FIGS. 68A-B are top views of a wafer 450 and dies 452 that may be formed from the wafer 450; the dies 452 may be included in any of the quantum dot device packages (e.g., the quantum dot device package 300) disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more quantum dot devices 100 and/or supporting circuitry to route electrical signals to the quantum dot devices 100 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 74) or other logic that is configured to store information in the memory devices or execute instructions stored in the memory array.

FIG. 69 is a cross-sectional side view of a device assembly 400 that may include any of the embodiments of the quantum dot device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 69 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 67), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second level interconnects 308. Although a single package 420 is shown in FIG. 69, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package 300 or may be a conventional IC package, for example. In some embodiments, the package 420 may take the form of any of the embodiments of the quantum dot device package 300 disclosed herein, and may include a quantum dot device die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 69, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package 300 or may be a conventional IC package, for example. In some embodiments, the package 424 may take the form of any of the embodiments of the quantum dot device package 300 disclosed herein, and may include a quantum dot device die 302 coupled to a package substrate 304 (e.g., by flip chip connections).

The device assembly 400 illustrated in FIG. 69 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package 300 or may be a conventional IC package, for example. In some embodiments, one or both of the packages 426 and 432 may take the form of any of the embodiments of the quantum dot device package 300 disclosed herein, and may include a die 302 coupled to a package substrate 304 (e.g., by flip chip connections).

As noted above, any suitable techniques may be used to manufacture the quantum dot devices 100 disclosed herein. FIG. 70 is a flow diagram of an illustrative method 1000 of manufacturing a quantum dot device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum dot device (including any suitable ones of the embodiments disclosed herein).

At 1002, a quantum well stack may be provided on a substrate. For example, a quantum well stack 146 may be provided on a base 102 (e.g., as discussed above with reference to FIGS. 5-6 and 50-52).

At 1004, an insulating material may be provided above the quantum well stack. The insulating material may include a trench. For example, the insulating material 128, including at least one trench 104, may be provided (e.g. as discussed above with reference to FIGS. 8-10 and 60-65).

At 1006, gates may be formed. The gates may be at least partially disposed in the trench. For example, multiple gates 106/108 may be formed at least partially in a trench 104 (e.g., as discussed above with reference to FIGS. 11-31, 48-49, and 56-59).

A number of techniques are disclosed herein for operating a quantum dot device 100. FIGS. 71-72 are flow diagrams of particular illustrative methods 1020 and 1040, respectively, of operating a quantum dot device, in accordance with various embodiments. Although the operations discussed below with reference to the methods 1020 and 1040 are illustrated in a particular order and depicted once each, these operations may be repeated or performed in a different order (e.g., in parallel), as suitable. Additionally, various operations may be omitted, as suitable. Various operations of the methods 1020 and 1040 may be illustrated with reference to one or more of the embodiments discussed above, but the methods 1020 and 1040 may be used to operate any suitable quantum dot device (including any suitable ones of the embodiments disclosed herein).

Turning to the method 1020 of FIG. 71, at 1022, electrical signals may be provided to one or more gates at least partially disposed in a first trench in an insulating material as part of causing a first quantum dot to form in a quantum well stack disposed below the first trench. For example, one or more voltages may be applied to the gates 106/108 associated with a trench 104-1 to cause at least one quantum dot 142 to form in the quantum well stack 146 under the trench 104-1.

At 1024, electrical signals may be provided to one or more gates at least partially disposed in a second trench in the insulating material as part of causing a second quantum dot to form in the quantum well stack. For example, one or more voltages may be applied to the gates 106/108 associated with a trench 104-2 to cause at least one quantum dot 142 to form in the quantum well stack 146 under the trench 104-2.

At 1026, a quantum state of the first quantum dot may be sensed by the second quantum dot. For example, a spin state of a quantum dot 142 in the quantum well stack 146 under the trench 104-1 may be sensed by a quantum dot in the quantum well stack 146 under the trench 104-2.

Turning to the method 1040 of FIG. 72, at 1042, an electrical signal may be provided to a first gate disposed at least partially in a trench in an insulating material as part of causing a first quantum dot to form in a quantum well stack under the trench. For example, a voltage may be applied to the gate 108-1 disposed at least partially in a trench 104 as part of causing a first quantum dot 142 to form in the quantum well stack 146 below the trench 104.

At 1044, an electrical signal may be provided to a second gate disposed at least partially in the trench as part of causing a second quantum dot to form in the quantum well stack under the trench. For example, a voltage may be applied to the gate 108-2 disposed at least partially in the trench 104 as part of causing a second quantum dot 142 to form in the quantum well stack 146 below the trench 104.

At 1046, an electrical signal may be provided to a third gate disposed at least partially in the trench as part of (1) causing a third quantum dot to form in the quantum well stack under the trench or (2) providing a potential barrier between the first quantum dot and the second quantum dot. For example, a voltage may be applied to the gate 106-2 as part of (1) causing a third quantum dot 142 to form in the quantum well stack 146 below the trench 104 (e.g., when the gate 106-2 acts as a "plunger" gate) or (2) providing a potential barrier between the first quantum dot (under the gate 108-1) and the second quantum dot (under the gate 108-2) (e.g., when the gate 106-2 acts as a "barrier" gate).

Figure 73:
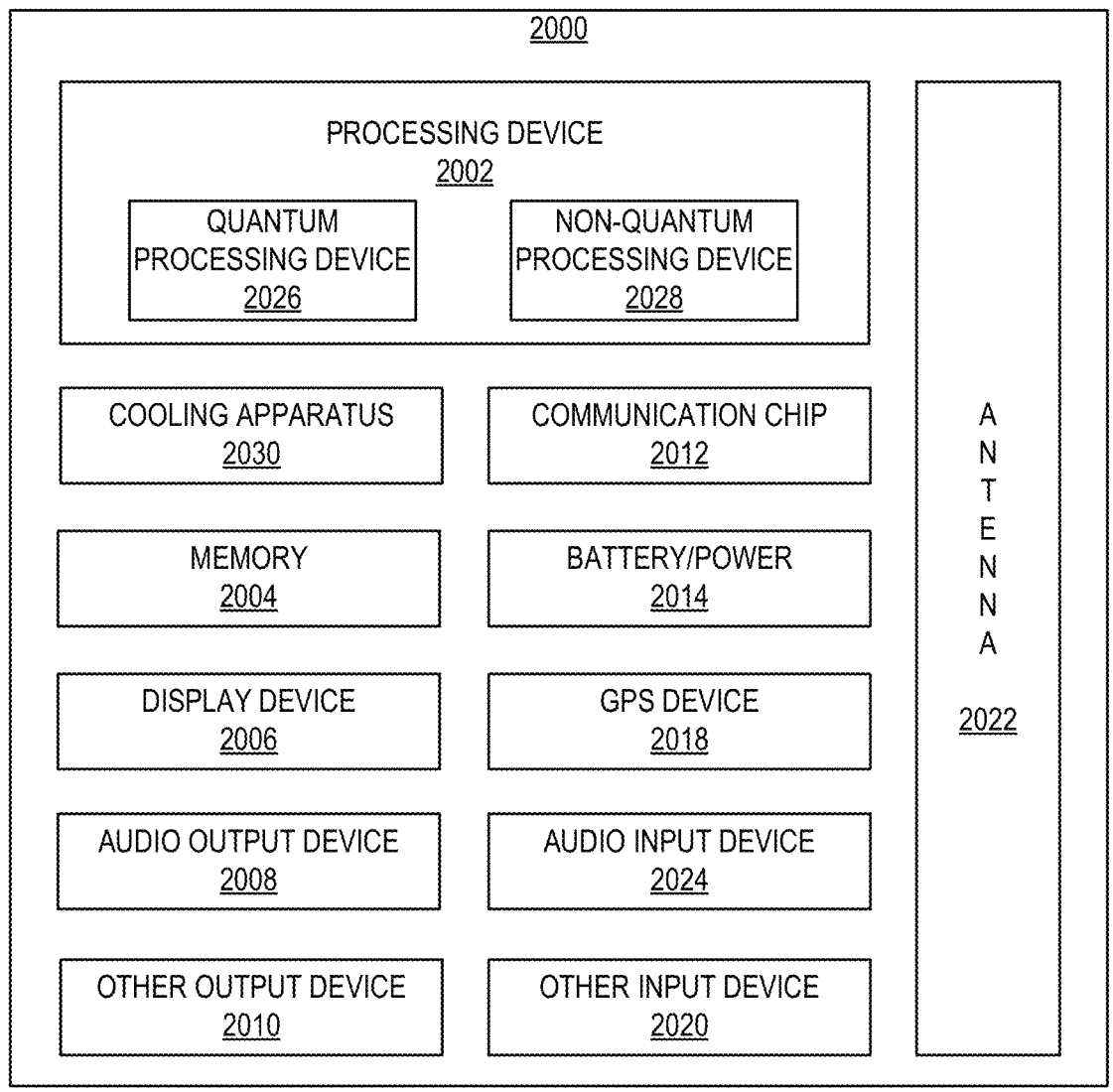
FIG. 73 is a block diagram of an example quantum computing device that may include any of the quantum dot devices disclosed herein, in accordance with various embodiments.

FIG. 73 is a block diagram of an example quantum computing device 2000 that may include any of the quantum dot devices disclosed herein. A number of components are illustrated in FIG. 73 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 73, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters. For example, the quantum processing device 2026 may include circuitry (e.g., a current source) to provide current pulses to one or more magnet lines 121 included in the quantum dot device 100.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include another input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a device, including: a quantum well stack of a quantum dot device; an insulating material disposed above the quantum well stack, wherein the insulating material includes a trench; and a gate metal disposed on the insulating material and extending into the trench.

Example 2 may include the subject matter of Example 1, and may further specify that the trench is a first trench, the gate metal is a first gate metal, the insulating material further includes a second trench, and the device further includes a second gate metal disposed on the insulating material and extending into the second trench.

Example 3 may include the subject matter of Example 2, and may further specify that the first and second trenches are parallel.

Example 4 may include the subject matter of any of Examples 2-3, and may further specify that the first and second trenches are spaced apart by a distance between 50 and 250 nanometers.

Example 5 may include the subject matter of any of Examples 1-4, and may further specify that the trench has a tapered profile that is narrowest proximate to the quantum well stack.

Example 6 may include the subject matter of any of Examples 1-5, and may further specify that the trench extends down to the quantum well stack.

Example 7 may include the subject matter of any of Examples 1-6, and may further specify that the trench has a width between 10 and 30 nanometers.

Example 8 may include the subject matter of any of Examples 1-7, and may further specify that the gate metal has a thickness above the insulating material between 25 and 75 nanometers.

Example 9 may include the subject matter of any of Examples 1-8, and may further include a semiconductor substrate, wherein the quantum well stack is disposed on the semiconductor substrate.

Example 10 may include the subject matter of Example 9, and may further specify that the quantum well stack includes a quantum well layer and a barrier layer, and the barrier layer is disposed between the semiconductor substrate and the quantum well layer.

Example 11 may include the subject matter of Example 10, and may further specify that the barrier layer includes silicon germanium.

Example 12 may include the subject matter of any of Examples 1-11, and may further specify that a gate dielectric is disposed at a bottom of the trench.

Example 13 may include the subject matter of any of Examples 1-12, and may further include a magnet line.

Example 14 may include the subject matter of Example 13, and may further specify that the magnet line includes a portion that is oriented parallel to a longitudinal axis of the trench.

Example 15 may include the subject matter of any of Examples 13-14, and may further specify that the magnet line includes a portion that is oriented perpendicular to a longitudinal axis of the trench.

Example 16 may include the subject matter of any of Examples 1-15, and may further specify that the quantum well stack includes a silicon/silicon germanium material stack.

Example 17 may include the subject matter of any of Examples 1-16, and may further specify that the quantum well stack includes a silicon/silicon oxide material stack.

Example 18 may include the subject matter of any of Examples 1-17, and may further specify that the gate metal has a length, along the trench, between 20 and 40 nanometers.

Example 19 may include the subject matter of any of Examples 1-18, and may further specify that the gate metal is a first gate metal, and the device further includes a second gate metal disposed on the insulating material and extending into the trench, wherein the second gate metal is electrically insulated from the first gate metal.

Example 20 may include the subject matter of Example 19, and may further include a spacer disposed between the first gate metal and the second gate metal.

Example 21 may include the subject matter of Example 20, and may further specify that the spacer has a thickness between 1 and 10 nanometers.

Example 22 may include the subject matter of Example 19, and may further include spacers disposed between the second gate metal in the trench and sidewalls of the trench.

Example 23 may include the subject matter of any of Examples 1-22, and may further specify that the trench has a depth between 200 and 300 nanometers.

Example 24 is a method of operating a quantum dot device, including: providing electrical signals to one or more gates at least partially disposed in a first trench in an insulating material to cause a first quantum dot to form in a quantum well stack disposed below the first trench; providing electrical signals to one or more gates at least partially disposed in a second trench in the insulating material to cause a second quantum dot to form in the quantum well stack; and sensing a quantum state of the first quantum dot with the second quantum dot.

Example 25 may include the subject matter of Example 24, and may further specify that the first and second trenches are spaced apart by a minimum distance between 50 and 250 nanometers.

Example 26 may include the subject matter of any of Examples 24-25, and may further specify that the one or more gates at least partially disposed in the first trench include three or more gates separated by spacer material in the first trench.

Example 27 may include the subject matter of any of Examples 24-26, and may further specify that sensing the quantum state of the first quantum dot with the second quantum dot comprises sensing a spin state of the first quantum dot with the second quantum dot.

Example 28 may include the subject matter of any of Examples 24-27, and may further include: providing electrical signals to the one or more gates at least partially disposed in the first trench to cause a third quantum dot to form in the quantum well stack; and prior to sensing the quantum state of the first quantum dot with the second quantum dot, allowing the first and third quantum dots to interact.

Example 29 may include the subject matter of Example 28, and may further specify that allowing the first and third quantum dots to interact comprises providing electrical signals to the one or more gates at least partially disposed in the first trench to control interaction between the first and third quantum dots.

Example 30 may include the subject matter of any of Examples 24-29, and may further specify that the first and second trenches are parallel.

Example 31 is a method of manufacturing a quantum dot device, including: providing a quantum well stack on a substrate; providing an insulating material above the quantum well stack, wherein the insulating material includes a trench; and forming gates on the insulating material, wherein the gates extend into the trench.

Example 32 may include the subject matter of Example 31, and may further specify that providing the insulating material on the quantum well stack includes: depositing the insulating material above the quantum well stack; and removing at least some of the insulating material to form the trench.

Example 33 may include the subject matter of any of Examples 31-32, and may further specify that providing the insulating material on the quantum well stack includes: forming a dummy structure above the quantum well stack; depositing the insulating material over the dummy structure; polishing the insulating material to expose the dummy structure; and removing the dummy structure to form the trench.

Example 34 may include the subject matter of any of Examples 31-33, and may further specify that providing the quantum well stack on the substrate includes growing material of the quantum well stack by epitaxy.

Example 35 may include the subject matter of any of Examples 31-34, and may further specify that the trench has a width between 20 and 40 nanometers.

Example 36 may include the subject matter of any of Examples 31-35, and may further include: providing an interlayer dielectric on the gates; and forming conductive vias through the interlayer dielectric to make conductive contact with the gates.

Example 37 is a quantum computing device, including: a quantum processing device, wherein the quantum processing device includes an insulating material having first and second trenches that extend toward a quantum well stack, an active quantum dot formation gates at least partially disposed in the first trench, and read quantum dot formation gates at least partially disposed in the second trench; a non-quantum processing device, coupled to the quantum processing device, to control voltages applied to the active quantum dot formation gates and the read quantum dot formation gates; and a memory device to store data generated by quantum dots read by the read quantum dot formation gates during operation of the quantum processing device.

Example 38 may include the subject matter of Example 37, and may further include a cooling apparatus to maintain a temperature of the quantum processing device below 5 degrees Kelvin.

Example 39 may include the subject matter of Example 38, and may further specify that the cooling apparatus includes a dilution refrigerator.

Example 40 may include the subject matter of Example 38, and may further specify that the cooling apparatus includes a liquid helium refrigerator.

Example 41 may include the subject matter of any of Examples 37-40, and may further specify that the memory device is to store instructions for a quantum computing algorithm to be executed by the quantum processing device.

Example 42 may include the subject matter of any of Examples 37-41, and may further specify that the quantum dots read by the read quantum dot formation gates are formed in a same quantum well layer in the quantum well stack as active quantum dots induced by the active quantum dot formation gates.

The invention claimed is:

1. A device, comprising:
   an insulating material including a first trench and a second trench;
   a first quantum well stack region under the first trench;
   a second quantum well stack region under the second trench;
   a first gate metal extending into the first trench above the first quantum well stack region; and
   a second gate metal extending into the second trench above the second quantum well stack region.

2. The device of claim 1, wherein the first trench has a tapered profile that is narrowest proximate to the first quantum well stack region.

3. The device of claim 1, wherein the first trench extends down to the first quantum well stack region.

4. The device of claim 1, wherein the first trench has a width between 10 nanometers and 30 nanometers.

5. The device of claim 1, further comprising:
   a first gate dielectric between the first gate metal and the first quantum well stack region; and
   a second gate dielectric between the second gate metal and the second quantum well stack region.

6. The device of claim 5, wherein the first gate dielectric has a U-shaped cross-section in a direction along the first trench.

7. The device of claim 1, further comprising:
   a magnet line.

8. The device of claim 7, wherein the magnet line includes a portion that is oriented parallel to a longitudinal axis of the first trench.

9. The device of claim 7, wherein the magnet line includes a portion that is oriented perpendicular to a longitudinal axis of the first trench.

10. The device of claim 1, wherein the first quantum well stack region and the second quantum well stack region include a silicon/silicon oxide material stack.

11. The device of claim 1, wherein the first quantum well stack region and the second quantum well stack region include a silicon/silicon germanium material stack.

12. The device of claim 1, wherein the first gate metal has a length, along the first trench, between 20 and 40 nanometers.

13. The device of claim 1, wherein the first trench has a depth between 200 nanometers and 300 nanometers.

14. The device of claim 1, further comprising:
   a third gate metal above the insulating material and extending into the first trench above the first quantum well stack region, wherein the third gate metal is spaced apart from the first gate metal.

15. The device of claim 14, further comprising:
spacer material between the first gate metal and the third gate metal.

16. The device of claim 15, further comprising:
spacer material between the third gate metal in the first trench and sidewalls of the first trench.

17. A method of manufacturing a quantum dot device, comprising:
providing a first quantum well stack region and a second quantum well stack region;
providing an insulating material, wherein the insulating material includes a first trench and a second trench, and wherein the first quantum well stack region is under the first trench and the second quantum well stack region is under the second trench; and
forming a first gate and a second gate, wherein the first gate includes a first gate metal extending into the first trench above the first quantum well stack region, and the second gate includes a second gate metal extending into the second trench above the second quantum well stack region.

18. The method of claim 17, further comprising:
providing an interlayer dielectric above the first gate and the second gate; and
forming conductive vias through the interlayer dielectric to make conductive contact with the first gate and the second gates.

19. A quantum computing device, comprising:
a quantum processing device, wherein the quantum processing device includes an insulating material having first and second trenches that extend toward quantum well stack regions, first gates extending into the first trench, and second gates extending into the second trench;
a non-quantum processing device, coupled to the quantum processing device, to control voltages applied to the first gates and the second gates; and
a memory device to store data generated by quantum dots in one or more of the quantum well stack regions during operation of the quantum processing device.

20. The quantum computing device of claim 19, further comprising:
a cooling apparatus to maintain a temperature of the quantum processing device below 5 degrees Kelvin.

21. A quantum dot device, comprising:
quantum well stack regions;
an insulating material having first and second trenches that extend toward the quantum well stack regions;
first gates extending into the first trench; and
second gates extending into the second trench.

22. The quantum dot device of claim 21, wherein the quantum well stack regions include a first quantum well stack region and a second quantum well stack region, and wherein the quantum dot device further includes:
a first gate dielectric between one of the first gates and the first quantum well stack region; and
a second gate dielectric between one of the second gates and the second quantum well stack region.

23. The quantum dot device of claim 22, wherein the first gate dielectric has a U-shaped cross-section in a direction along the first trench.

* * * * *